United States Patent
Evans et al.

(10) Patent No.: US 12,199,405 B2
(45) Date of Patent: Jan. 14, 2025

(54) PHOTONIC INTEGRATED CIRCUIT INCLUDING COMPACT LASERS WITH EXTENDED TUNABILITY

(71) Applicant: Infinera Corporation, Sunnyvale, CA (US)

(72) Inventors: Peter W. Evans, Mountain House, CA (US); Fred A. Kish, Jr., Palo Alto, CA (US); Vikrant Lal, Sunnyvale, CA (US); Scott Corzine, Sunnyvale, CA (US); Mingzhi Lu, Fremont, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 15/237,635

(22) Filed: Aug. 16, 2016

(65) Prior Publication Data

US 2017/0163000 A1    Jun. 8, 2017

Related U.S. Application Data

(63) Continuation-in-part of application No. 15/141,668, filed on Apr. 28, 2016.
(Continued)

(51) Int. Cl.
*H01S 5/00* (2006.01)
*H01S 5/026* (2006.01)
(Continued)

(52) U.S. Cl.
CPC ............ *H01S 5/0268* (2013.01); *H01S 5/026* (2013.01); *H01S 5/0265* (2013.01);
(Continued)

(58) Field of Classification Search
CPC ...... H01S 5/0268; H01S 5/026; H01S 5/0265; H01S 5/06246; H01S 5/0681;
(Continued)

(56) References Cited

U.S. PATENT DOCUMENTS

| 2002/0048289 A1* | 4/2002 | Atanackovic | H01L 33/34 372/20 |
| 2005/0013330 A1* | 1/2005 | Kish | H01S 5/0265 372/26 |

(Continued)

*Primary Examiner* — Kinam Park
(74) *Attorney, Agent, or Firm* — Ken Rudofski

(57) ABSTRACT

Consistent with the present disclosure, a compact laser with extended tunability (CLET) is provided that includes multiple segments or sections, at least one of which is curved, bent or non-collinear with other segments, so that the CLET has a compact form factor either as a singular laser or when integrated with other devices. The term CLET, as used herein, refers to any of the laser configurations disclosed herein having mirrors and a bent, angled or curved part, portion or section between such mirrors. If bent, the bent portion is preferably oriented at an angle of at least 30 degrees relative to other portions of the CLET. Alternatively, the curve or bend portion may be distributed over different sections of the CLET over a series of arcs, for example. The waveguide extending between the mirrors is continuous, such that light propagating along the waveguide is not divided or split. The waveguide also constitutes a continuous waveguide path.

26 Claims, 59 Drawing Sheets

Related U.S. Application Data

(60) Provisional application No. 62/154,152, filed on Apr. 29, 2015.

(51) Int. Cl.
| | |
|---|---|
| *H01S 5/062* | (2006.01) |
| *H01S 5/0625* | (2006.01) |
| *H01S 5/068* | (2006.01) |
| *H01S 5/10* | (2021.01) |
| *H01S 5/14* | (2006.01) |
| *H01S 5/20* | (2006.01) |
| *G02B 6/12* | (2006.01) |
| *G02F 1/21* | (2006.01) |
| *G02F 1/225* | (2006.01) |
| *H01S 3/107* | (2006.01) |
| *H01S 5/22* | (2006.01) |
| *H01S 5/30* | (2006.01) |
| *H01S 5/40* | (2006.01) |
| *H04B 10/572* | (2013.01) |

(52) U.S. Cl.
CPC ...... *H01S 5/06246* (2013.01); *H01S 5/06256* (2013.01); *H01S 5/068* (2013.01); *H01S 5/06821* (2013.01); *H01S 5/1028* (2013.01); *H01S 5/142* (2013.01); *H01S 5/2018* (2013.01); *G02B 6/12004* (2013.01); *G02F 1/212* (2021.01); *G02F 1/2257* (2013.01); *H01S 3/107* (2013.01); *H01S 5/101* (2013.01); *H01S 5/22* (2013.01); *H01S 5/3013* (2013.01); *H01S 5/4012* (2013.01); *H04B 10/572* (2013.01)

(58) Field of Classification Search
CPC ...... H01S 5/1008; H01S 5/101; H01S 5/1028; H01S 5/2018; H01S 5/22; H01S 5/068; H01S 5/3013
See application file for complete search history.

(56) References Cited

U.S. PATENT DOCUMENTS

| | | | | |
|---|---|---|---|---|
| 2005/0063636 | A1* | 3/2005 | Joyner | G02B 6/131 |
| | | | | 385/14 |
| 2011/0217040 | A1* | 9/2011 | Mori | H04J 14/06 |
| | | | | 398/53 |
| 2013/0016744 | A1* | 1/2013 | Li | B82Y 20/00 |
| | | | | 372/20 |
| 2013/0272646 | A1* | 10/2013 | Fish | G02B 6/1228 |
| | | | | 385/14 |

* cited by examiner

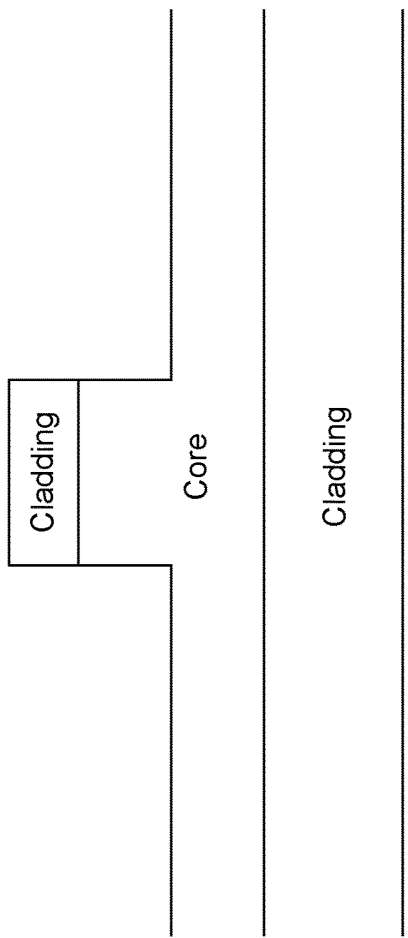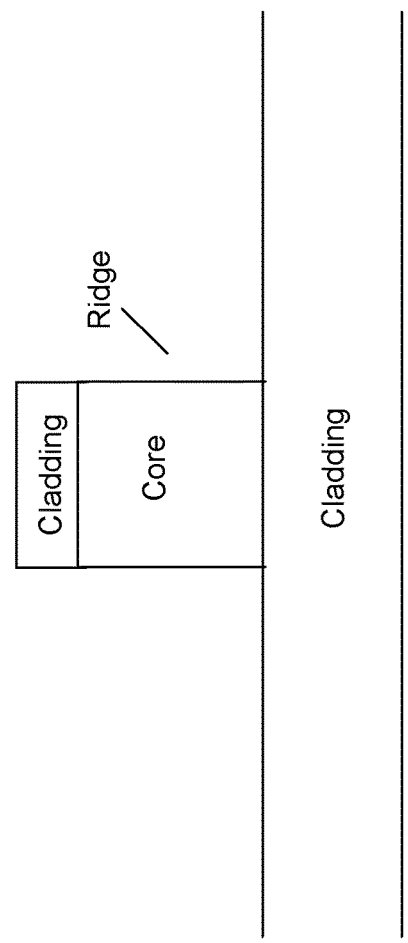

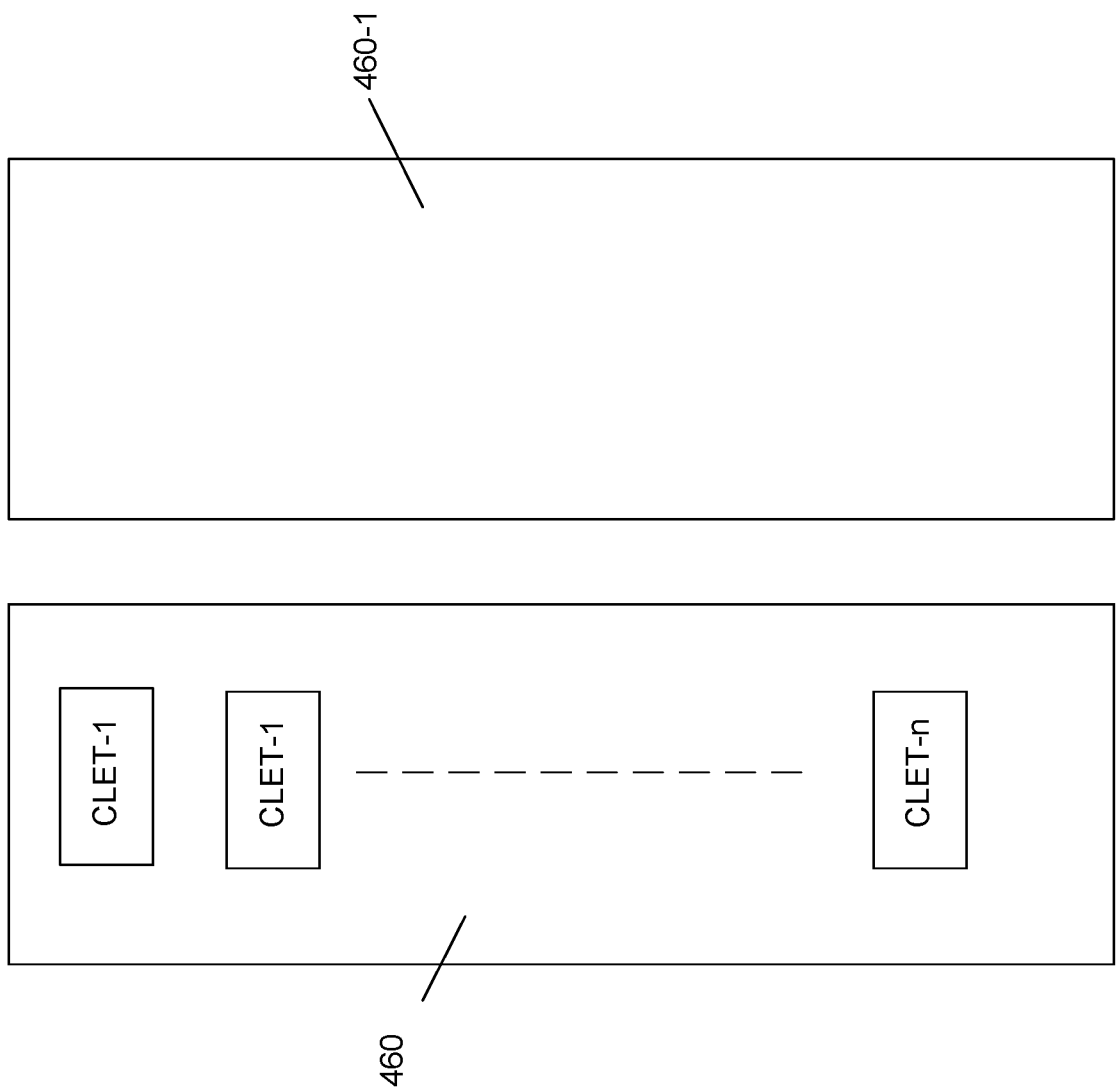

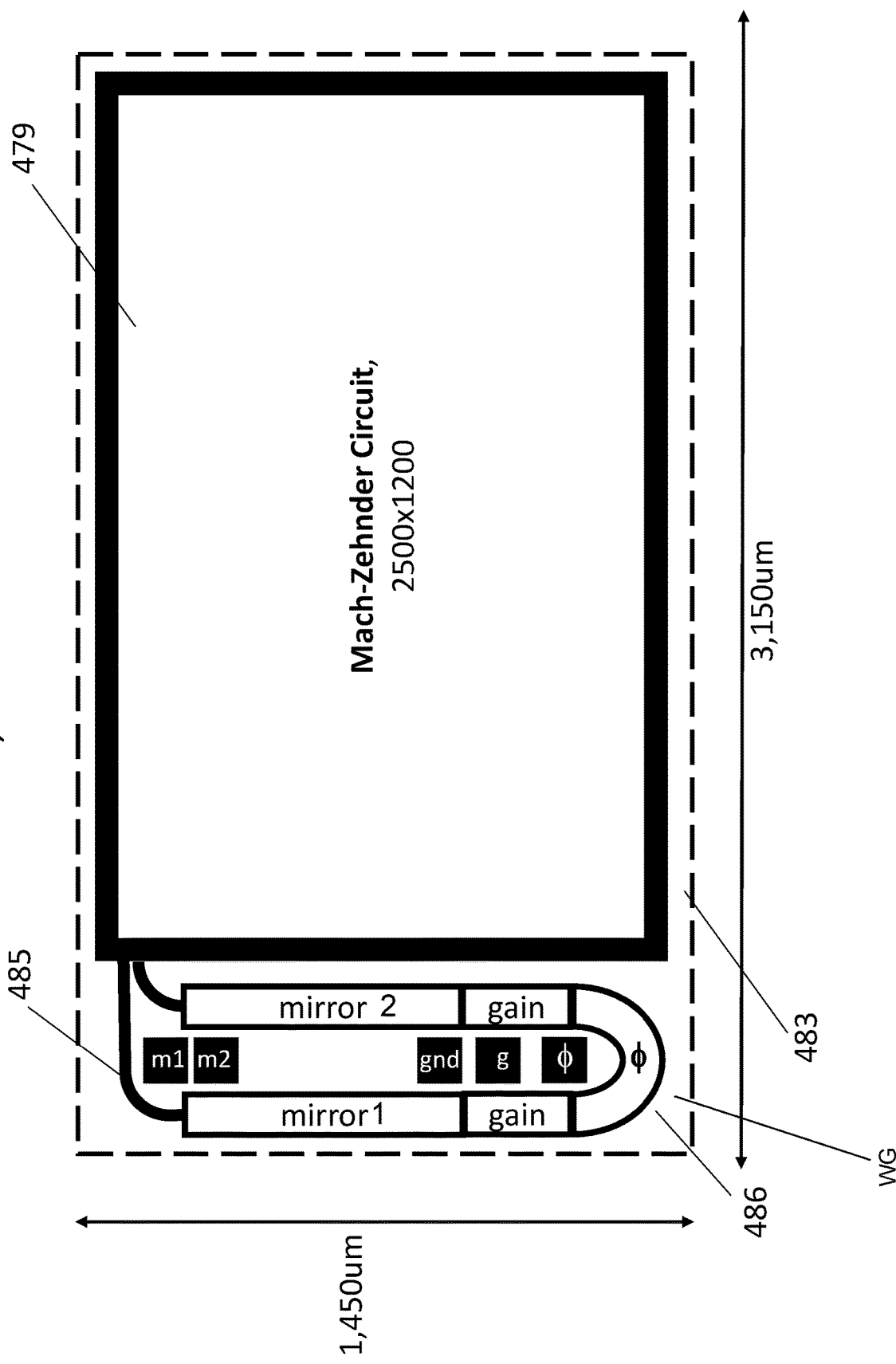

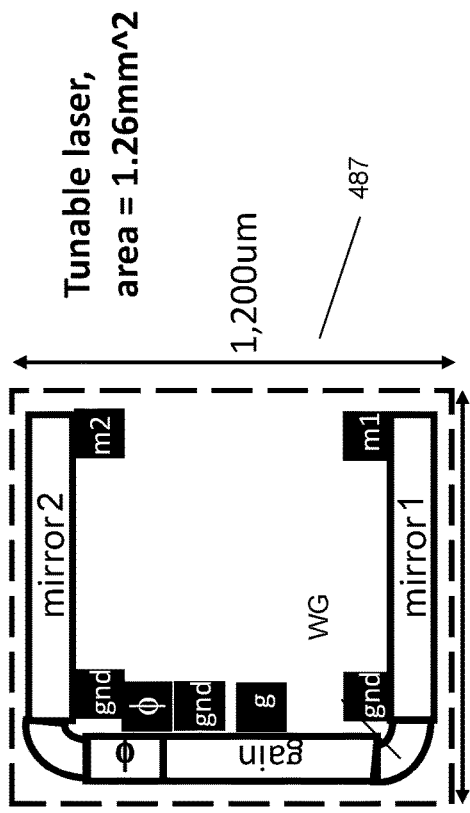
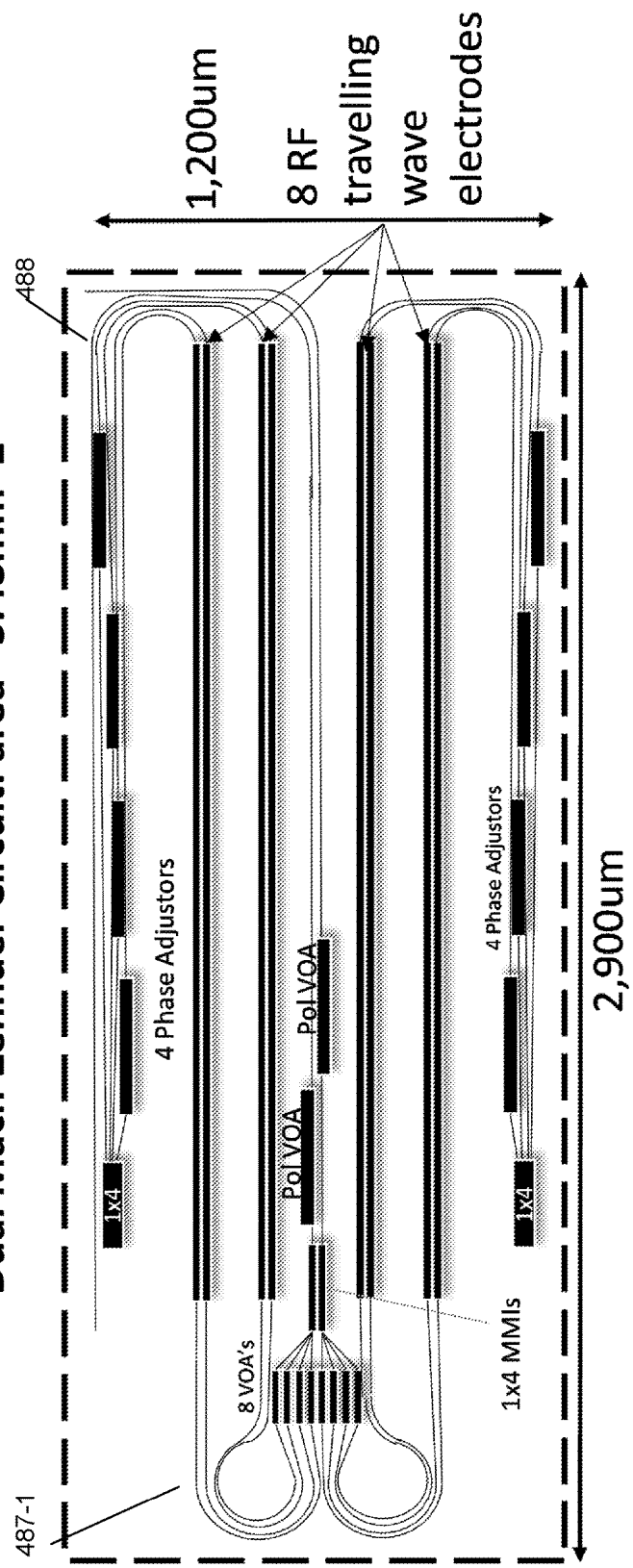
Fig. 4j

Area of CLET:
0.58 mm^2

Area of hybrid/PD circuit:
1.17 mm^2

Areas added:
1.75 mm^2

Area of compact Rx PIC:
1.62 mm^2

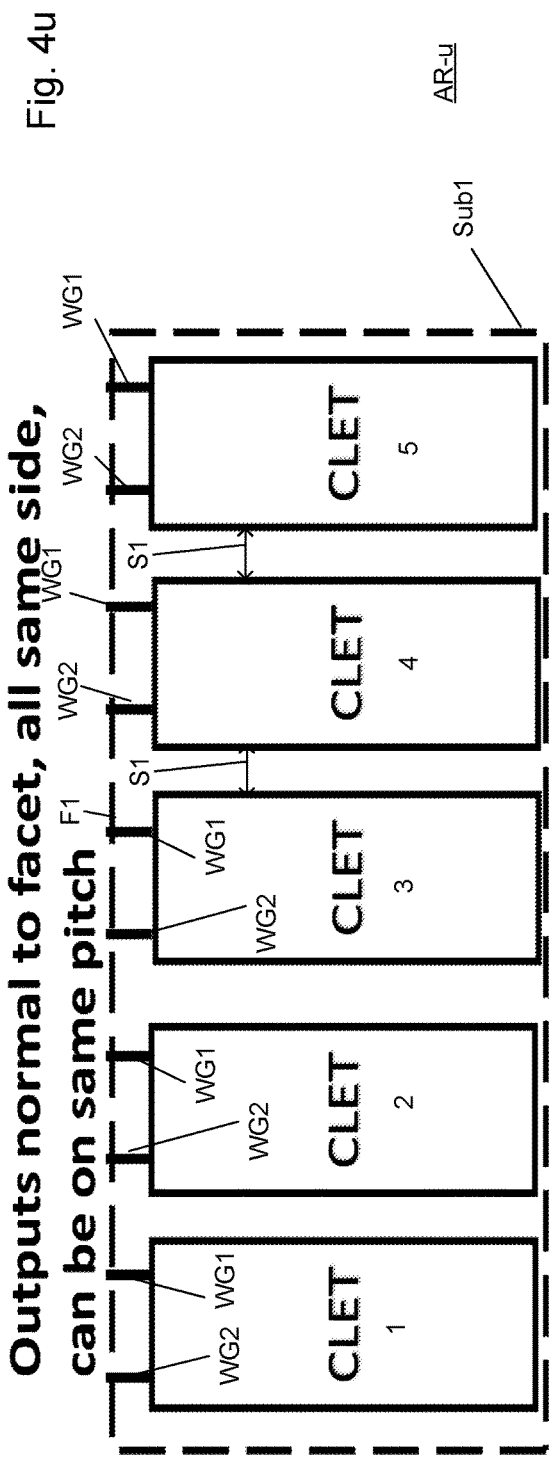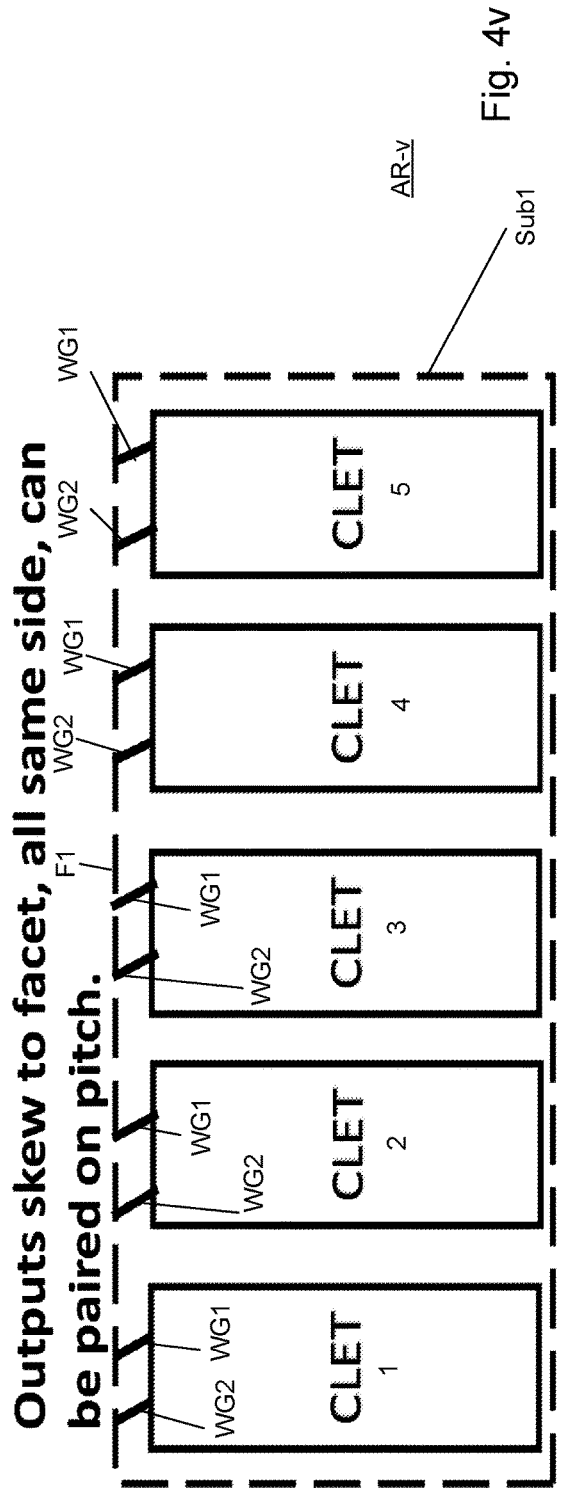

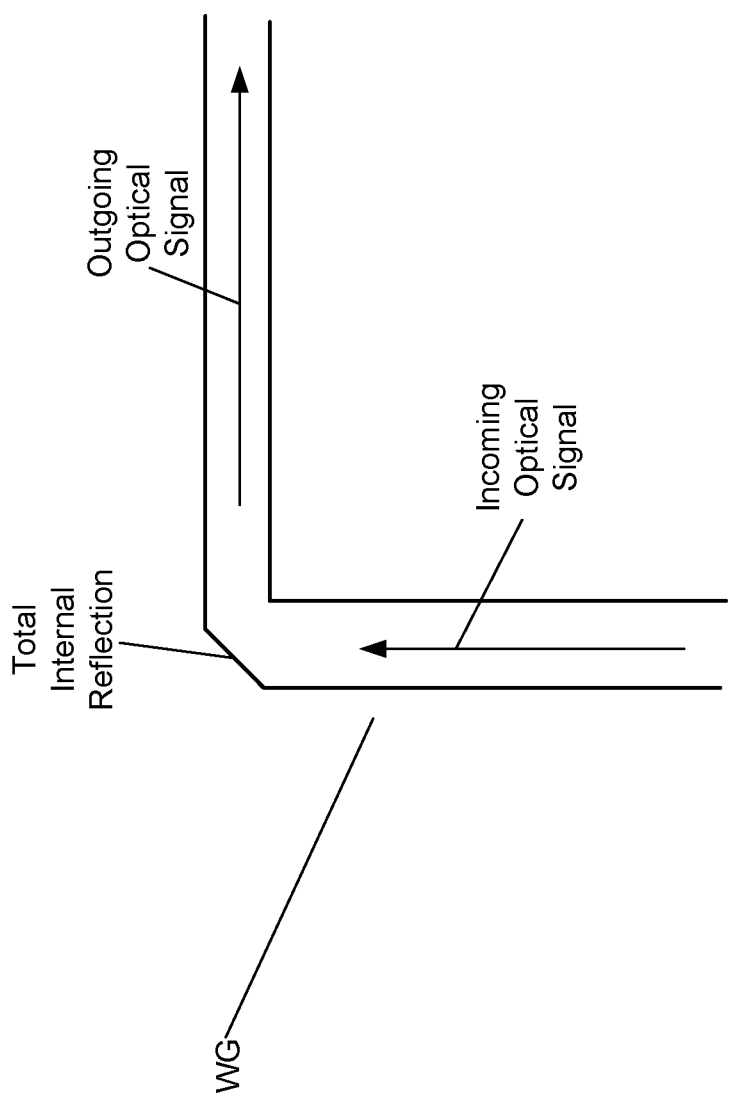

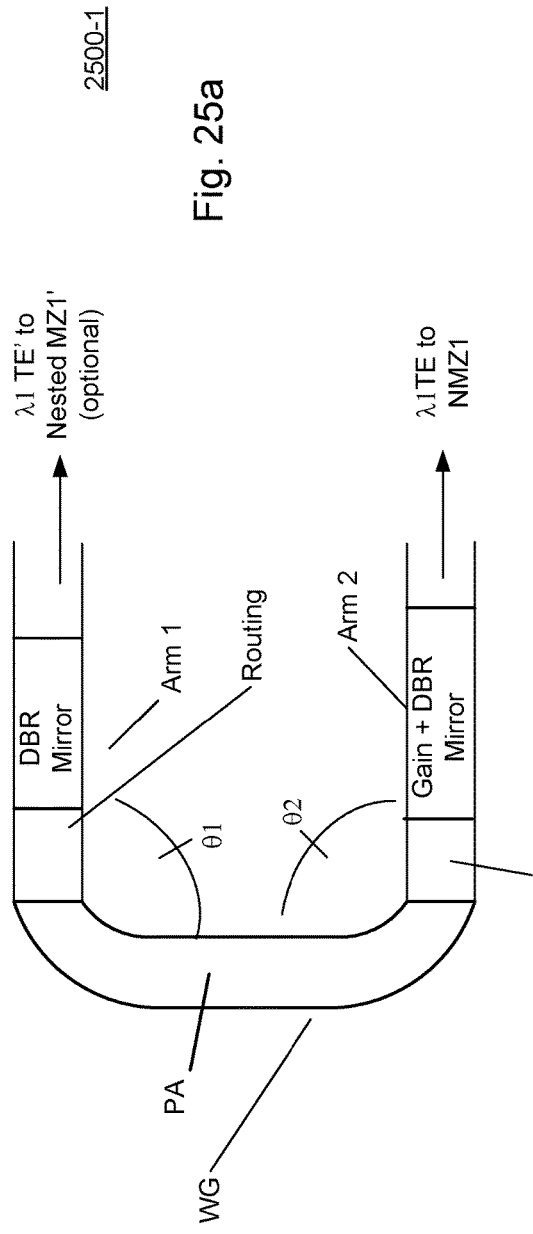
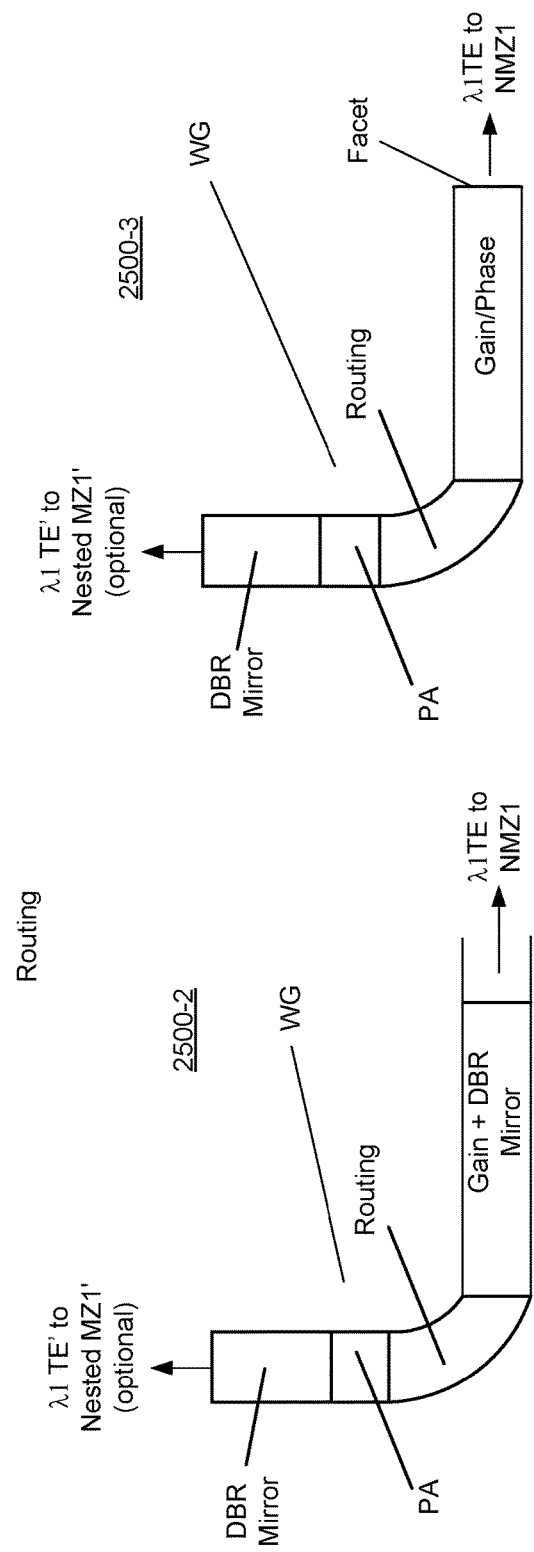
Fig. 25a
Fig. 25b
Fig. 25c

PHOTONIC INTEGRATED CIRCUIT INCLUDING COMPACT LASERS WITH EXTENDED TUNABILITY

This application is a continuation-in-part of application Ser. No. 15/141,668 filed Apr. 28, 2016, which claims priority to U.S. Provisional Application No. 62/154,152 filed Apr. 29, 2015, the contents of both of which are incorporated by reference herein in their entirety.

BACKGROUND

Wavelength division multiplexed (WDM) optical communication systems are known in which multiple optical signals, each having a different wavelength, are combined onto a single optical fiber to provide a WDM signal. Such systems typically include transmitters having a laser associated with each wavelength, a modulator configured to modulate the output of the laser to carry data, and an optical combiner to combine each of the modulated outputs. Receivers are also provided to demultiplex the received WDM signal into individual optical signals, convert the optical signals into electrical signals, and output data carried by those electrical signals.

Conventionally, WDM systems have been constructed from discrete components. For example, lasers and modulators have been packaged separately and provided on a printed circuit board. More recently, however, many WDM components have been integrated onto a semiconductor chip, also referred to as a photonic integrated circuit (PIC). In particular, multiple lasers have been provided on a common substrate, along with other optical devices.

Tunable lasers are often desirable in WDM systems to reduce cost and improve functionality. For example, the costs associated with a system including lasers that are restricted to particular wavelengths is greater than that having a single type of laser that may be tuned to a wider range of wavelengths. In addition, optical signal wavelengths may be reassigned, thereby providing greater system flexibility and a reduced number of different types of critical components (FRUs).

As generally understood, a tunable laser, like other lasers, may include a cavity or a waveguide portion defined by two reflective regions or mirrors. In a tunable laser, however, each mirror may include a series of gratings, such as Bragg gratings, such that the reflectivity characteristic of each mirror includes a series of high reflectivity peaks at periodically spaced wavelengths, i.e., the wavelengths are spectrally spaced from one another by a Free Spectral Range (FSR). In order to tune the laser, each mirror may be heated, for example, to thereby shift the peaks of one mirror relative to that of the other mirror. When one of the peaks associated with the characteristic of one mirror aligns with one of the peaks of the other mirror, lasing may occur at the wavelength associated with both peaks to the exclusion of others. By aligning other peaks, lasing may occur at other wavelengths, such that the laser is tuned over a wide range of wavelengths, for instance over much or all of the "C-Band", ~1530-1564 nm, or beyond the C-Band (e.g., the extended C-Band 1526-1567 nm). Tunable lasers may also be designed for wavelengths longer than the C-band out to a maximum wavelength of 1625 nm in the L-Band. Tuning to wavelengths between these discretely separated peaks may be achieved by tuning both mirrors together for continuous wavelength accessibility.

Tunable lasers have traditionally been geometrically linear and are often longer than fixed wavelength lasers in order to accommodate the series of gratings that constitute each mirror as well as a phase tuning section. For example, distributed feedback (DFB) lasers may be 200-1200 microns in length, whereas monolithic, widely tunable lasers may be 1000-3000 microns in length. In addition, the cavity length of tunable lasers should be relatively long in order reduce phase noise and narrow linewidth, which are particularly desirable in transmitters and receivers in coherent optical communication systems that typically operate at high data rates. Longer lasers, however, may require that the size of the photonic integrated circuit, and the semiconductor die upon which it is provided, be increased. Increased die sizes may result in reduced yields and increased manufacturing costs, and hence, it is desirable to form a widely tunable laser in a very small footprint while still enabling the requisite performance of the laser.

Other tunable lasers may include multiple waveguides, such as those present in an arrayed waveguide grating (AWG). See http://retis.sssup.it/~marko/papers/tunable_awgl.pdf (L. Babaud et al., "First Integrated Continuously Tunable AWG-Based Laser Using Electro-Optical Phase Shifters"). AWG-based lasers, however, may impose wavelength restrictions and are also less compact than those lasers based on discrete gratings. In such lasers, the waveguide or optical path in the laser cavity between the mirrors is discontinuous or split, such that light in the cavity is divided into physically segmented paths within the cavity. Y-Branch tunable lasers also have a discontinuous or split cavity. See https://www.finisar.com/sites/default/files/resources/widely_tuneable_modulated_grating_y-branch_chirp_managed_laser_ecoc_2009_ieee.pdf (Y. Matsu et al., "Widely Tuneable Modulated Grating Y-Branch Chirp Managed Laser"). Accordingly, there is a need for compact discrete tunable lasers and laser arrays as well as a need for a photonic integrated circuit that has a high circuit density for minimal die size and tunable laser functionality.

SUMMARY

Consistent with the present disclosure, a compact laser with extended tunability (CLET) is provided that includes multiple segments or sections, at least one of which is curved, bent or non-collinear with other segments, so that the CLET has a compact form factor either as a singular laser or when integrated with other devices. The term CLET, as used herein, refers to any of the laser configurations disclosed herein having mirrors and a bent, angled or curved part, portion or section between such mirrors. If bent, the bent portion is preferably oriented at an angle of at least ±30 degrees relative to other portions of the CLET. Alternatively, the curve or bend portion may be distributed over different sections of the CLET over a series of arcs, for example. The waveguide extending between the mirrors is continuous, such that light propagating along the waveguide is not divided or split. The waveguide also constitutes a continuous waveguide path. As shown in FIG. 26 (which does not show bent or co-linear segments for ease of illustration), exemplary CLET 2600 shown may include sections that may perform one or more different active or passive functions: gain, wavelength tunable reflection, phase adjustment, non-tunable reflection, thermal isolation, and electrical isolation. There may be multiple of sections of each of these elements. Also, the sections are typically deployed between the mirrors. The reflection or mirror sections may include one or more of gratings, sampled gratings, digital sampled gratings which may or may not be chirped for optimal tuning and mode discrimination characteristics. In addition, passive or routing sections may be located in the CLET cavity, defined by the reflection or mirror sections, as well as external to the cavity, and enable routing or interconnection to other elements on the PIC (these sections may connect one or both ends of the laser). These routing sections may be sections that are electrically and/or thermally isolated from other portions of the CLET or PIC. In addition, the routing sections include a passive waveguide, which, as noted above may further provide routing, e.g., interconnection to other portions of the PIC or the CLET, or directing optical signals or light to other portions of the PIC or CLET. Alternatively, the passive sections may be provided for improved manufacturability. The CLET may include: a distributed Bragg reflector (DBR) laser, a DBR laser having sampled gratings, a DBR laser having chirped gratings, or a laser having a broadband reflector (e.g., a facet or coated facet). Generally, the CLETs are tunable over at least 4 nm (roughly a fourth of the C-band), and preferably over at least 17 nm (half of the C-band), more preferably over at least 34 nm (full C-band), and most preferably at least 41 nm (extended C-Band). Furthermore, the CLET may include a singular optical path within the cavity or a singular optical path coupled to resonator structures, such as gratings or ring resonators, as distinguished from less compact AWG-based and other multi-path lasers (e.g., y-branch). Thus, in a CLET, a single optical waveguide comprises the laser cavity between the mirrors. The waveguide between the CLET mirrors may also be configured such that light is not divided (undivided) or split into physically separate paths within the cavity, such as in an AWG. This waveguide section also constitutes a continuous waveguide path that extends between the mirror sections as distinguished from devices wherein at least one of the elements is integrated with a "gap" in the cavity (e.g., flip-chip bonded elements within the cavity). Moreover, other devices or optical elements can be integrated with the compact CLETs such as other lasers (e.g., in a laser array), power monitors, photodiodes, power splitters and combiners, couplers, modulators (e.g., electro-absorption modulators and/or Mach-Zehnder modulators), attenuators and semiconductor optical amplifiers (SOAs), multiplexers, demultiplexers, and optical hybrids. In addition, the CLET may be part of a larger PIC or integrated with external optical chips such as PLCs and silicon photonics chips or integrated heterogeneously where some of the components of the CLET consist of III-V and others Si photonic devices. Finally, the waveguide design of the various segments of the CLET may include a single core or multiple guiding layers that collectively constitute the waveguide core.

Moreover, a CLET takes advantage of bends in order to minimize the size of a stand-alone laser, a laser array or a laser integrated with other PIC elements. In one example, the CLET may include a plurality of bends and may have a minimum aggregate bend of 30 degs when the bends are summed together from the absolute value of each bend. For example, a CLET may minimally have a single bend of magnitude 30 deg, 30 bends of magnitude 1 deg, or two bends of +15 deg and −15 deg.

It is to be understood that both the foregoing general description and the following detailed description are exemplary and explanatory only and are not restrictive of the invention, as claimed.

The accompanying drawings, which are incorporated in and constitute a part of this specification, illustrate several embodiments and together with the description, serve to explain the principles of the invention.

BRIEF DESCRIPTION OF THE DRAWINGS

FIGS. 3b and 3c illustrate shall and deep etched waveguides consistent with an aspect of the present disclosure;

FIGS. 16a-16e show examples of turning mirrors consistent with an additional aspect of the present disclosure;

FIGS. 17-24, 25a-25c, 26, and 27 illustrate further examples of CLETs consistent with the present disclosure.

DETAILED DESCRIPTION

Reference will now be made in detail to the present embodiments of the present disclosure, examples of which are illustrated in the accompanying drawings. Wherever possible, the same reference numbers will be used throughout the drawings to refer to the same or like parts.

In the description below, an exemplary WDM optical communication will be described with reference to FIG. 1, followed by details of exemplary photonic integrated circuits in FIGS. 2, 3a-3c, and FIG. 4a. FIGS. 4b, 4d, 4e, 4g, 4i-4x, 5a-b, 6a-b, 7-15, 17-24, 25a-25c, 26, and 27 next describe exemplary CLET configurations consistent with the present disclosure may be curved or bent at an angle that is preferably at least 30 degrees, and more preferably 180 degrees or more.

It is understood that an array of CLET lasers consistent with the present disclosure may be provided in an array. Lasers provided within or on the edge of the array may have a configuration that is different than the configuration of lasers that are provided in the middle of the array, in order to optimize density, manufacturability or performance of the lasers or PIC. Also, various CLET geometries may be provided to match or be aligned with other PIC elements or wirings.

Figure 1:
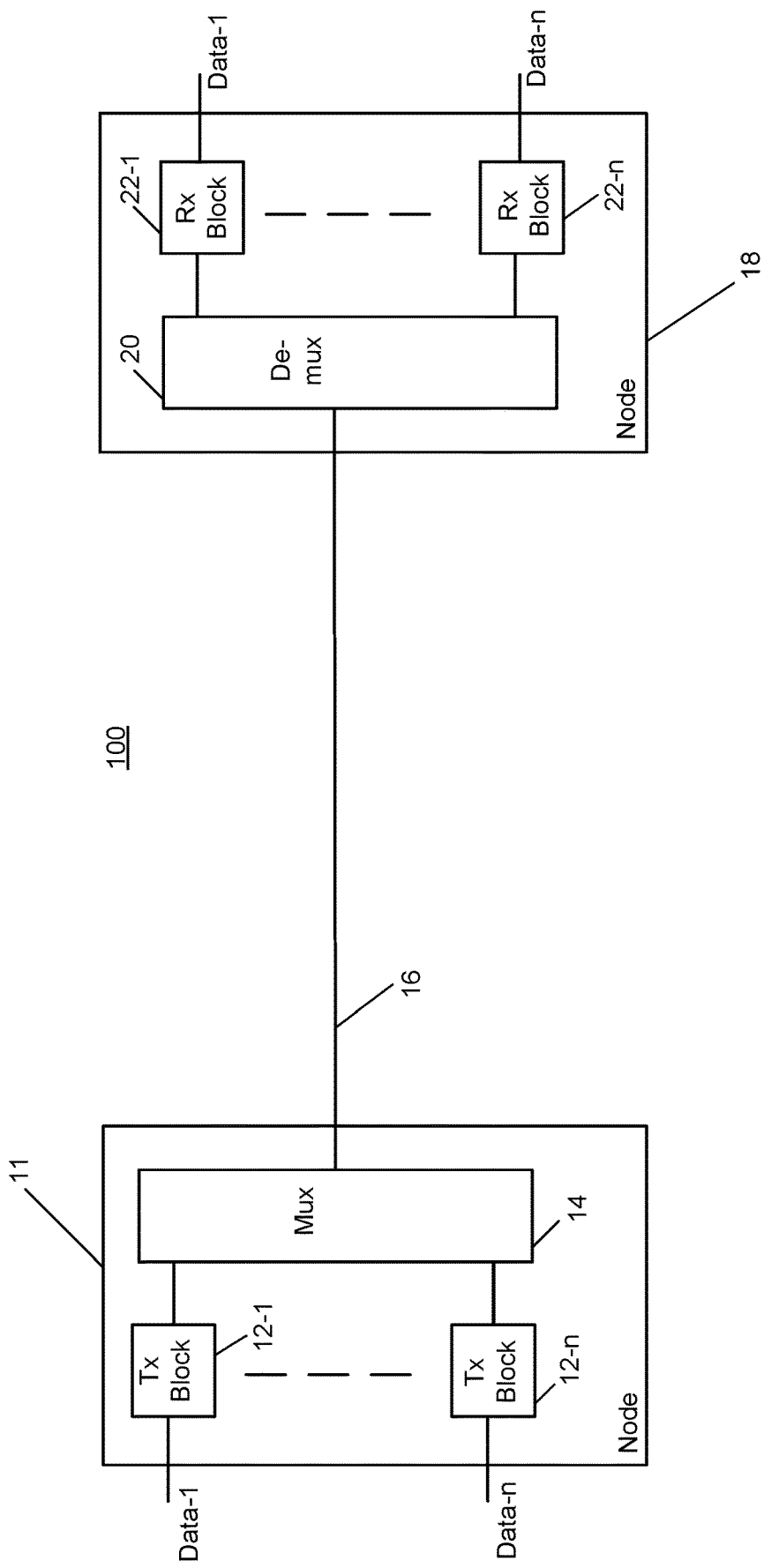
FIG. 1 illustrates a block diagram of an optical communication system consistent with the present disclosure.

FIG. 1 illustrates an optical link or optical communication system 100 consistent with an aspect of the present disclosure. Optical communication system 100 includes a plurality of transmitter blocks (Tx Block) 12-1 to 12-n provided in a transmit node 11. Each of transmitter blocks 12-1 to 12-n receives a corresponding one of a plurality of data or information streams Data-1 to Data-n, and, in response to a respective one of these data streams, each of transmitter blocks 12-1 to 12-n may output a group of optical signals or channels to a combiner or multiplexer 14. Each optical signal carries an information stream or data corresponding to each of data streams Data-1 to Data-n. Multiplexer 14, which may include one or more optical filters, for example, combines each group of optical signals into a multiplexer that is output onto optical communication path 16. Alternatively, a power splitter may be employed. Optical communication path 16 may include one or more segments of optical fiber and optical amplifiers, for example, to optically amplify or boost the power of the transmitted optical signals.

As further shown in FIG. 1, a receive node 18 is provided that includes an optical decombiner or demultiplexer 20, which may include one or more optical filters. For example, optical demultiplexer 20 may supply each group of received optical signals to a corresponding one of receiver blocks (Rx Blocks) 22-1 to 22-n. Each of receiver blocks 22-1 to 22-n, in turn, supplies a corresponding copy of data or information streams Data-1 to Data-n in response to the optical signals. As discussed in greater detail below, each receiver block 22-1 to 22-n may include a coherent heterodyne receiver, which typically has a local oscillator laser. Such local oscillator laser may also be a CLET.

Figure 2:
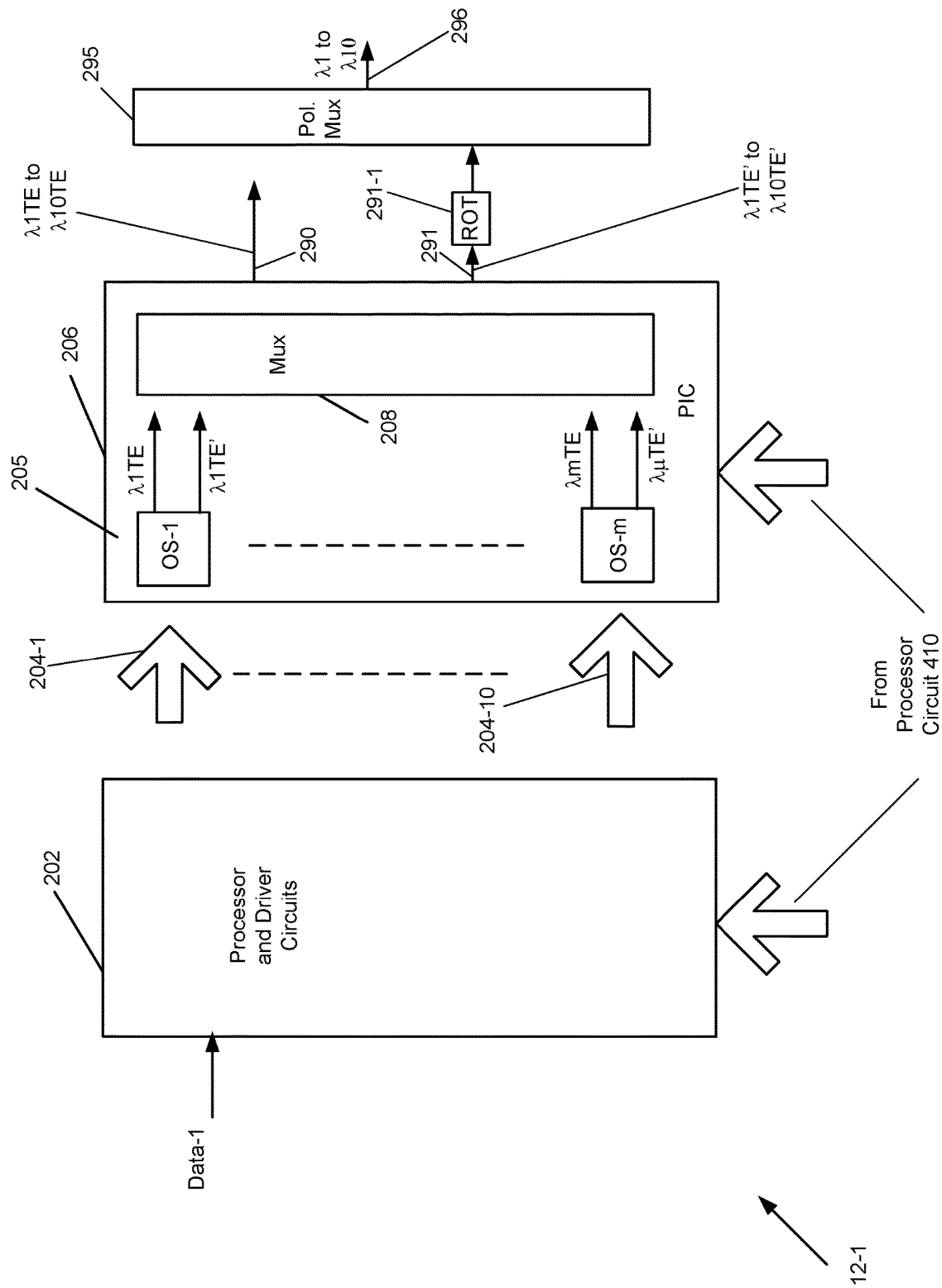
FIG. 2 illustrates the transmitter portion of the optical communication system of FIG. 1 in greater details.

One of transmitter blocks 12-1 is shown in greater detail in FIG. 2. It is understood that remaining transmitter circuitry or blocks 12-2 to 12-1-n have the same or similar structure as transmitter block 12-1. Transmitter block 12-1 may include a processor (such as a digital signal processor or DSP) and driver circuits 202, that receives, for example, a corresponding portion of Data-1. Circuitry 202, in turn, supplies corresponding outputs or electrical drive signal groupings 204-1 to 204-10 to optical sources or transmitter circuits OS-1 to OS-m (m being an integer) provided on transmit photonic integrated circuit (PIC) substrate 205. It is understood that the particular transmitter block configuration is shown in FIG. 2 and is one example of the devices that may be incorporated into transmitter block 12-1 and that other configurations are within the scope of this disclosure. For example, the multiplexer need not be included in the transmitter block. In addition, each optical source may include more or fewer devices than those shown in FIG. 2, as well as those shown in FIG. 2.

Although a polarization multiplexed coherent transmission system is disclosed herein, it is understood that the CLET configurations disclosed herein may be employed in non-coherent architectures, such as On-Off-Keying (OOK), as well as non-polarization multiplexed architectures or PICs which provide other functionality or architectures.

As further shown in FIG. 2, each of tunable optical sources OS-1 to OS-m supplies a corresponding pair of modulated optical signals (for example, a respective one of pairs λ1TE, λ1TE' . . . λmTE, λmTE') to optical combining or multiplexing circuitry 208 (Mux). Typically, each optical signal within a given pair has the same or substantially the same wavelength, e.g., each of optical signals λ1TE, λ1TE' have wavelength λ1. In one example, each of optical signals λ1TE to λ10TE are multiplexed by multiplexing circuitry 208 into a first WDM output 290 and each of optical signals λ1TE' to λ10TE' are multiplexed into a second WDM output 291. Multiplexing circuitry 208 (Mux) may include one or more arrayed waveguide gratings (AWGs) and/or one more power combiners and/or optical couplers. In another example, the pairs of modulated optical signals may be combined in a common or shared multiplexer that receives and multiplexes the TE optical signals onto a first output and the TE' optical signals onto a second output of the same multiplexer.

Optical sources OS-1 to OS-1m and multiplexing circuitry 208 may be provided on substrate 205, for example. Substrate 205 may include indium phosphide or other semiconductor materials, such as Group III-V semiconductor materials. In one example, the substrate may include silicon and certain devices integrated on the substrate may also include silicon. In another example, a CLET including Group III-V semiconductor material and having one of the configurations disclosed herein may be integrated on a silicon photonics substrate or platform. In addition, all or some portion of the cavity defined by and including the mirrors of the CLET may be provided include materials selected from: silicon photonics-based materials, planar lightwave circuit (PLC) materials (e.g., SiOxNy on Si or other substrate), or group III-V materials. Additionally, all or some of the functionality for PICs described herein outside of the CLET may be selected from materials selected from: silicon photonics-based materials, planar lightwave circuit materials, or group III-V materials. Although non Group III-V materials may be provided in the CLET, at least part of the gain region is preferably formed from a Group III-V material. In addition, the waveguide between the mirrors may be continuous in the CLET described herein.

As further shown in FIG. 2, the first (290) and second (291) WDM outputs may be provided to polarization multiplexing circuitry 295, including, for example, a polarization multiplexer or polarization beam combiner. The polarization of output 291, however, may be rotated by rotator 291-1 and such rotated output may be input to polarization multiplexing circuitry 295. In one example, first WDM output 290 may have a transverse electric (TE) polarization and is supplied to a polarization multiplexer by polarization maintaining optical fiber, such that the polarization of each optical signal in the first WDM output has the TE polarization at the input to polarization multiplexing circuitry 295. The second WDM output 291 may also have a TE polarization (designated TE' in the figure) when output from multiplexer 208, but the second WDM output 291 may be provided to a second polarization maintaining fiber that is twisted in such a way that the polarization of each optical signal in the second WDM output 291 is rotated, for example, by 90 degrees. Accordingly, each such optical signal may have a transverse magnetic (TM) polarization when supplied to polarization multiplexing circuitry 295. Polarization multiplexing circuitry 295, in turn, combines the two WDM optical outputs to provide a polarization multiplexed WDM optical signal 296. Alternatively, polarization multiplexing circuitry 295 and polarization rotating components may be integrated on substrate 205.

It is understood, that tunable optical sources OS-1 to OS-m, as well as wavelength multiplexing circuitry, multiplexer or combiner 208, may be provided as discrete components, as opposed to being integrated onto substrate 205, such as PIC 206. For example, each optical source may include a discrete CLET, an array of discrete CLETs, or CLETs which are integrated with other devices.

Figure 3A:
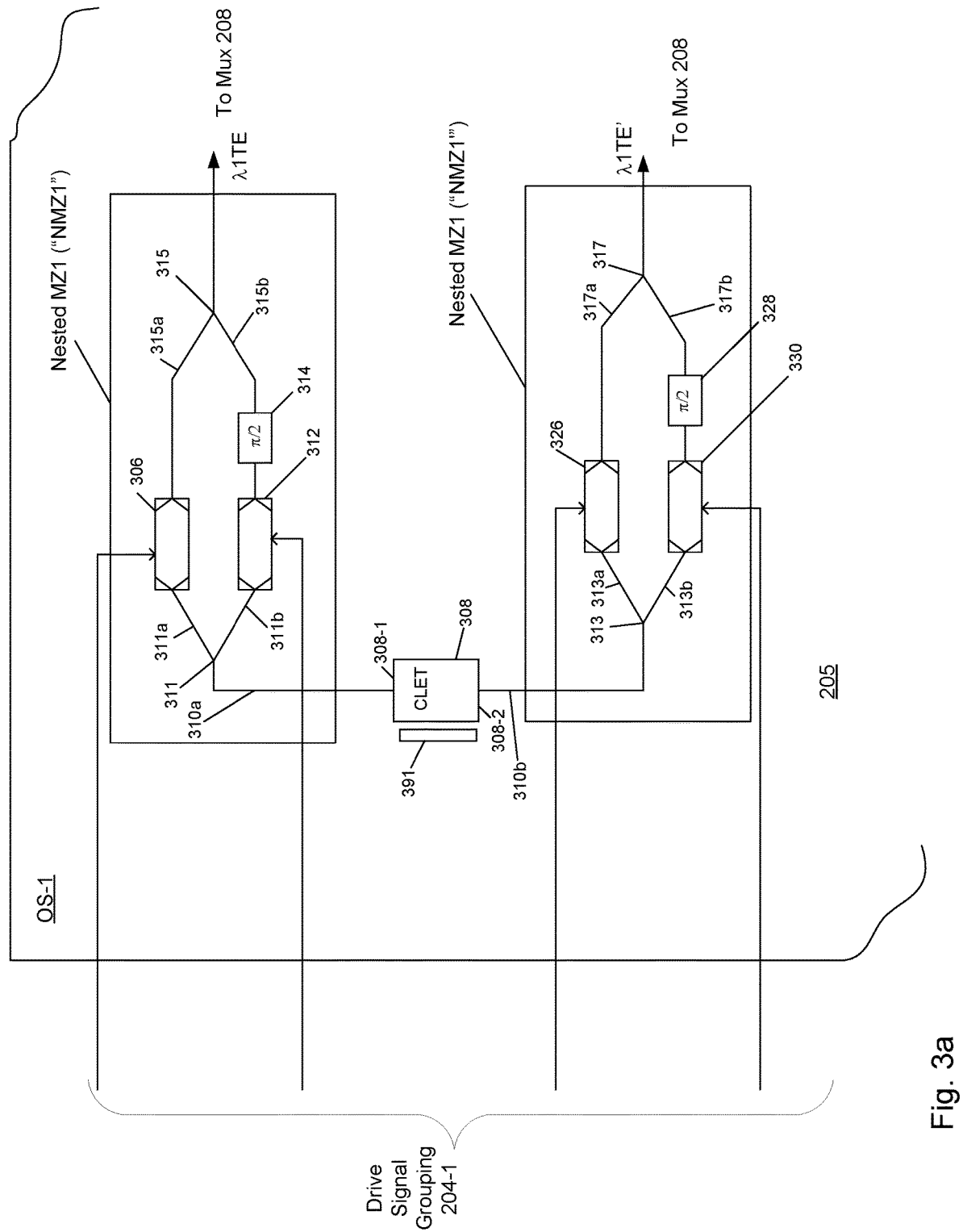
FIG. 3a illustrates part of a photonic integrated circuit (PIC) consistent with an aspect of the present disclosure.

FIG. 3a illustrates tunable transmitter or tunable optical source OS-1 in greater detail. It is understood that remaining tunable optical sources OS-2 to OS-m have the same or similar structure as tunable optical source OS-1. It is understood that PICs and optical sources (OS) are provided present in transmitter blocks 12-2 to 12-n shown in FIG. 1 and such PICs and optical sources operate in a similar fashion and include similar structure as PIC 206 and optical source OS-1 shown in FIGS. 2 and 3a.

Although FIGS. 2 and 3a show a transmitter PIC, it is understood that the present disclosure is applicable to transceiver PICs including both transmitter and receiver circuitry provided on a single substrate. CLETs in the transmitter circuitry may have the configurations described herein, and the receiver circuitry may include local oscillator lasers which may also include bent, curved or folded sections, such as that shown in FIGS. 4l, 4m-4o, 4q, 4t, 5a, 5b, 6a, 7-24, 25a-25c, and 27.

Returning to FIG. 3a, tunable optical source OS-1 may be provided on substrate 205 and may include a CLET 308, which supplies light to at least one modulator. In the example shown in FIG. 3, light is output to a first nested MZ modulator (NMZ1) including a pair of sub-modulators 306 and 312 and to a second nested MZ modulator including another pair of MZ modulators 326 and 330. Such dual output lasers are also described in U.S. Pat. No. 8,233,510 titled "Dual Output Laser Source" the entire content of which is incorporated herein by reference.

CLET 308 may output continuous wave (CW) light at wavelength λ1 from first side 308-1 as first output 310a to nested Mach-Zehnder interferometer NMZ1 and a second CW output 310b from side or side 308-2 to second Mach-Zehnder interferometer NMZ1'. A low frequency electrical signal may also be applied to any of the sections to further modulate each optical signals with a low-frequency tone that is unique to each optical signal. Such tones may be used to modulate for optical signal identification, control and/or monitoring purposes and may have modulation frequencies up to 10 MHz or below 500 KHz or 100 KHz. Typically, the waveguides used to connect the various components of optical source OS-1 may be polarization dependent. It is understood that the present disclosure is not limited to the Mach-Zehnder, IQ modulators discussed above. Rather, any n-QAM modulator (in which n is an integer) or electro-absorption modulator is contemplated. Furthermore, modulators are contemplated wherein the phase and/or amplitude of the modulated optical signal is fixed but switchable. Contemplated modulation formats include, but are not limited to n-level amplitude shift keying or m-level phase shift keying and combinations thereof, where n may or may not equal m, m and n are both integers. Also, either one of m and n may be equal to zero, but not both. Also, modulators for OOK may be employed wherein each modulated source contains multiple polarizations.

Returning to FIG. 3a, first output 310a supplies the first CW light to first branching unit 311 (also referred to herein as "coupler 311") and the second output 310b supplies the CW light to second branching unit 313. A first output 311a of branching unit 311 is coupled to modulator 306 and a second output 311b is coupled or supplied to modulator 312. Similarly, first output 313a is coupled to modulator 326 and second output 313b is coupled to modulator 330. Modulators 306, 312, 326 and 330 may be, for example, Mach Zehnder (MZ) modulators or MZ interferometers. Each of the MZ modulators or interferometers receives CW light from CLET 308 and splits the light between two (2) arms or paths, as discussed in greater detail below. The CLET of the PIC of FIGS. 3a and 4a may have light output that is substantially the same (±20% and preferably ±10%) from the output of each laser. This enables the deployment of a largely symmetric (±20% and preferably ±10%) cavity or waveguide section between the mirrors and reduces the potential for spatial-hole burning in the laser structure. Alternatively, light may be taken out from all one side of the laser and then split before entering each of the modulators. In this case, the majority of the light should be directed to this end of the laser in the CLET, preferable >90% of the output.

In FIG. 3a, tuning may be achieved thermally with a heater 391, including, for example, a resistive material, which may be provided adjacent to or above a section or all of laser 308, which may be a CLET as disclosed herein, to control the temperature and thus the wavelength of light output from laser 308. Resistive metals may include Ti, Ta, W, Mo, TaN, WN, Pt, NiCr, and other materials to promote good adhesion to surrounding dielectrics such as TiO, SiOx, SiNx, and SiOxNy. Alternatively, the resistive material may be a semiconductor that is separate or comprises all or some of the mirror section. Alternatively, CLET 308 may be tuned by adjusting an amount of current supplied thereto. In one example, such tuning may be achieved by adjusting the temperature of one or more of the mirror sections of each CLET. Alternatively, the mirrors may be current tuned by adjusting a current applied to an electrode overlying the mirror sections. The gain and/or phase (if present) sections in each laser may also be either thermally or current tuned. Other tuning mechanisms are contemplated herein, such as by applying a voltage or introducing strain to one or more sections of the CLET. The gain, mirror, phase, and passive sections will be further described below. Tuning may be achieved thermally by coupling a heater with any segment. Typically, an applied electric field in one or both paths or arms of a MZ interferometer may create a change in the refractive index within the arm(s). In one example, if the relative phase between the signals traveling through each path is 180° out of phase, destructive interference results and the signal is blocked. If the signals traveling through each path are in phase, the light may pass through the device and modulated with an associated data stream. The applied electric field, through application of biases or voltages at electrodes (not shown in FIG. 3a) may also cause changes in the refractive index such that a phase, as well as the amplitude, of light output from the MZ modulator is shifted or changed relative to light input to the MZ modulator. Thus, appropriate changes in the electric field can cause changes in phase of the light output from the MZ modulator, such that the light output from the modulator complies with phase modulation format, such as BPSK, QPSK, higher-order QAM or another phase modulation format. Each of the MZ interferometers 306, 312, 326 and 330 are driven with data signals or drive signals associated with drive signal grouping 204-1, for example. The CW light supplied to MZ modulator 306 via CLET 308 and coupler 311 is modulated in accordance with one such drive signal from grouping 204-1. The modulated optical signal from MZ modulator 306 is supplied to first input 315a of branching unit 315. Similarly, other drive signals of grouping 204-1 drive MZ interferometer 312. The CW light supplied to MZ modulator 312 via CLET 308 and coupler 311 is modulated in accordance with the drive signal supplied by a driver circuit (not shown). The modulated optical signal output from MZ interferometer 312 is supplied to phase shifter 314 which shifts the phase of the signal 90° (π/2) to generate one of an in-phase (I) or quadrature (Q) components, which is supplied to second input 315b of coupler 315. The modulated data signals from MZ interferometer 306, which include the other one of the I and Q components, and from MZ interferometer 312 are supplied as optical signal λ1TE (see FIG. 2) to multiplexing circuitry 208 via coupler 315.

Further drive signals of grouping 204-1 drive MZ interferometer 326 to output modulated optical signals as one of the I and Q components. The CW light supplied from CLET 308 is supplied to MZ interferometer 326 via first output 313a of coupler 313. MZ interferometer 326 then modulates the CW light supplied by CLET 308, in accordance with drive signals from driver circuit 202. The modulated optical signal from MZ modulator 326 is supplied to first input 317a of coupler 317.

An additional drive signal of grouping 204-1 drives MZ modulator 330. CW light supplied from CLET 308 is supplied to MZ modulator 330 via second output 313b of coupler 313. MZ modulator 330 then modulates the received optical signal in accordance with the drive signal supplied by driver 332. The modulated data signal from MZ modulator 330 is supplied to phase shifter 328 which shifts the phase of the incoming signal 90° (π/2) and supplies the other of the I and Q components to second input 317b of coupler 317.

The modulated data signal from MZ modulator 330 is also supplied to branching unit 317, and the combined outputs from MZ modulators 326 and 330 are also supplied to multiplexing circuitry 208 as optical signal λ1TE'. Both λ1TE and λ1TE' have a TE polarization, but λ1TE', as well as λ2TE' through λ10TE' as part of the second WDM optical output 291, may be polarization rotated to have a TM polarization (to provide optical signals λ1TM to λ10TM) prior to being polarization multiplexed in circuitry 295 (see FIG. 2 above).

MZ interferometers 306, 312, 326, and 330 may have a traveling wave or lumped configuration.

Collectively, MZ interferometers or modulators 306 and 312 constitute a first "nested MZ" (NMZ1) and MZ interferometers 326 and 330 constitute a second nested MZ (NMZ1').

Figure 4A:
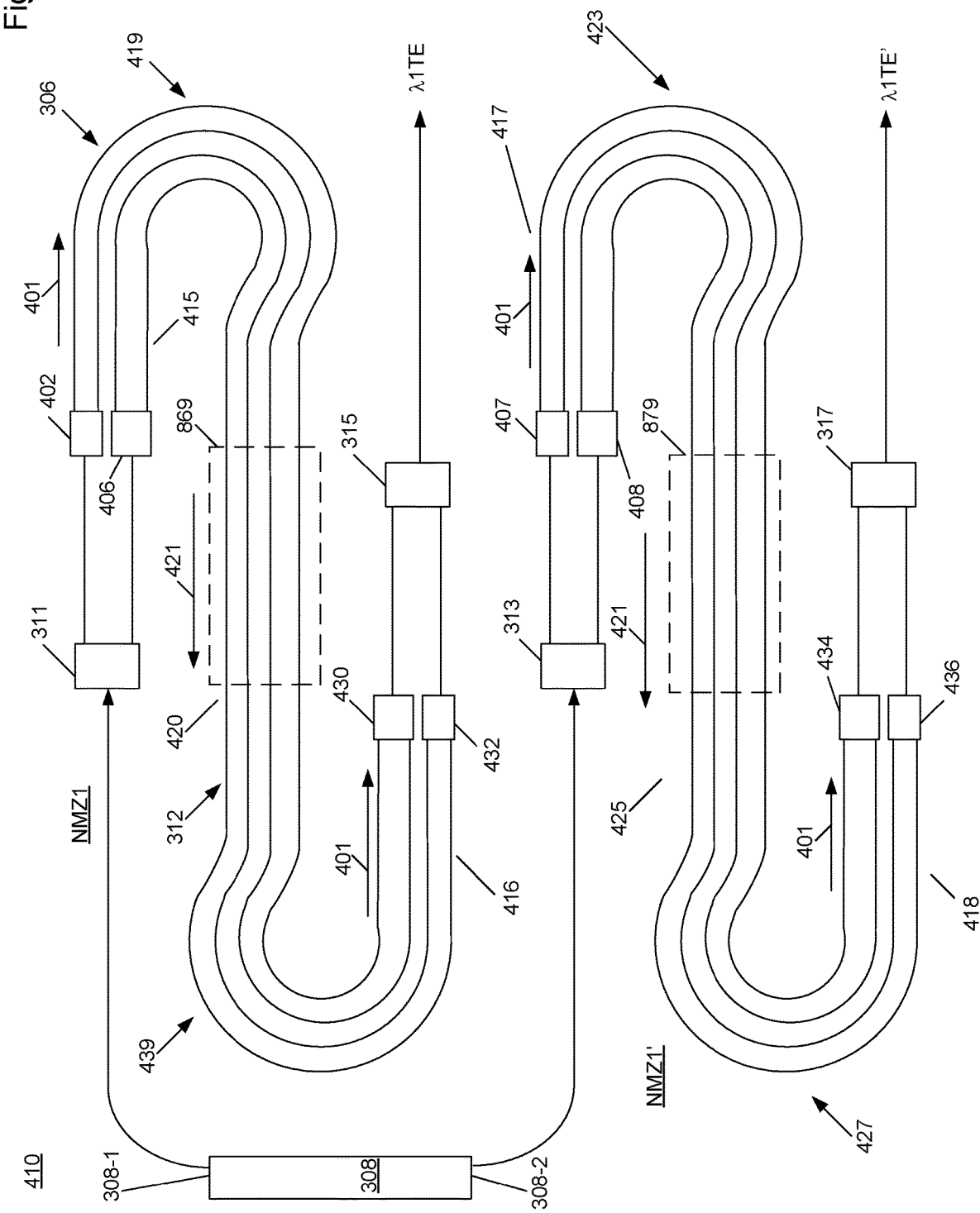
FIG. 4a illustrates a portion of a photonic integrated circuit consistent with a further aspect of the present disclosure.

In FIG. 4a the waveguide pairs of NMZ1 extends between couplers 402 and 430 and waveguide pairs or arms extending between couplers 406 and 432 have straight portions 415 and 416. Similarly, the waveguide pairs or arms of NMZ1' extending between couplers 407 and 434 and waveguide pairs extending between couplers 408 and 436 have straight portions 417 and 418. NMZ1 includes straight portions 415 (portions 417 of NMZ1') having lengths that extend in first directions 401, bent portions 419 (portions 423 of NMZ1'), middle or central portions 420 (425 of NMZ1') that extend in second directions 421, additional bent portions 439 (427 of NMZ1'), and further straight portions 416 (418 of NMZ1') that extend in first direction 401. It is noted, however, that the directions in which portions 415 (417 ) and 416 (418 ) extend may be different from one another.

In the example shown in FIG. 4a, MZ interferometer 306 includes couplers 402 and 430 and the waveguide pair or arms extending there between. MZ interferometer 312 includes couplers 406 and 432 and the waveguide pair or arms extending there between.

In operation, light output from side 308-1, for example, of CLET 308 is supplied to coupler 311, where it is split and a first portion of the light is supplied to coupler 402 and a second portion is supplied to coupler 406. Coupler 402, in turn, supplies a third portion of the light to a first arm and a fourth portion of the light to a second arm of MZ interferometer 306. In addition, coupler 406 supplies a fifth portion of the light to a first arm of MZ interferometer 312 and a sixth portion of the light to a second arm of MZ interferometer 312. The third, fourth, fifth, and sixth portions of the light travel along corresponding waveguide arms and through the straight and bent portions discussed above. Appropriate biases may be applied to electrode configurations (not shown) to adjust or modulate the phase and or amplitude of such light portions. For example, the phase and/or amplitude of the third and fourth portions of the light may be modulated in accordance with an in-phase (I) component signal, and the fifth and sixth portions of the light may be modulated in accordance with a quadrature (Q) component signal.

The third and fourth light portions may be combined by coupler 430, and the fifth and sixth light portions may be combined by coupler 432, and the modulated outputs of couplers 430 and 432 (i.e., the modulated optical signal outputs from MZ interferometers 306 and 312) are combined by coupler 315 to supply λ1TE. Light output from side 308-2 of CLET 308 may similarly be supplied to super MZ interferometer 492, split into portions, phase and/or amplitude modulated, and such portions may be combined to output λ1TE (see FIG. 3a). Light output from sides 308-1 and 308-2 has essentially the same wavelength for properly functioning lasers.

It is understood that each of the above-noted configurations may be provided in each of optical sources OS-2 to OS-m, for example, to generate modulated optical outputs or optical signals λ2TE to λ10TE and λ2TE' to λ10TE'. In addition, in each of the above examples, the MMI couplers (e.g., 430, 432, etc.) may be provided at any appropriate location along the waveguide arms.

Consistent with the present disclosure, at least some or all of each section between the mirror sections is provided in a bend or curve of the CLET or in non-collinear sections of the CLET. Details of exemplary configurations of CLET 308 will next be described below. Namely, various examples of CLET configurations are disclosed herein having tunable portions, such as one or more of the gain, phase adjusting, and mirror sections, that are provided in bends or curves. Also, CLETs are disclosed herein having sections that are optically passive and do not introduce gain, tunable phase, or reflection. Such optically passive sections may also be provided in bends or curves while the gain, phase, mirror and/or tuning/tunable portions of the CLET are provided in straight sections. It is understood that one or more of the gain, phase adjusting, and mirror sections may be tuned by one or more mechanisms, such as temperature, current, voltage, and stress, as noted above. Such mechanisms are not shown for convenience.

It is also understood, that CLETs consistent with the present disclosure may include combinations of both passive and tunable sections. In determining whether a given section is to be curved or straight, various considerations may be taken into account. Namely, there is a preferred orientation and method for fabricating gain sections due to their intolerance for plasma etch damage and ease of fabrication on one orientation by using chemical etch chemistries (typically liquid or gaseous). Chemical etchants are crystallographic, and produce the most symmetric waveguides (unlikely to excite higher order modes) when aligned to appropriate crystal planes. CLET sections, such as mirror, phase, gain, tuning, and passive sections are within the bounds of the mirror sections of the CLET, i.e., in the cavity. In all cases, the waveguide may be a ridge or buried with additional material. Shallow waveguides are defined where the vertical confining layers of the waveguides are etched relatively shallow (see FIG. 3b). Deep etched waveguides are etched beyond this extent to provide strong lateral index guiding. Alternatively, deep etched waveguides confine the optical mode within the physically defined ridge (see FIG. 3c). Alternatively, deep etched waveguides may be defined as one in InP based material (including InGaAs InGaAsP, and/or InAlGaAs) with a radius of curvature less than or equal to 150 microns and less than or equal to 0.5 dB/ninety degrees. Alternatively, deeply etched waveguides are defined wherein the etch extends through the upper confining layer and reaches at least part of the core or separate confinement region of a vertical waveguide structure.

InP deep-etched waveguide bends may also be defined by substantially vertical, deep etch through the core and about 0.5-2 µm into the cladding below. The bends preferably have a radius of curvature (ROC) that is not more than 150 um for compactness, but bends of such size may cause unwanted polarization rotation if adequate care is not take to ensure substantially vertical sidewalls and avoid resonant arc length conditions. Larger bends may produce less loss and still result in reasonably compact chips up to an ROC of size 250 um. Larger ROCs may be used, but any advantage in loss and polarization stability tends to be in the error of measurement beyond 500 um ROC.

Deeply-etched silicon waveguides also may have loss as low as 1 dB for 10 um ROC and less than that for 100 um ROC bends. Such low loss may be attributable to the high vertical confinement possible with a buried oxide geometry and excellent photolithographic and etch definition that may be provided with deeply etched silicon waveguides.

Waveguides consistent with the present disclosure may be curved or aligned to any crystal planes except that gratings are typically patterned on a Cartesian coordinate system for manufacturability, so that it may be difficult to achieve reproducibly symmetric and accurate grating patterns, index profiles and filter shapes if provided along a curve. Phase sections or passive waveguides may be preferred elements for bending in a CLET. The caveat for a phase section is that the CLET may be made more compact by co-locating the phase tuning function with the gain section (for instance, use one current to control gain and a heater to control phase), thus causing no excess laser cavity length or excess laser size. This geometry however has the disadvantage of increasing the operating temperature of the gain section and coupling gain and phase tuning. A separate phase section is desirable for reduced gain temperature operating and reduced coupling between gain and phase tuning. Separate phase ($\phi$) sections may also be deployed within the cavity to ensure symmetry in the cavity and/or reduce spatial hole burning. Device design and operation considerations (for instance gain region power dissipation and junction temperature) may or may not allow the gain and phase sections to be co-located. Deep waveguides enable tighter bending at lower loss than shallow waveguides, but shallow waveguides offer higher performance and potentially more reliable gain sections and they have a wider single-mode waveguide width that can physically support a wider heater metal in thermally tuned sections for improved manufacturability. The following Table 1 illustrates advantages and disadvantages associated with the curve or bend of various laser sections.

TABLE 1

| Waveguide orientation | Mirror Sections | Gain Section | Phase Section(s) | Electrical and/or Thermal isolation sections |
|---|---|---|---|---|
| Straight section on crystal axis | (+) Etched waveguide profile is symmetric, even if a chemical etch component is used.<br>(−) This restriction may result in less compact lasers or chips. | (+) Allows wet-etched, shallow waveguide geometry so that no dry etch damages the gain region.<br>(−) This restriction may result in less compact lasers or chips. | (+) Allows co-location or co-linear layout with mirror and gain sections.<br>(−) May increase size unless co-located with gain section. | Allows co-location or co-linear layout with mirror and gain sections, but may not be most compact layout. |
| Straight section not on crystal axis | (−) Waveguides etched with a chemical component may not be symmetric so that dry etching is required. | (+) May allow for more compact layout.<br>(−) Asymmetric waveguide definition likely, which can lead to multi-moding and premature device degradation. | (−) May not be able to take advantage of co-location or same layout/process as other sections. | Allows for compact layouts |
| Bent section on one continuous arc | (−) Very difficult to reproduce accurate gratings and continuous-index waveguide. | (+) May allow for more compact layout.<br>(−) Asymmetric waveguide definition likely, which can lead to multi-moding and premature device degradation. | (−) May not be able to take advantage of co-location or same layout/process as other sections. | Allows for compact layouts |
| Multiply-bent section | (−) Not a practical way to achieve uniform gratings. | (+) May allow for more compact layout.<br>(−) Asymmetric waveguide definition likely, which can lead to multi-moding and premature device degradation. | (−) May not be able to take advantage of co-location or same layout/process as other sections. | Allows for compact layouts |

Gain regions of lasers and SOAs are often formed by a ridge waveguide geometry formed first preferably by a dry (plasma) etch to remove contact and other quaternary lasers with a nearly vertical etch profile, followed by a wet chemical etch (normally including HCl component) to complete the etch and ridge waveguide formation. This wet chemical etch to form the ridge waveguide terminates on a quaternary layer that precisely defines the semiconductor slab thickness (lower cladding, core and partial upper cladding) while simultaneously forming a nearly-vertical (typically slightly reentrant) sidewalls of the ridge when the waveguide is oriented in the appropriate crystallographic direction. Orientation of the ridge waveguide in other directions and subsequent wet etch formation result in self-terminating, sloped profiles (instead of vertical) that are not conducive to good optical and carrier confinement, and therefore do not produce good devices. If the orientation of the waveguide is skew to a dominant crystal axis, it can result in an asymmetric waveguide profile and lead to impaired performance, including non-uniform current pumping, thermal profiles, degradation and so forth.) This method is advantageous for device performance over ridge or deeply etched active waveguides because the dry etch step causes damage on the underlying layers and sidewalls that can be removed by the wet chemical etch that forms the ridge waveguide.

Gratings may be patterned in the mirror sections by electron beam lithography or by holography and transferred by etch process into the semiconductor. If quaternary layers are etched, InP may be regrown to fill in the etched holes and planarize or smoothen the epitaxial material grown above.

Further, as noted above, curved sections may provide the most compact layout, but may not necessarily provide the best design for reasons of waveguide shape control, for example. In particular, mirror gratings typically have a desired spacing. Such spacing may be difficult to achieve about a curve or bend—or it may be prohibitively complex and/or expensive. Also, certain etches of the material may proceed at different rates and angles along different crystal axes. When etching a gain section including a PN junction, for example, a vertical wet etch may be difficult to achieve if the waveguide is bent, curved or on the wrong crystal axis. Passive sections and sections including thermally tuned mirrors are less sensitive to such differences in etch rates. As noted below, deep etches may be employed in order to realize tighter bends or curves.

Before addressing examples of various laser configurations consistent with the present disclosure, it is noted that each of the lasers disclosed herein may be provided in a laser array, such as that shown in FIG. 4b. Here, a plurality of CLET's, CLET-1 to CLET-n, are provided on substrate 460, which may include InP or other Group III-V materials, for example. Each CLET disclosed herein may output light having a corresponding one of a plurality of wavelengths to optical elements, such as modulators, combiners, decombiners, optical splitters, optical demultiplexer, semiconductor optical amplifiers, and optical hybrids, and such optical elements may also be provided on substrate 460 as part of a photonic integrated circuit (PIC) or monolithic PIC. Alternatively, other optical elements may be provided on a separate substrate 460-1 that may include InP, another Group III-V material, silicon, or SiOxNy.

For a given set of design or layout constraints or parameters, CLETs may provide compactness in several ways compared to lasers having a linear configuration in which the mirror, gain, and phase sections are provided in a straight waveguide. Namely, compact devices, as well as more compact laser arrays and PICs can be achieved. Moreover, as discussed in greater detail below, more compact lasers arrays and PICs including CLETs may be more compact, even though individual CLETs in those arrays and PICs occupy a greater area than conventional linear lasers in arrays and PICs. Table 2 lists examples of laser layout constraints.

TABLE 2

| Constraint | Min Size in um or um 2 |
|---|---|
| Chip kerf (margin for cleave/saw/cut) | 50 |
| Bonding pad dimensions | 100 × 100 |
| Mirror size | 800 × 100 |
| Gain size | 600 × 100 |
| Phase Adjustor length | 200 × 100 |
| Array count | 8 |
| Mach Zehnder orthogonality | Absolute with respect to Gain |
| Min ROC (radius of curvature) | 100 |
| Min Chip Width (cleaving, handing) | 300 |

Figure 4C:
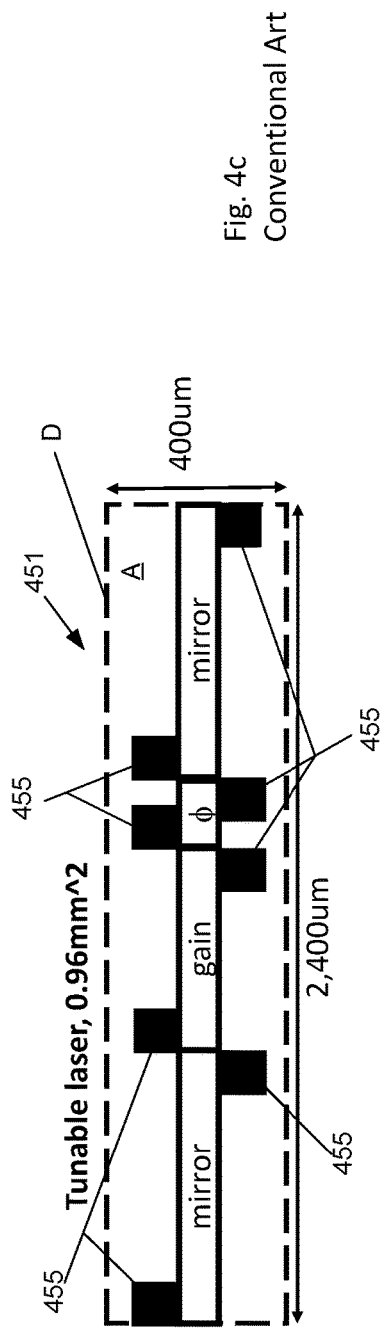
FIG. 4c illustrates an example of a conventional laser.

With the constraints listed in Table 2, conventional linear laser 451 shown in FIG. 4c having bonding pads 455 occupies area A delineated by dashed line D, which in this example is 0.96 mm2. On the other hand, CLET 472-1 (FIG. 4d) having a gain sections, mirror sections, as well as bonding pads 456 and 456-1, additional ("extra") phase adjusting sections, and a curved phase section 452 occupies area A' delineated by dashed line D', which in this example is 0.96 mm2, the same as that of the conventional linear laser 451. However, since CLET 472-1 has a compact design, the length, namely the cavity length (or length of waveguide WG between the mirrors) of the laser can be increased while occupying the same space or area as a shorter linear laser (as defined by the outermost extent of the laser). As used herein, the area occupied by a laser is defined by the outermost extent of the laser, as delineated by the length and width dimensions shown in FIGS. 4c-4e, for example. More generally, the outermost extent refers to the minimum length and width of a rectangle required to enclose or circumscribe the mirror, gain, phase and any routing sections between the mirrors. Alternatively, the outermost extent may refer to the minimum length of a rectangle required to further include bonding pads that provide electrical connection to such sections.

Waveguide WG of CLET 472-1 has an arcuate or curved phase section (452) so that the length of the cavity (as defined by the length of waveguide WG between the mirrors, for example) is longer than the cavity length of the conventional linear laser 451. However, as further noted above, the area occupied by CLET 472-1 may be the same as that of conventional linear laser 451. Longer cavity length lasers may have increased output power and/or reduced linewidth compared to shorter cavity length lasers. Accordingly, CLET 472-1 may having higher output power and/or reduced linewidth relative to a comparable laser occupying the same area as CLET 472-1 but having a linear or straight cavity.

It is understood that section 452 may be a routing section or a combination of a phase section and a routing section. Likewise in each example of a CLET disclosed herein, the curved, bent, or arcuate portion may include a phase section, routing section, or combination of the two. In addition, in other examples disclosed herein, each section of waveguide WG, including the mirrors, gain, phase adjusting (or phase), and routing sections may be in linear portions, at least one of which is oriented at an angle relative to the other sections. The angle in these examples may be an angle between 0 degrees and another angle greater than 180 degrees, and preferably the angle is greater than 30 degrees and more preferably is greater than 45 degrees.

Figure 4D:
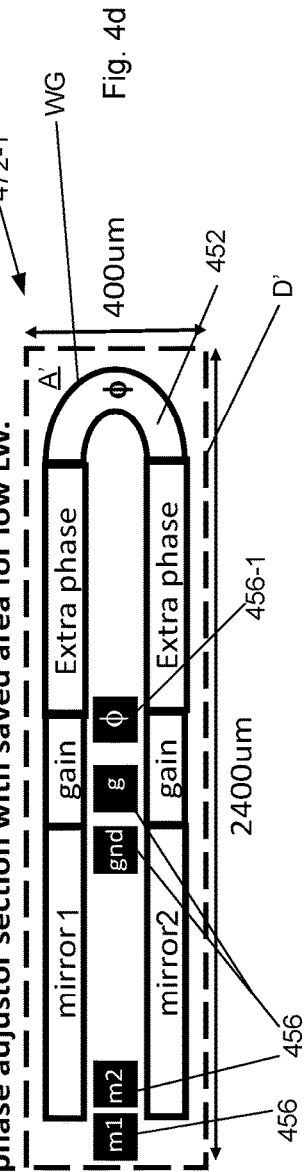
FIGS. 4d-4e illustrates examples of lasers consistent with the present disclosure.

In the example shown in FIG. 4d as well as each of the other examples disclosed herein, light is undivided as it propagates along an entire length of a section of waveguide WG extending from one of the mirror sections to the other. This waveguide section constitutes a continuous optical path in the example shown in FIG. 4d, as well as each of the other examples disclosed herein.

A phase section is a portion of the waveguide WG in which the phase may be changed by application of a bias or electrical signal to electrode or pad ϕ (456-1). Other bonding pads (456) are labeled m1 and m2 for application of bias to control the current or temperature of the mirror section to thereby tune these sections to particular wavelengths in a known manner. Also, a gain electrode or bonding pad 456, labeled g, is used to adjust the temperature or temperature supplied to the gain section so that the gain of the CLET 472-1 (and CLET 472-2 in FIG. 4e) can be adjusted or controlled. Electrode or bonding pad 456, labeled gnd, may be grounded. As used herein, a routing section is a portion of waveguide WG that may be optically passive with no electrical bias. The routing section provides optical connection between optical elements or other section of waveguide WG with relatively low insertion loss. For example, the routing section may have an insertion loss less than 0.1 dB for the bend or arcuate section and or less than 3 dB/cm of propagation loss. The routing section may nor may not include a p-n junction or doping. In addition, the routing section may or may not contain III-V material. Examples of routing sections are discussed in greater detail below.

Figure 4E:
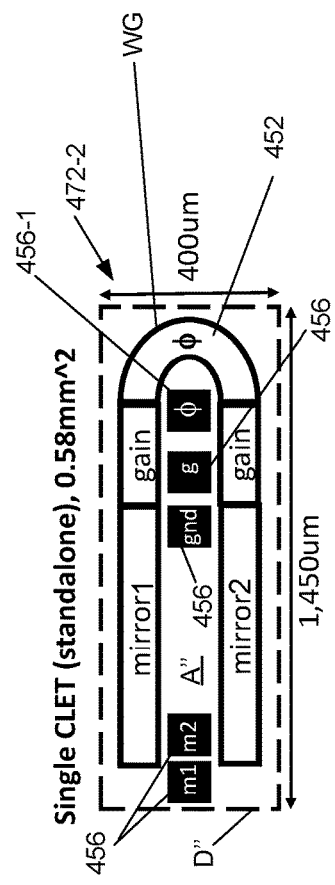

In FIG. 4e, CLET 472-2 is reduced in size, but still has the same cavity length or waveguide length between the mirrors as linear laser 451. In this example, the area occupied by CLET 472-2, A" (as delineated by dashed line D") is 0.58 mm2. That is, CLET 472-2 has an arcuate section (452) and the area occupied by CLET 472-1, A", is less than that when section 452 is straight. In addition, A" is less than area A associated with the corresponding linear laser 451 shown in FIG. 4c. It is understood that a plurality of such CLETs, for example, 472-1 or 472-2, may be provided in an array (as discussed below in connection with FIG. 4g, wherein the area of such array is the same as that of a corresponding linear laser in which the section 452 is straight but the section of waveguide WG between the mirrors is longer than the length of the waveguide section between the mirrors in the linear device. Alternatively, the area of such array is less than that of the corresponding linear laser in which section 452 is straight but the length of the section of waveguide WG between the mirrors is the same as or greater than that of the linear device. Put another way, the area occupied by CLET 472-1 is less than that as when the gain, mirror, and phase sections (and any routing sections) are linearly aligned so that these sections are arranged at an angle of 0 degrees or 180 degrees. Also, the area is less than that when the gain, mirror, and phase sections (any routing sections) are linearly arranged, such that the direction in which each extends is the same. In each instance, the length of the waveguide section between the mirrors is the same as or greater than that associated with the linear arrangements.

As further discussed below, CLETs having a curved, bent, or arcuate portion, such as section 452, may be provided in a photonic integrated circuit with other optical elements selected from the group consisting of one or more: optical modulators, optical combiners, optical splitters, optical demultiplexer, optical hybrids, semiconductor optical amplifiers, and photodetectors. The area occupied by such PICs, whether including a single CLET or multiple CLETs, may be the same as a corresponding PIC in which section 452 is straight (linear device), but the length of waveguide WG is longer in the CLET than in the corresponding linear device. Alternatively, the area of such PICs, whether including a single CLET or multiple CLETs, may be less than that that of a corresponding PIC in which section 452 is straight, but the length of waveguide WG is the same as or greater than that of the linear device.

Figure 4F:
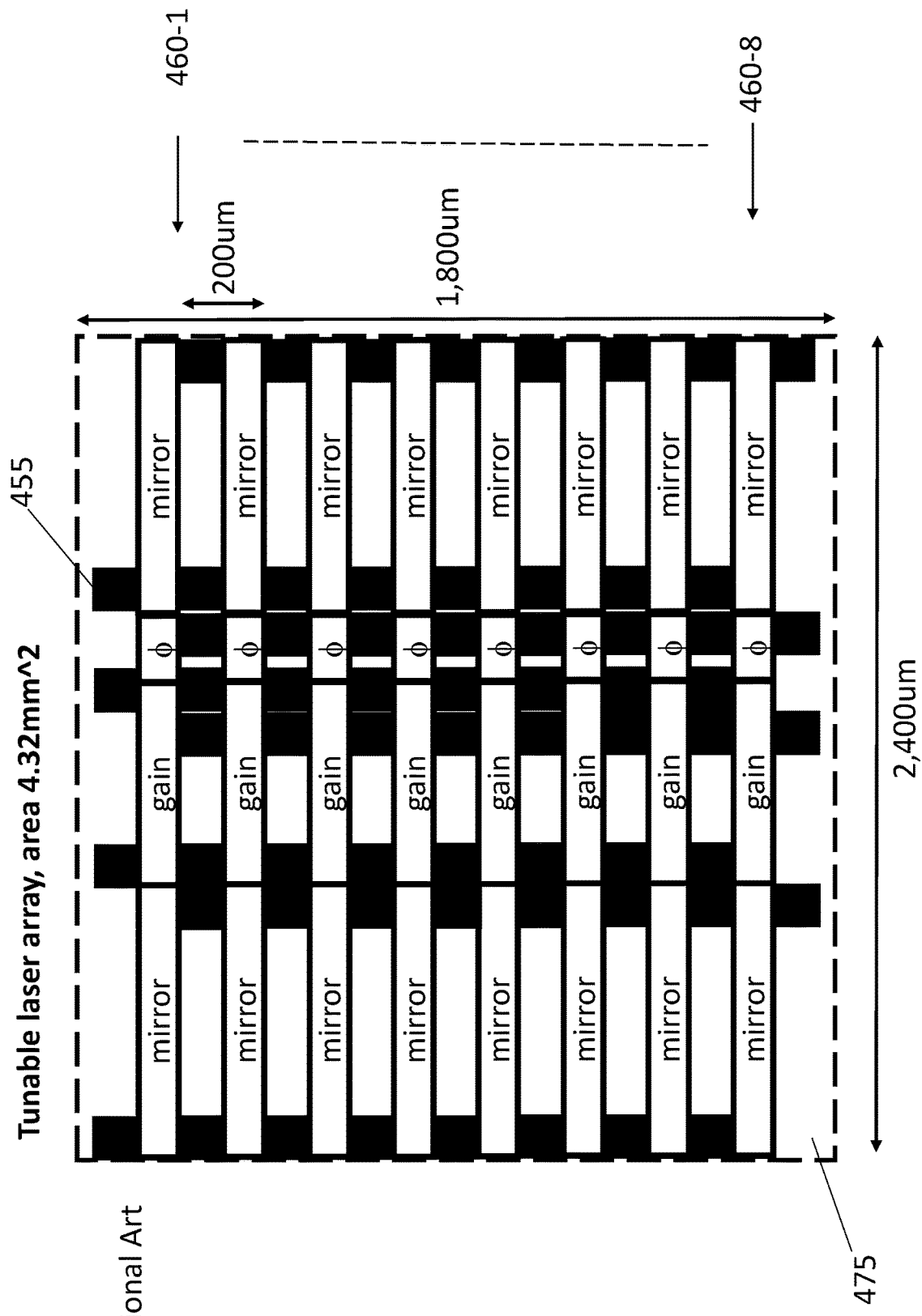
FIG. 4f shows a conventional laser array.
Figure 4G:
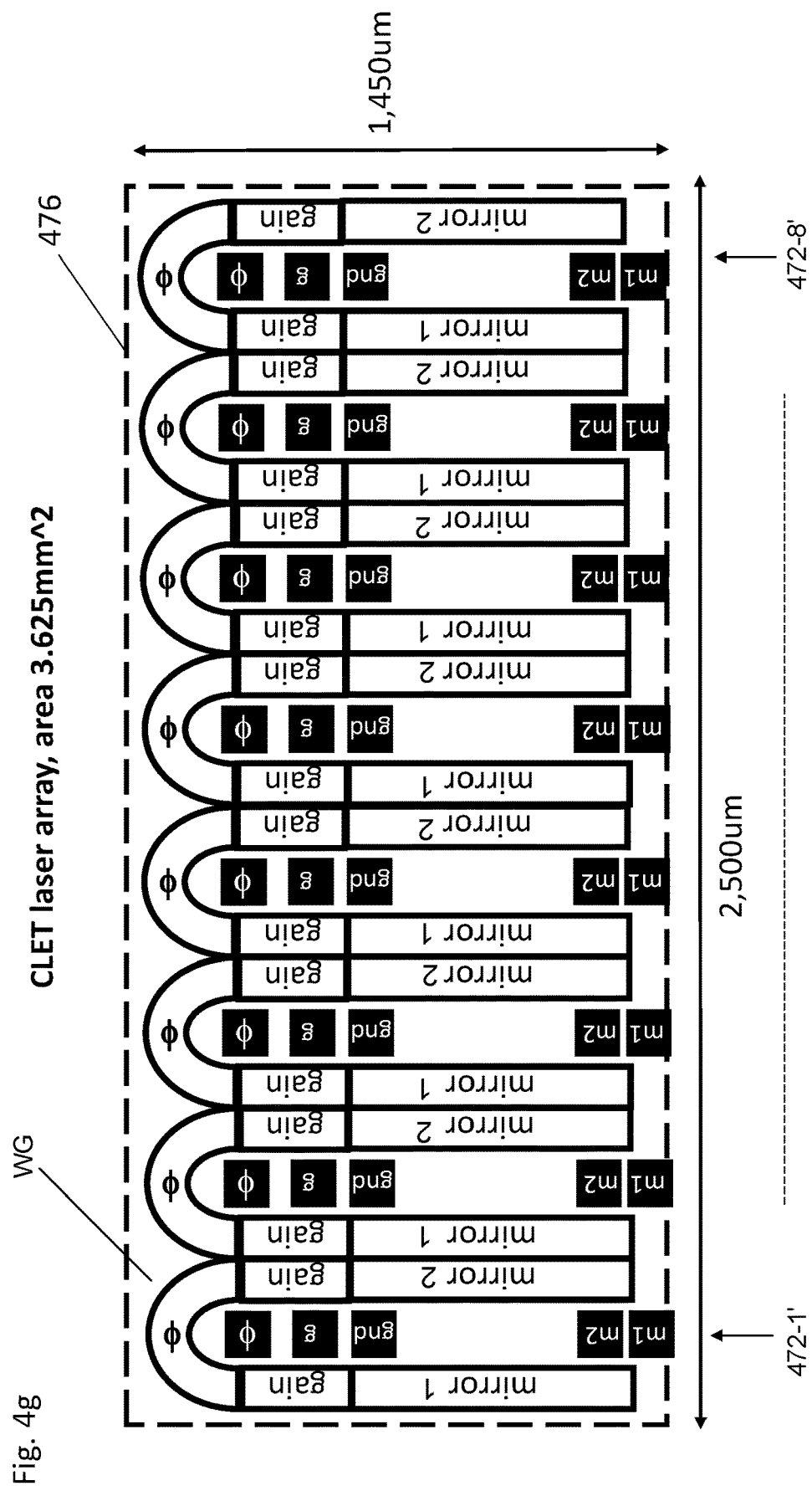
FIG. 4g shows a laser array consistent with an aspect of the present disclosure.
Figure 4H:
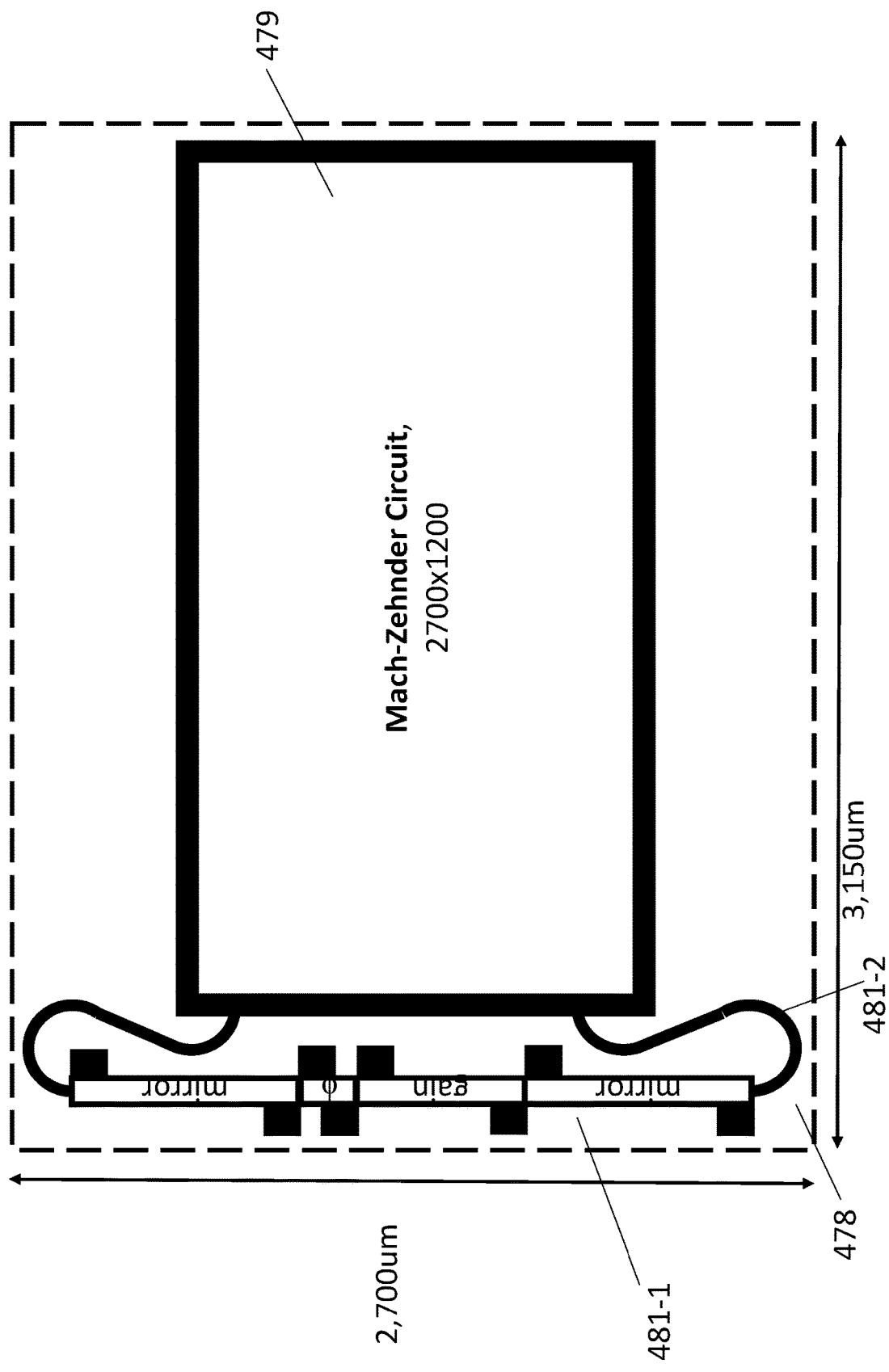
FIG. 4h illustrates a convention tunable laser in a photonic integrated circuit.

As noted above, similar space savings can be achieved with laser arrays. FIG. 4f shows an example of an area of linear lasers 460-1 to 460-8 with straight waveguide sections (mirrors, gain, and phase (ϕ)) occupying substrate area 457, which is equal to 4.32 mm2. A laser array including CLETs 472-1' to 472-8' (see FIG. 4g) consistent with the present disclosure and including the same number of lasers, however, occupies substrate area 476, which in this example is equal to 3.625 mm2.

As further noted above, compact PIC configurations may be realized consistent with the present disclosure. By way of comparison, PIC 481-1 including linear laser 478 similar to the linear lasers shown in FIGS. 4c and 4f and waveguides, one of which being waveguide 481-2, optically connecting to Mach-Zehnder modulator circuit 479 (optical element) has an area equal to 7.965 mm2 (see FIG. 4h). A comparable PIC 483 also having Mach-Zehnder modulator circuit 479, but including CLET 486 and optically connecting waveguides 485, occupies an area of 4.2775 mm2 (FIG. 4i) which is less than the area occupied by the PIC shown in FIG. 4h. In FIGS. 4h, 4i, 4n, and 4o Mach-Zehnder circuit 479 may have the same or similar structure as the dual-Mach-Zehnder circuit shown in FIG. 4j. CLETs, as disclosed herein, may have any appropriate area and are not limited to the particular area values discussed herein. It is noted that the areas disclosed herein are examples only and are illustrative of the advantages that may be achieved with the exemplary CLETs consistent with the present disclosure.

Thus, in the above example, less area or space is occupied by individual CLETs, as well as arrays and PICs that include CLETs compared to designs that do not include CLETs consistent with the present disclosure.

Figure 4K:
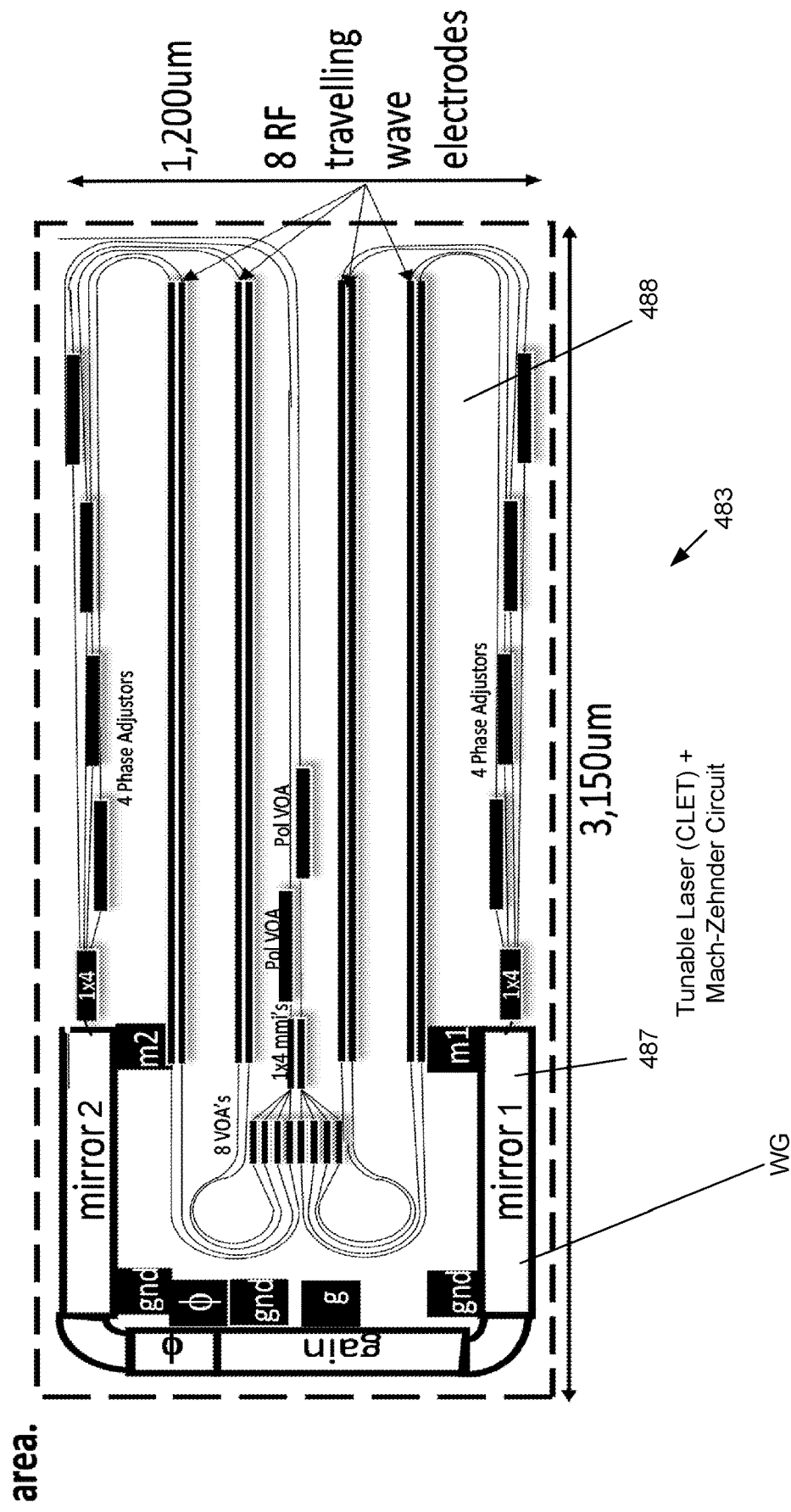
FIG. 4b illustrates a laser array consistent with an aspect of the present disclosure.
FIGS. 4i-4z illustrate examples of photonic integrated circuits consistent with additional aspects of the present disclosure.
Figure 4I:
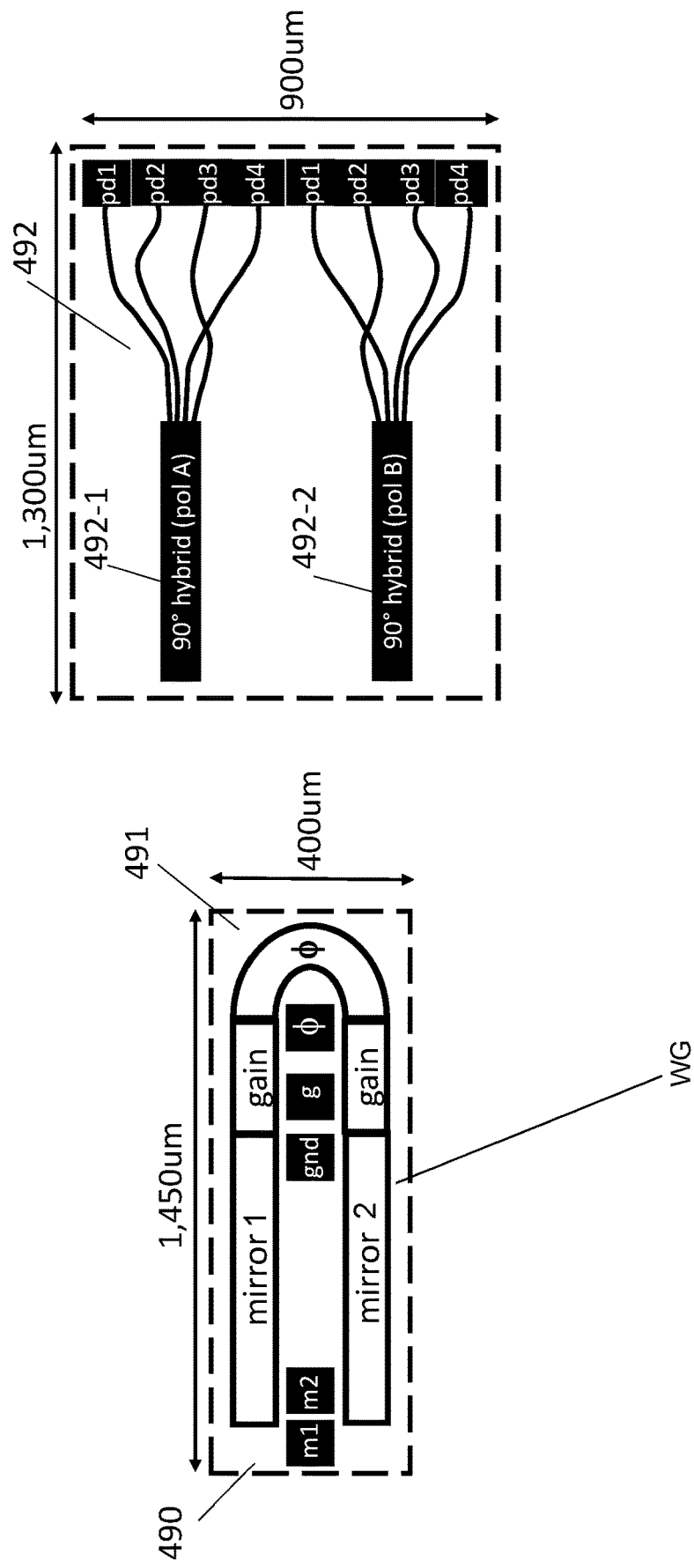

FIG. 4j illustrates circuit blocks 487 and 488 that may be used in a compact PIC design. Namely, circuit block 487 includes a CLET having an area of 1.26 mm2, and circuit block 488 includes a Mach-Zehnder circuit having a portion 487-1. The area of circuit block 488 is 3.48 mm2. Preferably, CLET block 487 has a staple shape that may be wrapped around or accommodated by portion 487-1 of Mach-Zehnder circuit 488. As a result, as shown in FIG. 4k, a single channel (one laser) Tx PIC 483 has the combined area of 3.78 mm2, which is less than the sum of the area of individual blocks 487 and 488 (4.74 mm2), as well as the area of the linear laser and Mach-Zehnder circuit show in FIG. 4h (8.505 mm2).

In operation, light output from the mirror of CLET 487 adjacent pad m2 is supplied to 1×4 splitters of Mach-Zehnder circuit 488, which of which provides a power split portion of the incoming light to a corresponding one of four phase adjustors. The outputs of the adjustors are next supplied to two MZ modulators, each having a pair of waveguide branches or arms underlying a respective one of RF (radio frequency) traveling wave electrodes (four electrodes total). The modulated optical signal output from each MZ waveguide branch is next supplied to a corresponding one of a four variable optical attenuators (VOAs) in order to power balance, for example, the light input to each VOA. The outputs of the four VOA outputs are supplied to a first 1×4 multi-mode interference coupler (MMI), and the combined output is supplied to a further VOA (pol VOA) for optional polarization rotation outside the PIC shown FIG. 4k. In a similar manner, light output from the mirror adjacent pad m1 is supplied to the same elements or devices noted above, but provided in the lower half of PIC 487, as shown in FIG. 4k. The resulting outputs are also provided outside the PIC for optional polarization rotation.

FIG. 4l illustrates circuit blocks 490 and 492 of a Receiver PIC. Circuit block 490 includes CLET laser 491 with a curved, bent or arcuate portion, which in this example, is phase or phase adjusting section ϕ, and circuit block 492, which includes optical hybrid multi-mode interference (MMIs) couplers (optical elements) 492-1 and 492-2 and sets of photodiodes PD1-PD4. As generally understood, a polarization multiplexed optical signal including both TE and TM polarization components are input to a coherent receiver including the Receiver PIC. The TM polarized light may be polarization rotated by a rotator (not shown) so that such TM polarization light has a TE polarization. The rotated light and the incoming TE component may be supplied to optical hybrids 492-1 to 492-2, respectively.

Figure 4M:
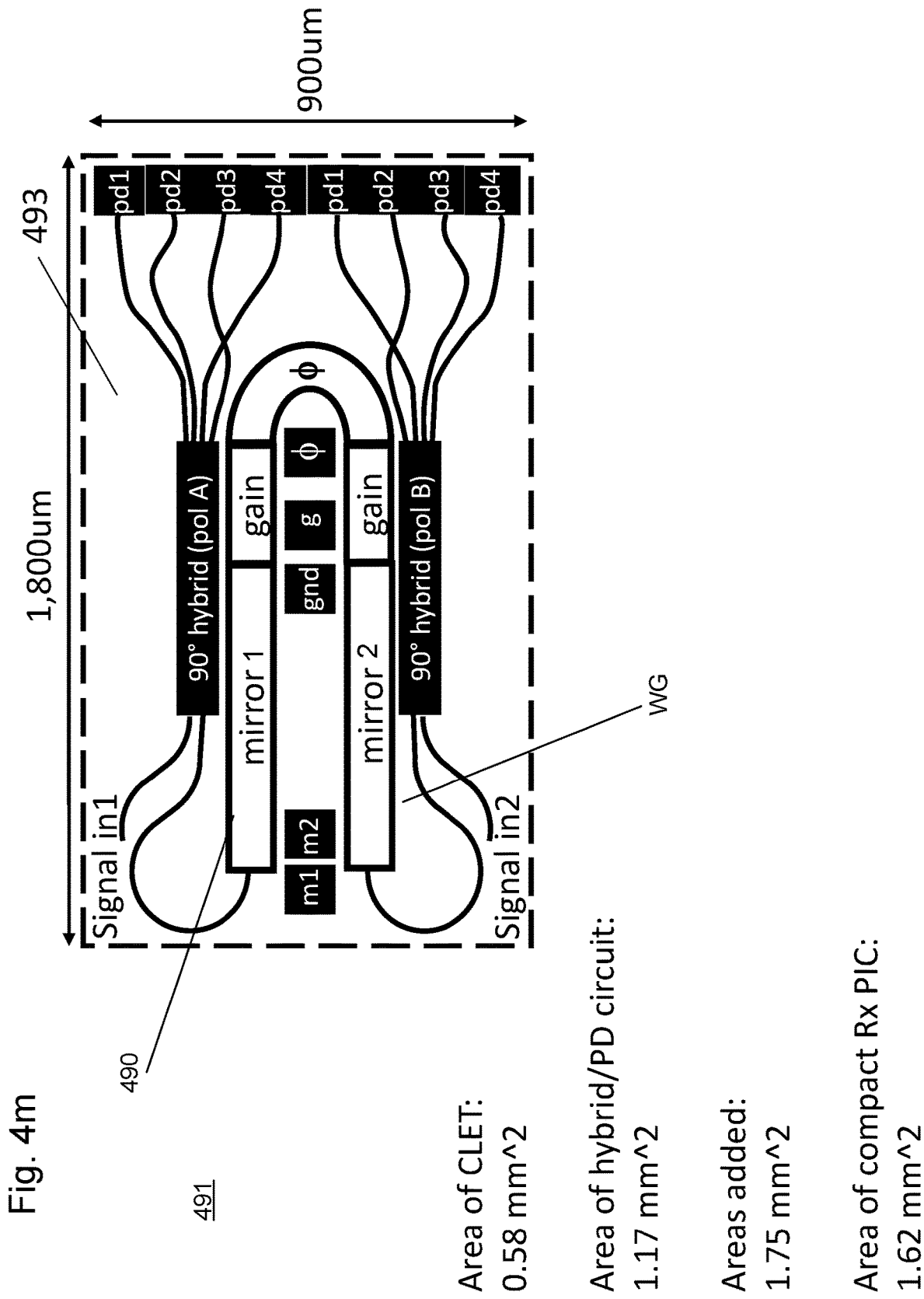

FIG. 4m illustrates circuit blocks 490 and 492 combined on the Receiver PIC 493, such that CLET 491 is provided between optical hybrids 492-1 and 492-2 to conserve chip real estate and realize a compact design. Namely, the dimensions of Rx PIC 493 are 1,800 um by 900 um and the area is 1.62 mm2, whereas the sum of the areas of the individual blocks 490 and 492 is 1.75 mm2.

Operation of FIG. 4m will next be described. As noted above, optical signals are modulated and polarization combined at the transmit end of an optical fiber link, for example, and are transmitted to a receive end where a polarization splitter, not shown, polarization demultiplexes the TE and TM polarization components of the transmitted signals. The TM polarization components are then polarization rotated to have a TE polarization and each TE optical signal is supplied as a respective one of signals in1 and in2. Signal in1 is supplied to 90 degree hybrid (pol A), and signal in2 is supplied to 90 degree hybrid (pol B). CLET 491 supplies first and second lights as a first and second local oscillator (LO) signals to 90 degree hybrids (pol A and pol B), respectively. The hybrids, in turn, mix the received LO with in1 and with in2 to generate eight optical outputs that are supplied to first and second banks of photodiodes, each bank including four photodiodes (labeled pd1 to pd4 in each bank in FIG. 4m). The photodiodes may constitute portions of balanced photodetectors that provide electrical signals that are further processed to recover the received data.

Figure 4N:
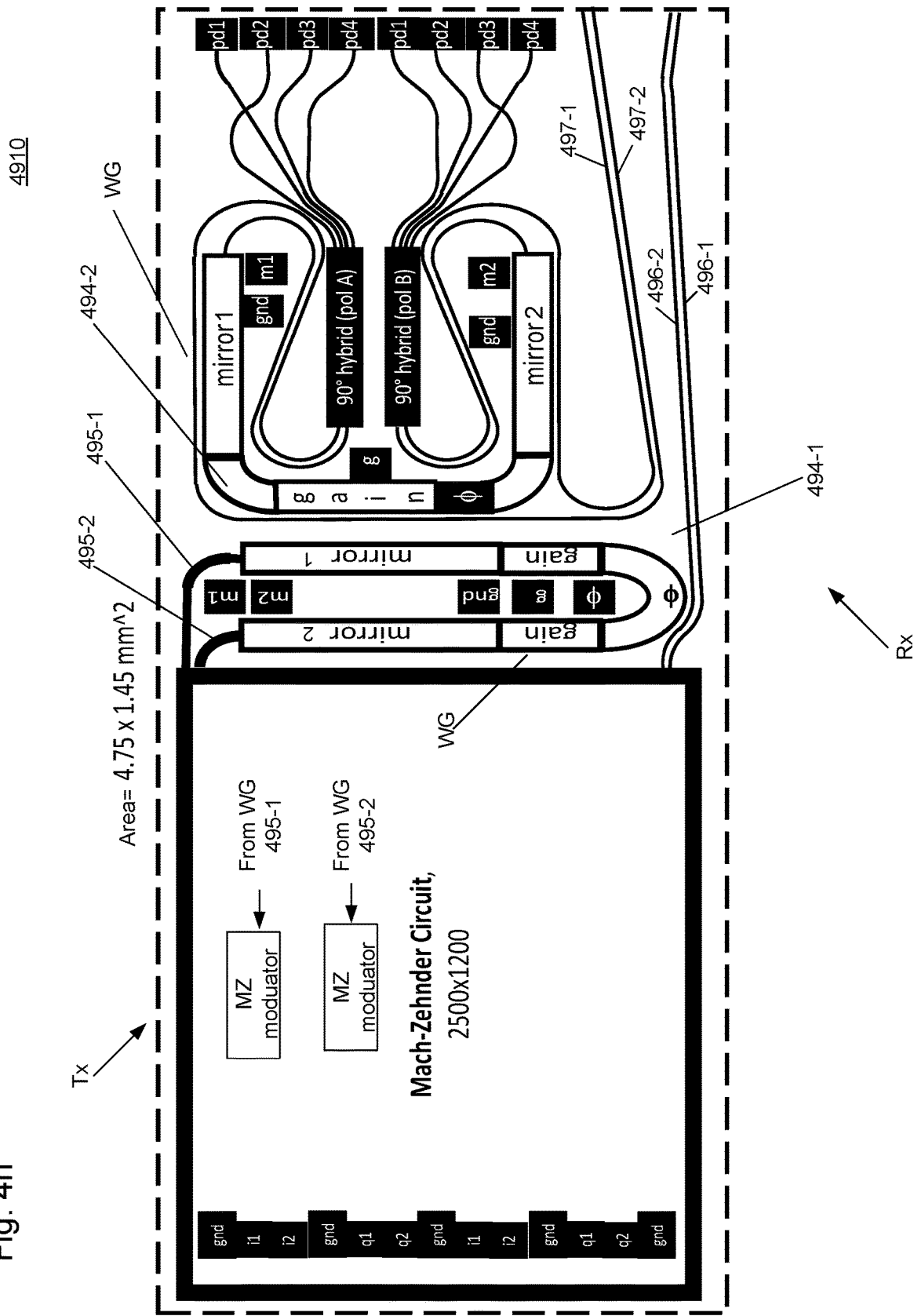
Figure 4O:
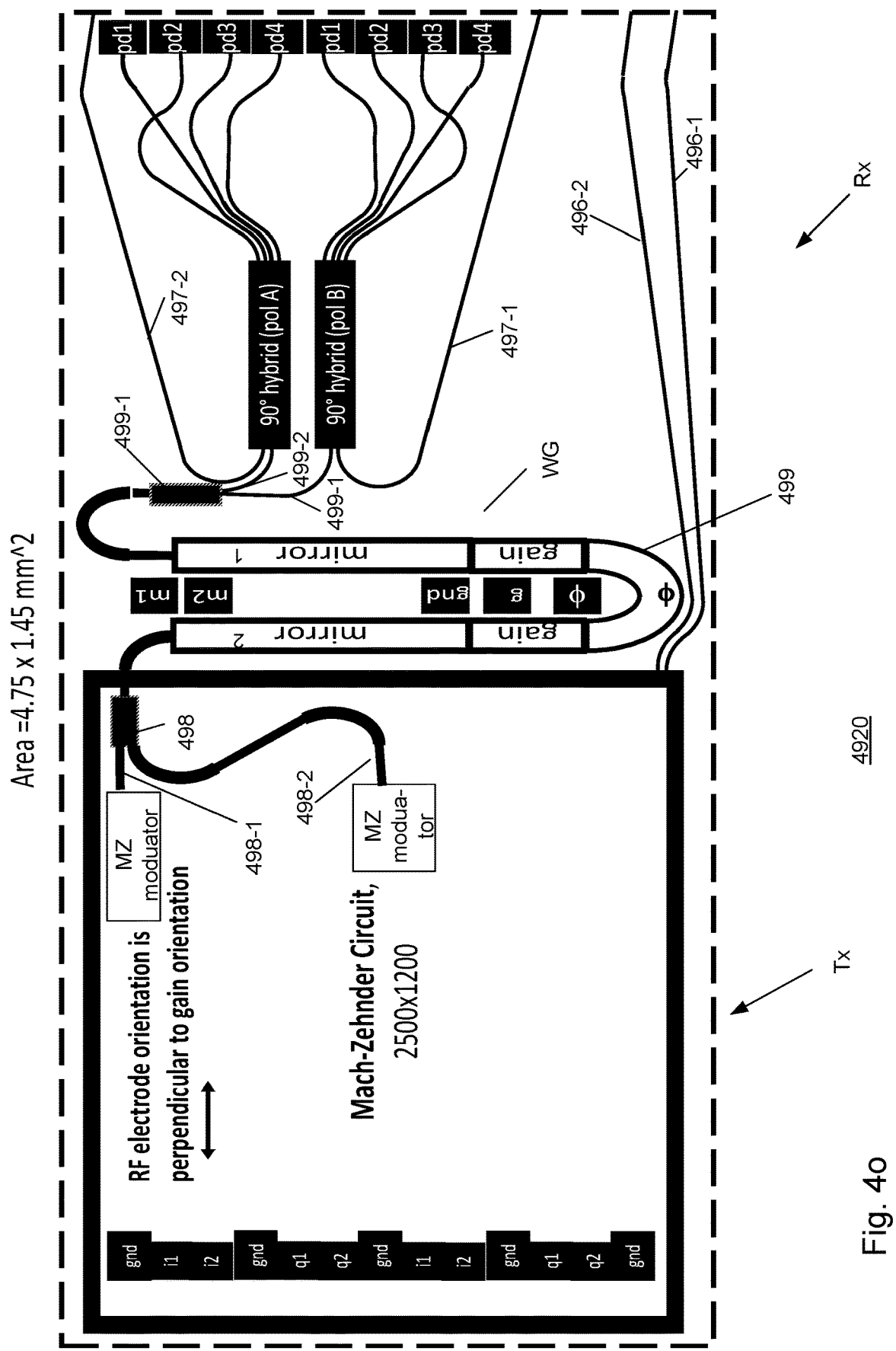

FIGS. 4n and 4o illustrate examples of transceiver PICs including CLETs consistent with the present disclosure. In FIG. 4n, the transceiver PIC includes first and second CLETs 494-1 and 494-2, each of which having a curved or bent portion, such as phase section ϕ of waveguide WG. CLET 494-1 is associated with the transmit (Tx) section of the transceiver PIC and supplies first and second lights from respective mirror sections to corresponding waveguides 495-1 and 495-2. Waveguides 495-1 and 495-2, in turn, supply light to corresponding Mach-Zehnder modulators in the Mach-Zehnder circuit. Modulated light or optical signals output from the Mach-Zehnder circuit is supplied on waveguides 496-1 and 496-2.

Preferably, the gain section of waveguides WG in both the Rx and Tx sections should be defined on the same, preferred crystal axis for wet-etch-defined, ridge waveguiding. In this case, the laser axis requirement forces a different type of laser for the Rx section. Differences in Rx and Tx pitch, i.e., the distance between Rx devices and the distance between Tx devices, may lead to wasted space on the chip. Other requirements such as minimizing the size of CLETs and location of high-speed pads and devices at particular edges of the chip influence layout optimization of the PIC.

Also, the gain section of the laser and semiconductor optical amplifiers (SOAs discussed below) will typically be oriented on a preferred crystal axis so that a wet chemical etch may form substantially vertical sidewalls to define a ridge, with the etch stopping on a quaternary layer (e.g. GaInAsP). Mach-Zehnder phase elements operated with a reverse bias (e.g. phase adjustors, and RF modulators) are typically (but not exclusively) oriented orthogonal to the axis preferred for lasers and SOAs because the tuning efficiency may be twice compared to the "preferred gain" axis.

As further shown in FIG. 4n, CLET 494-2 operates as a local oscillator laser and is associated with the receiver (Rx) portion of the transceiver PIC 4910. The Rx portion receives optical inputs on waveguides 497-1 and 497-2, which are supplied to optical hybrid (pol B) and optical hybrid (pol A), respectively. In this example, CLET 494-2 wraps around optical hybrids pol A and pol B to realize a compact design.

In the above example and as noted above, each CLET includes a waveguide that includes the mirror, gain, and phase (ϕ) sections. In each of these CLETs, the waveguide has a bent or curved portion, so that the CLET is also bent or curved to achieve a compact design. Bonding pads, represented as darkened squares and rectangles labeled, ϕ (for phase control), g (for gain), m1 and m2 (for mirrors) are provided to provide electrical signal to tune or adjust each of these waveguide sections to achieve an optical signal with the desired wavelength and power. Bonding pads m1 and m2 provided current, for example, for tuning mirror 1 and mirror 2, respectively, in each of the figures herein.

FIG. 4o illustrates another example of a transceiver PIC 4920 including Tx and Rx sections. Here, CLET 499 is provided having a first output or waveguide that extends from a first mirror to a first splitter 498 and a second output or waveguide that extends from a second mirror to a second splitter 499. First splitter 498 has first and second outputs 498-1 and 498-2 that supply optical outputs to corresponding Mach-Zehnder modulators in the Mach-Zehnder circuit, and second splitter 499 has first and second output waveguides that provide optical outputs to hybrid (pol A) and hybrid (pol B), respectively. Hybrid (pol A) also receives incoming light carrying data on waveguide 497-1, and hybrid (pol B) receives incoming light carrying data on waveguide 497-2.

In this example, the RF bias electrodes, such as the electrodes labeled gnd (ground), and RF electrodes (i1 (in-phase signal), i2 (in-phase signal), q1 (quadrature signal), q2 (quadrature signal) for driving the MZ circuit) can easily be configured perpendicular to the gain sections. Separate CLETs may be preferably deployed for each channel in a transceiver (as in FIGS. 4n and 4o) in order to provide higher power to each of the transmitter and receiver and/or to minimize optical feedback from the transmitter elements and/or receiver elements to the laser. Specifically, a separate CLET may be preferred in a transceiver PIC to minimize the optical feedback from the transmitter circuit to the CLET for the receiver local oscillator signal (which generally requires reduced linewidth and/or phase noise compared to the transmitter). In the case of the shared CLET (FIG. 4n), the output power of the CLET may be asymmetrical to account for the different power requirements in the transmitter versus receiver part of the circuit (where the transmitter often requires higher power). In addition, in any transmitter PIC or part of a PIC, if light is taken from both sides of the CLET for each polarization, the output may be unbalanced to account for differing loss and/or gain in the different polarizations of the circuit.

In the example shown in FIG. 4o, one CLET supplies first light to the Mach-Zehnder modulator circuit on waveguides 498-1 and 498-2, as well as second light (local oscillator light) that is provided to optical hybrids (pol A) and (pol B).

In the above example, the CLET has a staple-shaped configuration in which the phase section of the CLET waveguide is curved. Additional CLET configurations will now be described consistent with further aspects of the present disclosure. PICs disclosed herein may include multiple CLETs as noted above or one CLET. In addition, the CLETs disclosed herein may be provided as a discrete device or a single device on a substrate or as multiple device provided in an array, as shown, for example, in FIG. 4b.

Figure 4P:
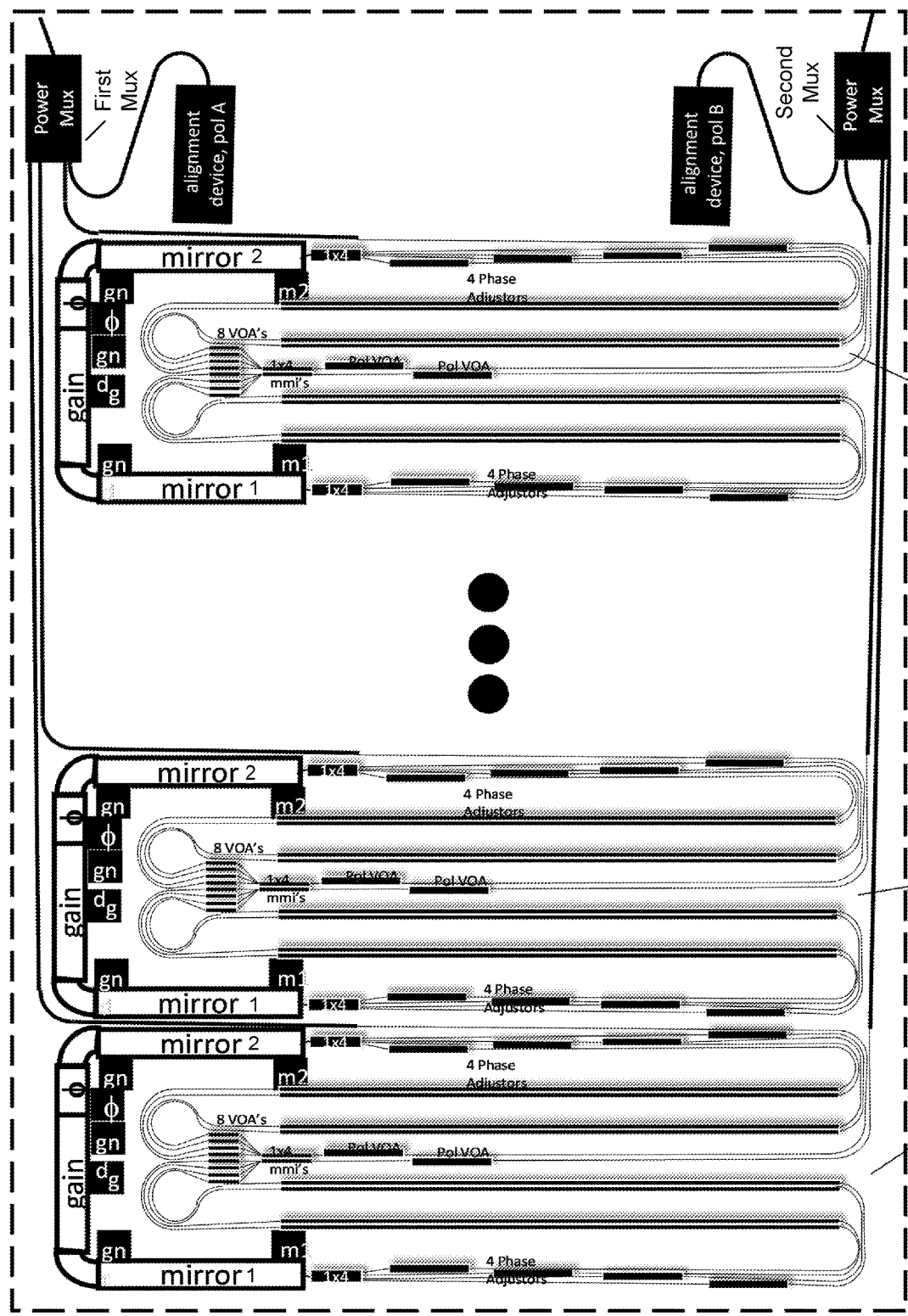

Briefly returning to FIG. 4k, Tx PIC 483 shown in this figure includes one laser. As shown in FIG. 4p, however, multiple Tx circuits having the same or similar construction as that show in FIG. 4k may be integrated as a TxPIC on substrate 440-1 including InP, for example. Namely, multiple circuits 483-1 to 483-n may be may be provided on a common substrate 440-1. Each circuit outputs pairs of optical signals operates as in a manner similar to that of TxPIC 483, such that each circuit 483-1 to 483-n supplies optical signal pairs having the same wavelengths, such as optical signals TEλ1 and TEλ1' noted above. One output from each circuit 483-1 to 483-n is supplied to a first power multiplexer (First Mux) or combiner and the combined optical signals from the first power mux may be subject to optional polarization rotation. Similarly, the other outputs from Tx circuits 483-1 to 483-n is supplied to a second power multiplexer (Second Mux) or combiner and the combined optical signals from the second power mux may also be subject to optional polarization rotation. As noted above, one set of combined optical signals may be polarization rotated to have a TM polarization which the other set retains a TE polarization.

In addition, compact, n-channel, the TX PICs noted above are shown using CLETs to minimize chip size and propagation lengths of optical signal. These PICs also features optional fiber/free space optics alignment devices shown in FIG. 4p that may be light sources (LEDs, lasers, etc.) or photodetectors. The power muxes or multiplexer may be a single MMI or a cascade of MMIs with the same functionality. The splitting ratio of the cascade of MMIs may be tailored to balance overall coupled power of the optical signals. Relatively long RF electrodes may be orthogonal to the gain sections of the CLETs for phase tuning efficiency and processing compatibility, respectively. See, for example, U.S. Pat. No. 8,260,094 titled "Photonic Integrated Circuit Employing Optical Devices On Different Crystal Directions," the entire content of which is incorporated herein by reference.

Further, compact coherent Tx PICs may be designed in which both ends of a laser are routed +/−90 deg so that the substantially equally-powered outputs are facing the same direction and connected to IQ modulator circuits. In addition, the laser gain elements may be arranged with respect to the crystal axis in order to allow for wet chemically-etched defined, substantially vertical-walled ridge waveguide gain sections while the RF modulator elements and substantial portions and/or entire lengths of the phase adjustors and are oriented orthogonally to the gain sections in order to maximize reverse-biased phase tuning efficiency with a minimum element length, which may improve modulation speed of RF modulators that have junction capacitances that would otherwise limit the modulation speed and also result in more compact PICs.

Figure 4Q:
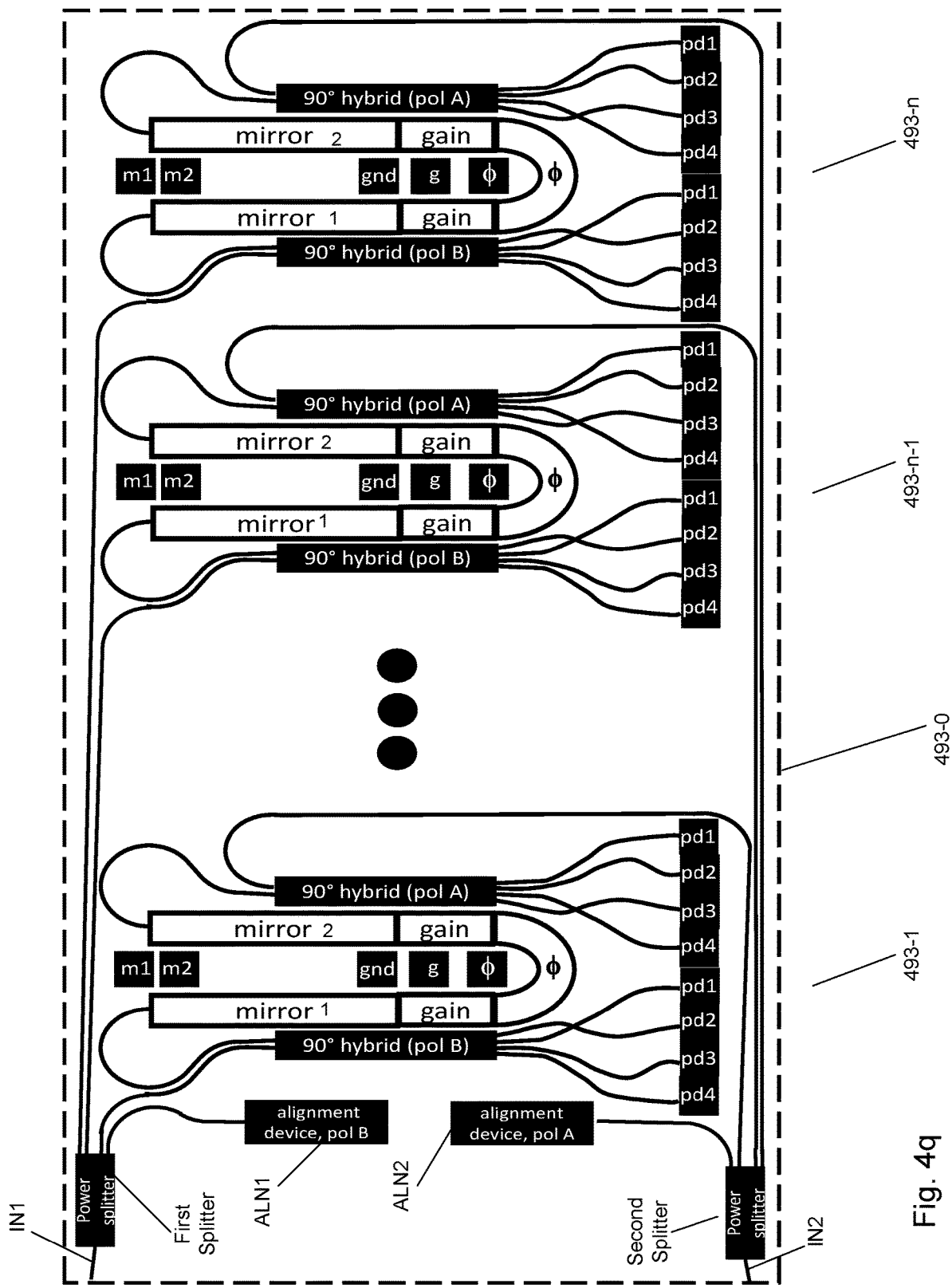

In FIG. 4q, multiple circuits 493-1 to 493-n, each having the same or similar construction as Rx PIC 493 may be provided on a common substrate 493-0 including InP, for example. A first plurality of incoming TE polarized optical signals may be supplied to a first power splitter (First Splitter) and a second plurality of TE polarized optical signal may be supplied to a second power splitter (Second Splitter). The second plurality of TE polarized optical signal having been polarization rotated.

The first power splitter supplies power split first portions of each first TE optical signal to each 90 degree optical hybrid (pol A) in each circuit 493-1 to 493-n, and the second power splitter supplies power split second portions of each second TE optical signal to each of 90 degree optical hybrid (pol B) in each circuit 493-1 to 493-n. Each circuit 493-1 to 493-n further includes a CLET that outputs LO light having a wavelength corresponding to the particular wavelength of one of the first and second TE optical signals. The LO and incoming signal lights are mixed in the optical hybrids and supplied to banks of photodiodes, each including photodiodes pd1 to pd4, as noted above. The photodiodes, in turn, generate corresponding electrical signals that are subject to known processing.

In addition, CLETs employed in the PIC shown in FIG. 4p may minimize chip size, propagation lengths, and thermal cross-talk of the mirrors. The PIC may also include optional fiber/free space optics alignment devices that may be light sources (LEDs, lasers, etc.) or photodetectors. The power splitters (First Splitter and Second Splitter in FIG. 4q) may be a single multimode interference coupler (MMI) or a cascade of MMIs with the same functionality. The power splitting ratio of the cascade of MMIs may be tailored to balance overall signal response at the photodetectors.

Further, it may be desirable to use different-geometry CLETs and other light sources on a particular PIC to minimize chip size and for optimum performance. Light output power, SMSR (Side Mode Suppression Ratio), linewidth, thermal power dissipation, compactness, cost, control element count or convenience and other factors contribute to defining optimum PIC layouts. Accordingly, one type of CLET or conventional tunable laser may be used as light sources on transmitter circuits, another type of CLET or tunable laser may be used for local oscillator sources on receiver circuits, and still more conventional DFBs, DBR lasers, or other light sources may be used for alignment of the PIC to external optical fibers, free space optics, wafer- and chip-scale testing.

In addition, as further shown in FIG. 4q, alignment lasers (ALN1 and ALN2) may optionally be provided that output light to the first and second power splitters, respectively. The ALN output light may then be monitored at corresponding ports IN1 and IN2 to insure proper alignment of optical fibers or free space optics (FSO) to these ports. For example, the alignment light output from ALN1 may be monitored as an output through an optical fiber that is connected to port IN1. When properly aligned, the light output from ALN1 may be sensed at maximum intensity or power compared to when the optical fiber is off-center. Consistent with a further aspect of the present disclosure, CLET lasers may be arranged in two-dimensional arrays to achieve desired compactness, chip aspect ratio, minimized routing length, minimized waveguide crossings and other design goals. An example of such a two-dimensional array will next be described in connection with FIG. 4r. Here, first optical outputs, each of which being supplied from a corresponding CLET, are combined with a first multiplexer or coupler, and second optical outputs, each of which being supplied from a respective CLET are combined with a second multiplexer or coupler. The combined first optical signals and the combined second optical signals may then be supplied from the same side of the semiconductor substrate or chip.

Figure 4R:
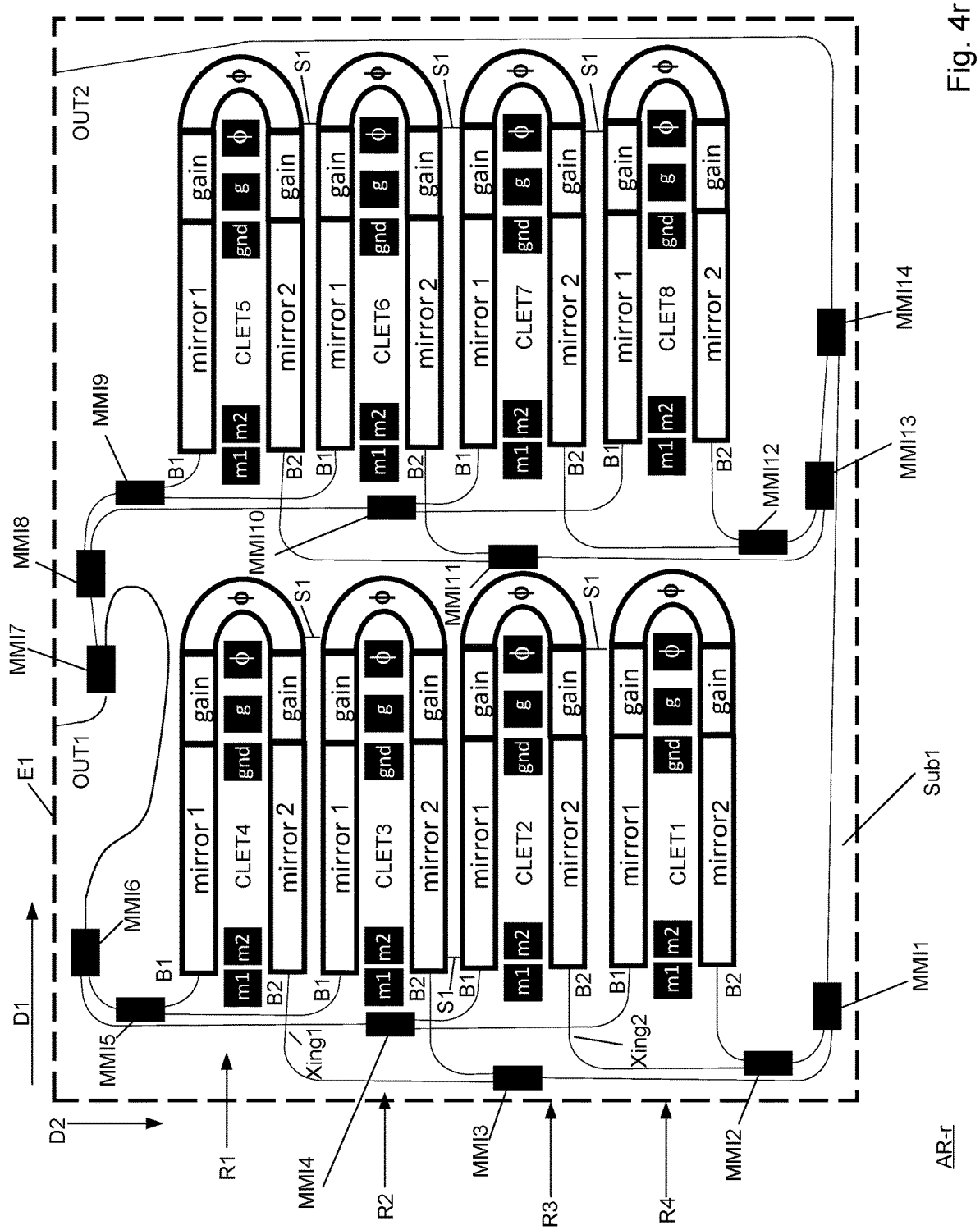

Namely, in the example shown in FIG. 4r, CLETs 1-8 are arranged in a two-dimensional array AR-r that extends in first (D1) and second (D2) directions. In addition, array AR-r includes rows of CLETs R1 to R4, such that row R1 includes CLETs 4 and 5, row R2 includes CLETs 3 and 6, row R3 includes CLETs 2 and 7, and row R4 includes CLETs 1 and 8. Multiple MMI couplers or other combiners or couplers may be cascaded, as described below, to combine or multiplex the optical outputs of each of CLETs 1-8. In particular, optical outputs from branches B1 of CLETs 3 and 4 are combined with MMI coupler MMI5, and optical outputs from branches B1 of CLETs 1 and 2 are combined with MMI coupler MMI4. The outputs of MMIs 4 and 5 are further combined with MMI coupler MMI6. In a similar manner, the outputs from branches B1 of CLETs 5 and 6 are combined with MMI coupler MM9, and optical signal output from branches B1 of CLETs 7 and 8 are combined with coupler MMI10. The outputs of couplers MMI9 and 10 are combined with coupler MMI8. Coupler MMI7 combines the outputs of MMI8 and MMI6 to combine all the outputs from branches B1 of CLETs 1-8. The arrangement of MMI couplers MMI4-10 may be referred to as a cascaded arrangement.

As further shown in FIG. 4r, MMI couplers MMI1-3, and MMI11-14 may be cascaded to combine the outputs of branches B2 of each CLETs 1-8 provide a combined optical output OUT2. Combined outputs OUT1 and OUT2, which are supplied from corresponding waveguides, may be provided from the same side or edge E1 of substrate Sub1. Alternatively, OUT1 and OUT2 may be supplied from different sides of substrate Sub1.

In addition, in the example shown in FIG. 4r, the spacing or distance between each CLET is uniform and is shown as spacing S1. Advantageously, in the example shown in FIG. 4r, no more than two waveguide crossings, such as Xing1 and Xing2, are required close to the CLET outputs. Accordingly, a shorter maximum optical routing length, i.e., the maximum optical path length from CLET output to OUT1 or OUT2, is achieved with minimal feedback to the CLET. Note that in FIG. 4r as well as FIGS. 4h-4x, solid lines connecting CLETs and other devices correspond to waveguides carrying light from the CLETs to such other devices.

As noted above, CLETs may be uniformly spaced from one another in a two-dimensional array. Consistent with another aspect of the present disclosure, however, CLETs the spacing between adjacent CLETs may be non-uniform. For example, as shown in FIG. 4s, two-dimensional array AR-s is similar to array AR-r, but includes CLETs 1-7, such that spacing S2 between CLETs 1 and 2 is different than spacing S1 between remaining CLETs 2-7.

Figure 4S:
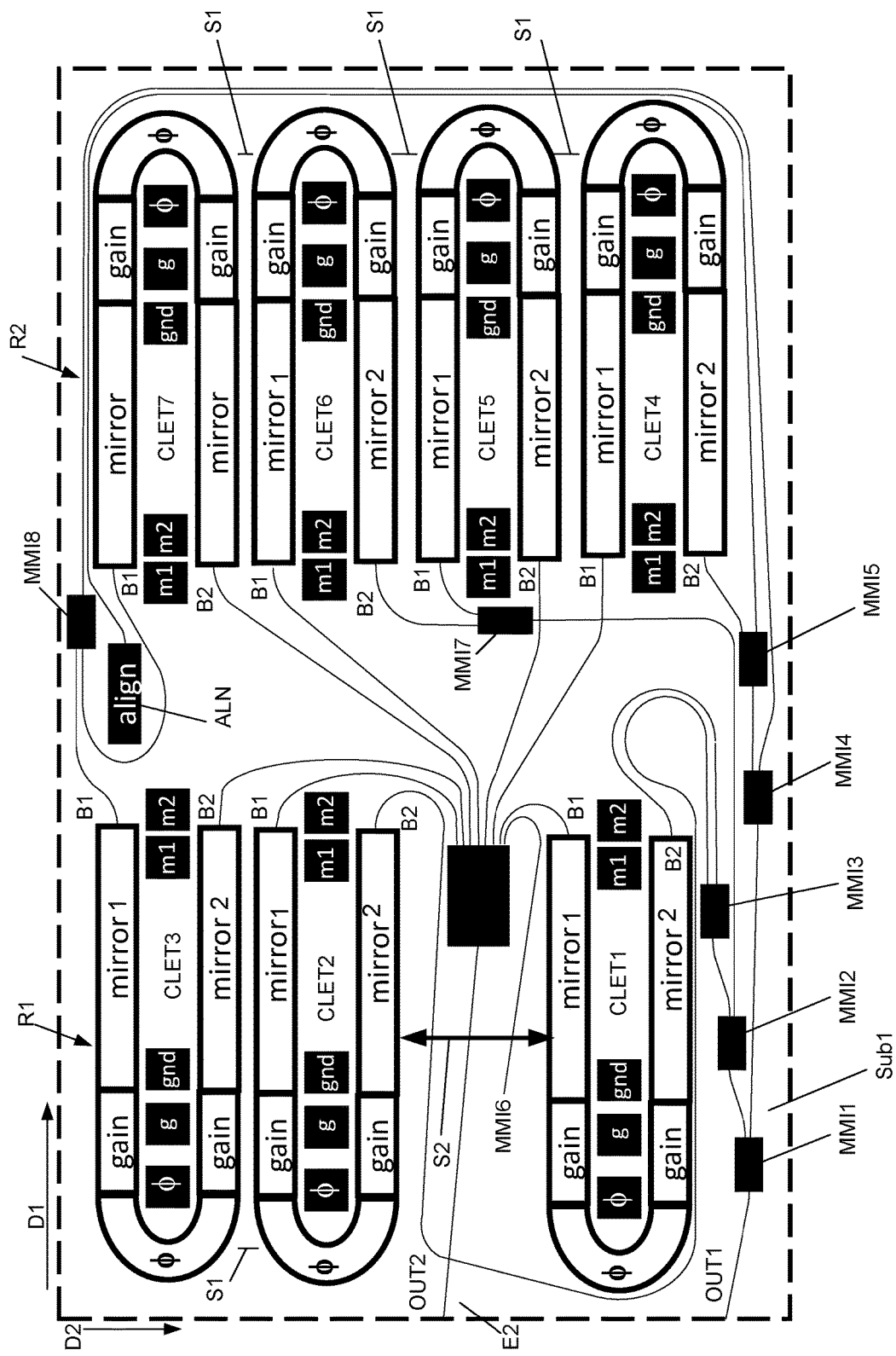

As further shown in FIG. 4s, outputs from branches B1 and B2 may be combined through cascaded MMI couplers MMI1-5, MMI7, and MMI8. Other outputs, such as outputs from branches B2 of CLETs 2, 3, 5, and 7, as well as outputs for branches B1 of CLETs 1, 4, and 6 may be combined in one MMI coupler, such as MMI6. Spacing S2 between CLETs 1 and 2 may provide a larger area to accommodate coupler MMI6, such that fewer couplers or combiners are required and the size of substrate Sub1 can be minimized. Further, the combined outputs OUT1 (from MMI1) and OUT2 (from MMI6) may be provided at the same side or edge E2 of substrate Sub1. Alternatively, OUT1 and OUT2 may be supplied from different sides of substrate Sub1.

Thus, non-uniformly spaced CLETs arranged in two-dimensional arrays provides greater design flexibility so that smaller chips with convenient access to output waveguides on any desired location on the substrate can be realized. As further shown in FIG. 4s, an alignment laser ALN may provide light to cascaded MMI couplers MMI4 and MMI1, which in turn combine the ALN output with light from CLETs 1-7 and supply the combined light as OUT1. The ALN output may then be monitored to properly align an optical fiber or free space optics (FSO) in a manner similar to that described with respect to FIG. 4q. Alignment light may also be included in OUT2 for similar monitoring and alignment purposes.

Figure 4T:
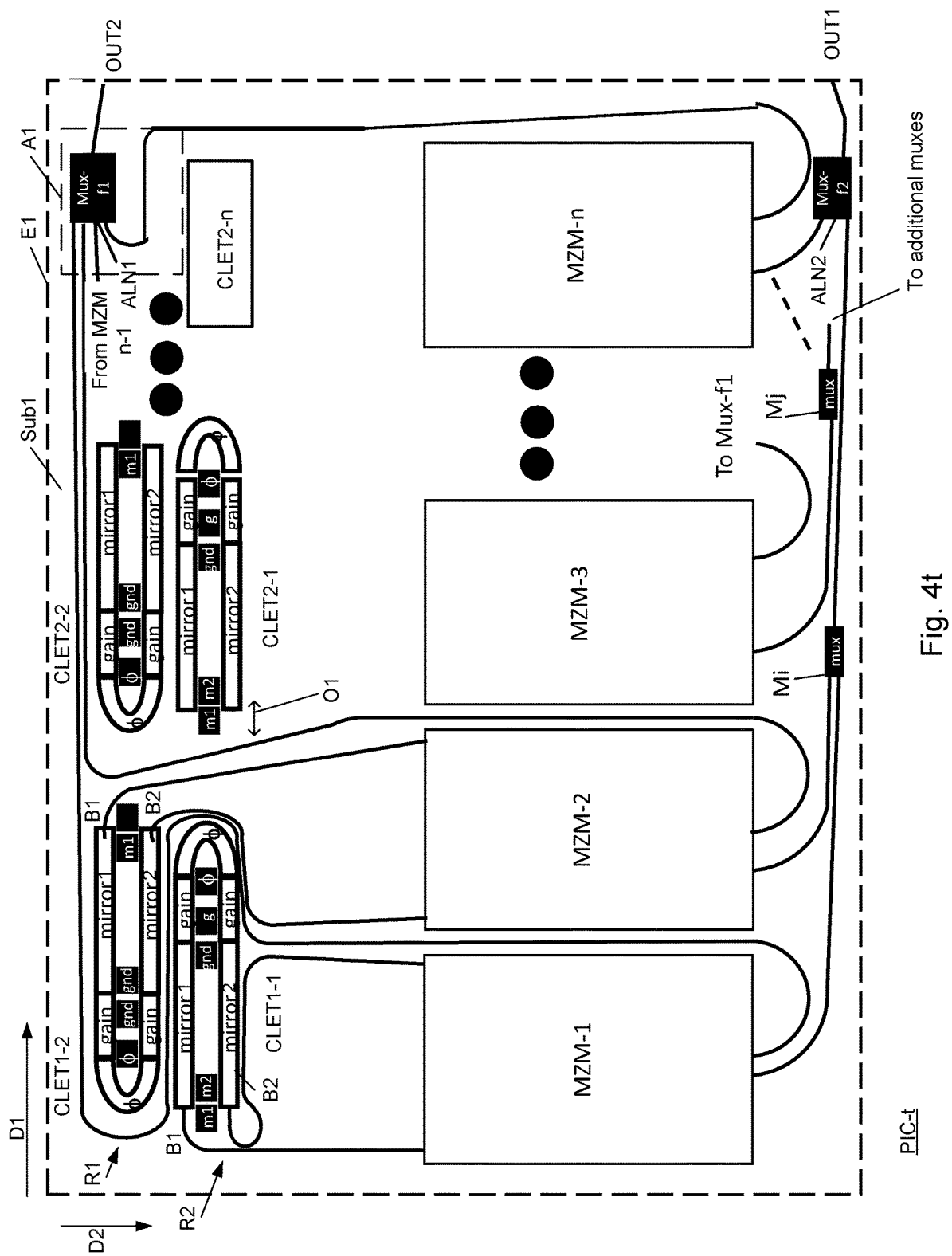

FIG. 4t shows an example of a transmission (Tx) photonic integrated circuit (PIC-t) including a two-dimensional array of CLETs (CLET1-1, CLET1-2, CLET2-1, CLET2-2 . . . ) extending in directions D1 and D2 and Mach-Zehnder modulator circuits MZM-1 to MZM-n, each of which having the same or similar structure as Mach-Zehnder circuit 488. The array (two-dimensional array) of CLETs includes a first row R1 of CLETs (CLET1-2, CLET2-2 . . . ) and a second row 2 of CLETs (CLET1-1, CLET1-2 . . . ). Output pairs from branches B1 and B2 of each CLET are supplied to a corresponding one of MZM-1 to MZM-n.

As further shown in FIG. 4t, a first output from each of circuits MZM-1 to MZM-n is supplied to a respective one of cascaded multiplexers Mi, Mj . . . , which, in turn feed optical signal a final stage multiplexer Mux-f2. Mux-f2 supplies the combined first outputs of each of MZM-1 to MZM-n as OUT2. Second outputs from each of MZM-1 to MZM-n may be supplied to one multiplexer Mux-f1 instead of a cascade of multiplexers. Mux-f1 may be larger than each of the cascaded multiplexer, but the overall space or chip real estate occupied by Mux-f1 is less than that occupied collectively by the cascaded multiplexer. In order to accommodate Mux-f1 near the CLETs, the CLETs of row R1 may be shifted from the CLETs of row R2 by varying offset amounts along the length of each row. Thus, for example, no offset is shown between CLET1-2 of row R1 and CLET1-1 of row R2. The CLETs of the next CLET pair (CLET2-1 and CLET2-2) are offset by an amount or distance O1. CLETs in subsequent pairs along the length of rows R1 and R2 may also be offset from another by increasing distances, so that at the end of row R1, for example, a space A1 is provided between CLET2-n and edge E1 of substrate Sub1.

Thus, in the above example shown in FIG. 4t, if there are many channels and some space on the chip is required for functionality other than modulation (such as power combining and fiber alignment), the CLETs be arranged in groups on the MZ pitch or on an irregular spacing as appropriate to accommodate devices that provide such functionality.

Moreover, as further shown in FIG. 4t, the width of the each CLET is different than the width of each of MZM-1 to MZM-n. Accordingly, a two-dimensional array of CLETs including rows R1 and R2 may be employed to reduce chip real estate.

Alignment lasers, similar to or the same as those discussed above in regard FIGS. 4q and 4s may optionally be provided in the example shown in FIG. 4t. Specifically, first and second alignment lasers (not shown) may provide alignment light ALN1 and ALN2 to multiplexers Mux-f1 and Mux-2, respectively, for monitoring and alignment purposes at outputs OUT1 and OU2 in a manner similar to that described above in connection with FIGS. 4q and 4s.

Further, the pitch or spacing between adjacent MZMs may the same as the spacing or pitch between adjacent CLETs in a given row, for example, in FIG. 4t. Alternatively, the spacing may be different. In addition, each of the MZM in FIG. 4t may be replaced by an optical hybrid circuit, such that adjacent optical hybrids may be spaced from one another by the same pitch or spacing as the CLETs in a given row or by a different spacing.

FIGS. 4u and 4v show alternative embodiments in which a one dimensional array (AR-u in FIG. 4u and AR-v in FIG. 4v) of five CLETs (CLET1-5), for example, in which each CLET has two output waveguides WG1 and WG2 (waveguide pairs) corresponding to outputs from branches B1 and B2, respectively, of each CLET. In FIG. 4u, each output waveguide outputs light to the same side or facet F1 of substrate Sub1, and each waveguide (WG1, WG2 ) in each pair is uniformly spaced from one another. Alternatively, the spacing between one pair of waveguides (WG1, WG2 ) may be different than the spacing between another pair of waveguides, such that a spacing between a first pair and a second pair is different than a spacing between a third pair and a fourth pair of the waveguides (WG1, WG2 ). In addition, each waveguide is oriented normal or at 90 degrees to facet F1. Moreover, the CLETs are provided on the same pitch, i.e., each CLET1-5 is uniformly spaced from one another by a spacing S1. In another embodiment, spacings S1 may be different from one another.

In FIG. 4v, waveguides WG1 and WG2 (waveguide pair) of each CLET are skewed relative to the facet such that each waveguide is oriented at an angle other than 90 degrees. The waveguides, however, in this example, are paired on the same pitch.

Figure 4W:
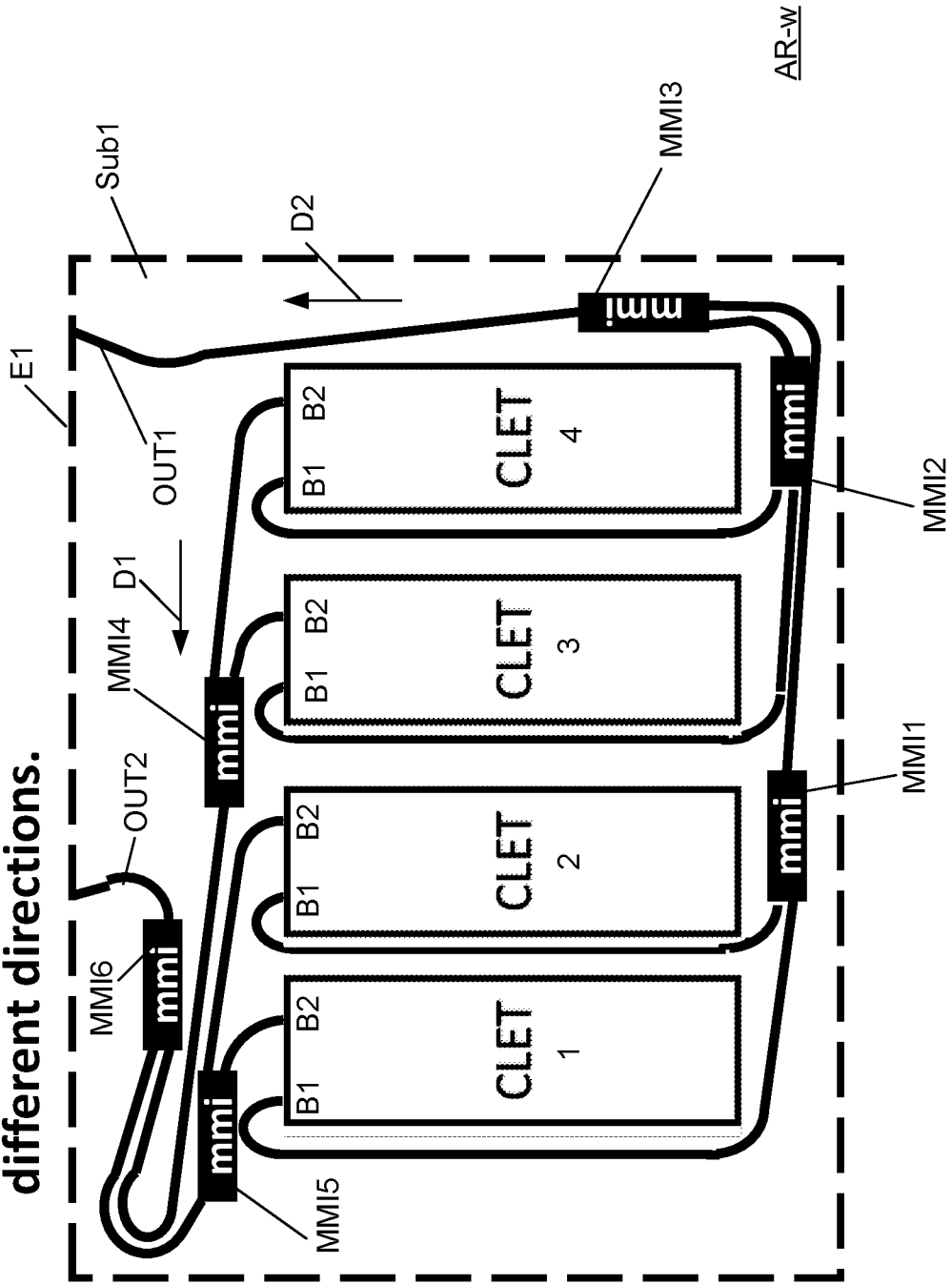

FIG. 4w illustrates an example of a laser array, AR-w, in which the optical outputs are directed in different directions, such as directions D1 and D2. In a manner similar to that described above, cascaded multimode interference couplers MMI1 to MMI3 combine optical signals output from branches B1 of each of CLETs 1 to 4 to provide output OUT1. Further, cascaded multimode interference couplers MMI4 to MMI6 combine optical signals output from branches B2 of each of CLETs 1 to 4 to provide output OUT2.

In FIG. 4w, OUT1 and OUT2 are provided along the same side, E1, of substrate Sub1. It is understood, however, that OUT1 and OUT2 may be provided at different sides of substrate Sub1.

Figure 4X:
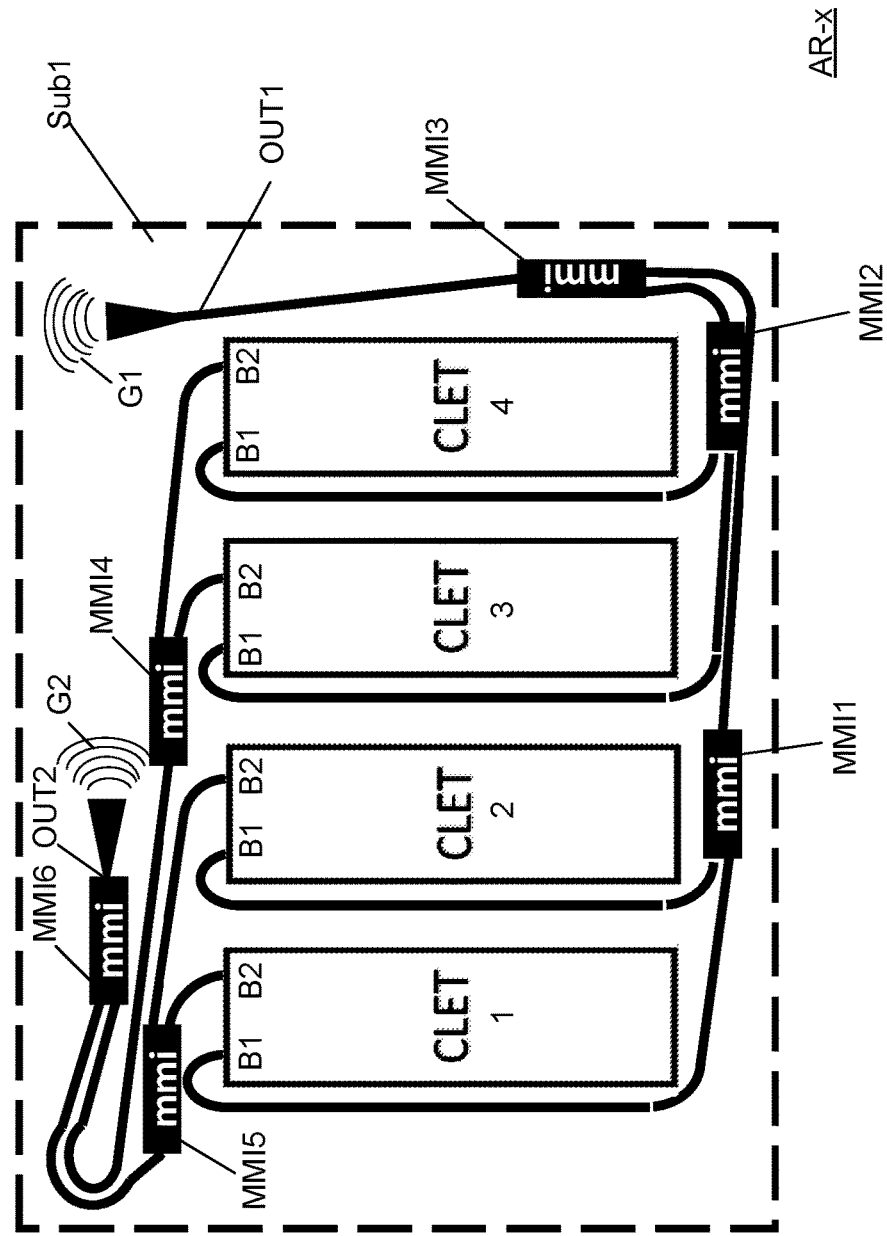

FIG. 4x shows array AR-x that is similar to array AR-w, however, instead of supplying OUT1 and OUT2 at the edge of substrate Sub1, these combined optical signals are output either normal or skew to the surface of Sub1 by grating couplers G1 and G2, respectively. Alternatively, gratings G1 and G2 may be replaced by total internal reflection (TIR) mirrors.

Figure 4Y:
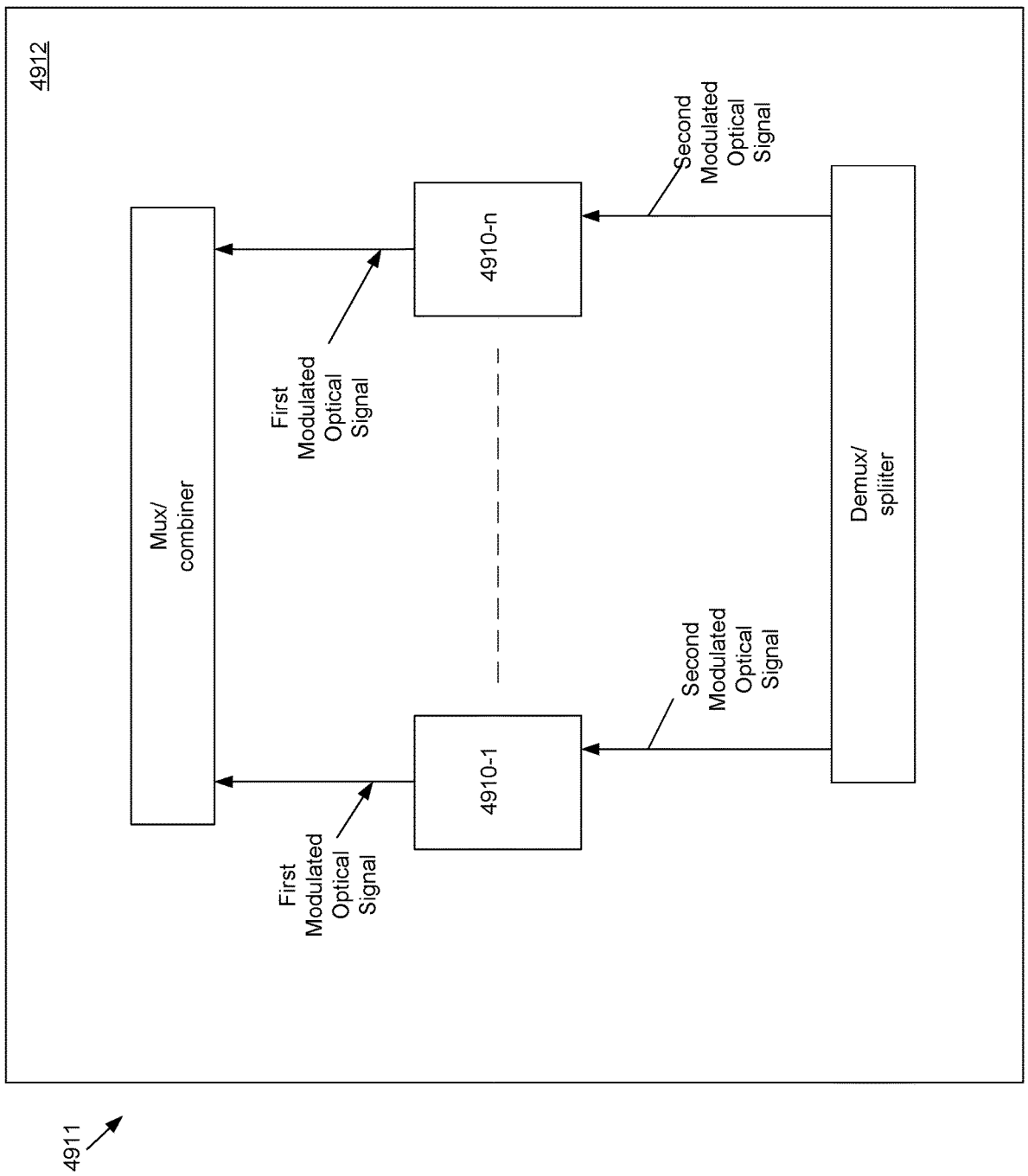

FIG. 4y illustrates an example of a transceiver PIC 4911, which may include transceiver circuits 4910-1 to 4910-$n$ provided on substrate 4912. Each of transceiver circuits 4910-1 to 4910-$n$ may have the same or similar structure as transceiver PIC 4910 described above in connection with FIG. 4n. Namely, each of transceiver PICs 4910-1 to 4910-$n$ (n being an integer) outputs a corresponding one of first modulated optical signals, each having a corresponding one of a plurality of wavelengths, $\lambda 1$ to $\lambda n$. Each of the first modulated optical signals is generated in a manner similar to that of the modulated optical signal output from transceiver PIC 4910 in FIG. 4n. Each first modulated optical signal may be supplied to a multiplexer or power combiner for output to an optical fiber.

As further shown in FIG. 4y, each of transceiver PICs 4910-1 to 4910-$n$ further receives a corresponding one of second modulated optical signals, which may be supplied as a power split portion of an incoming WDM signal output from a splitter. Alternatively, if a demultiplexer is provided, each of the second modulated optical signals may have a corresponding one of wavelengths $\lambda 1$ to $\lambda n$. Each of the received second modulated optical signals is mixed with a local oscillator signal and detected in a corresponding one of transceiver PICs 4910-1 to 4910-$n$ in a manner similar to that described above with reference to PIC 4910 shown in FIG. 4n.

Figure 4Z:
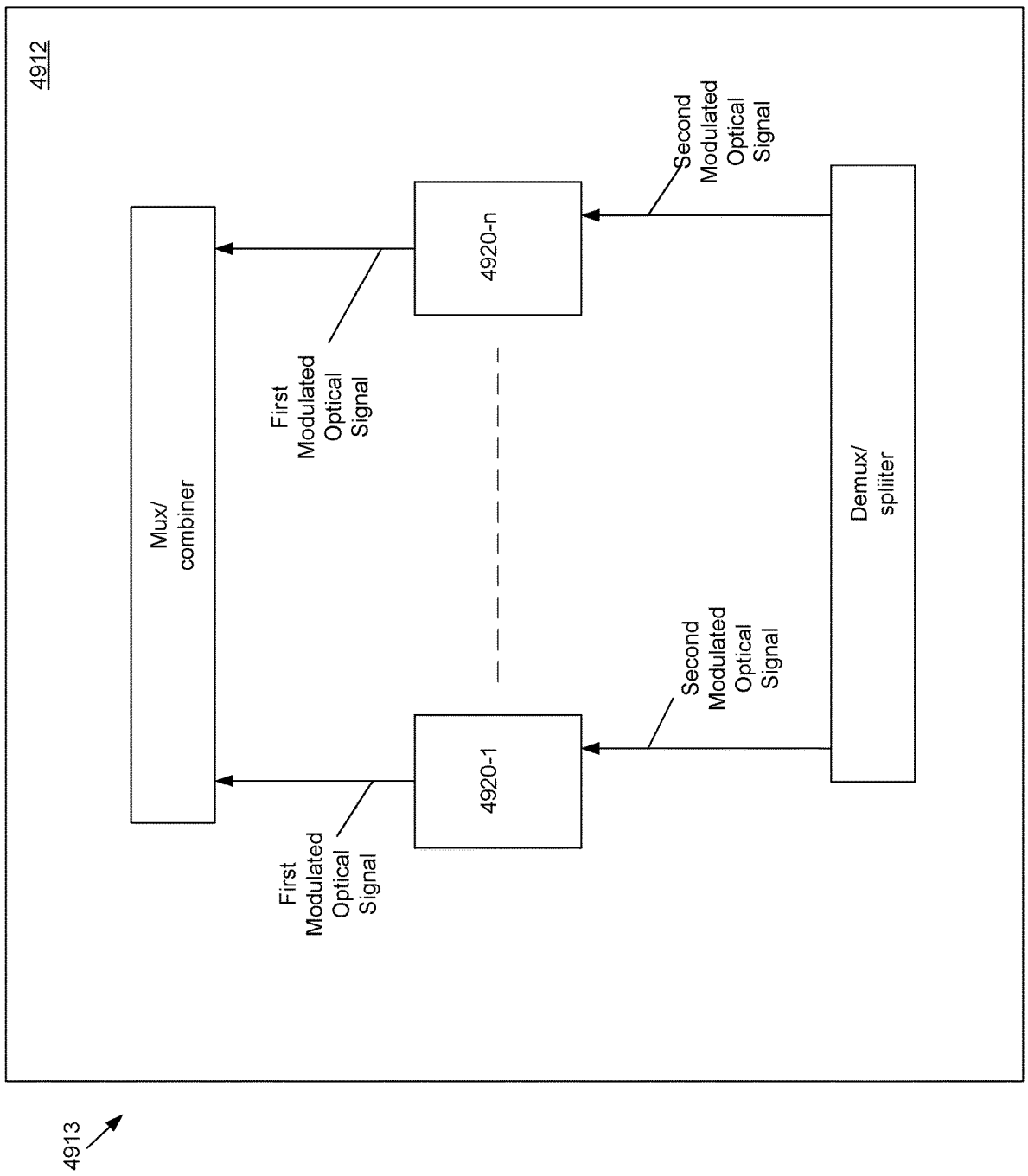

FIG. 4z illustrates PIC 4913, which is similar to PIC 4911 shown in FIG. 4y. PIC 4913, however, includes a plurality of PICs 4920-1 to 4920-$n$ instead of PICs 4910-1 to 4910-$n$. Each of PICs 4920-1 to 4920-$n$ have the same or similar structure as PIC 4920 discussed above in connection with FIG. 4o. Accordingly, PICs 4920-1 to 4920-$n$ generate modulated optical signals (first modulated optical signals) in a manner similar that described above. In addition, PICs 4920-1 to 4920-$n$ receive, mix with a corresponding local oscillator signal, and detect modulated optical signals (second modulated optical signals) in the same or similar fashion as that noted above in regard to FIG. 4o.

In each of the above examples, it is understood that each CLET supplies light having a corresponding one of a plurality of wavelengths in the C-band or extended C-band, for example. In addition, although MMI couplers are described above, it is understood that other couplers or optical multiplexers may be employed such as arrayed waveguide gratings and power combiners.

In the following examples, it is understood that each laser may be provided in an array or PIC with other lasers having the same shape or configuration or with lasers having different shapes or configurations. In addition, in each example disclosed herein, light from both sides of each CLET may be modulated, in the case of a transmitter (Tx) PIC. In addition, CLEts may be provided in an array, as an array (i.e., a laser array), or as discrete devices in which one CLET is provided on a substrate. Alternatively, in each example, light output from one side of the CLET is split and each split portion is modulated. Light from the other side of the CLET may be supplied to a photodiode (or terminated) and the electrical signals generated thereby may be used for monitoring the performance of the CLET. Further, in each of the examples disclosed herein, at least a portion of a gain, mirror, routing, or phase section may extend into a curved or bent portion of the waveguide. Alternatively, the entire gain, mirror, routing or phase section may be included in the curved or bent portion, such that at least a portion of one of these sections is included in the curved or bent portion.

Figure 5A:
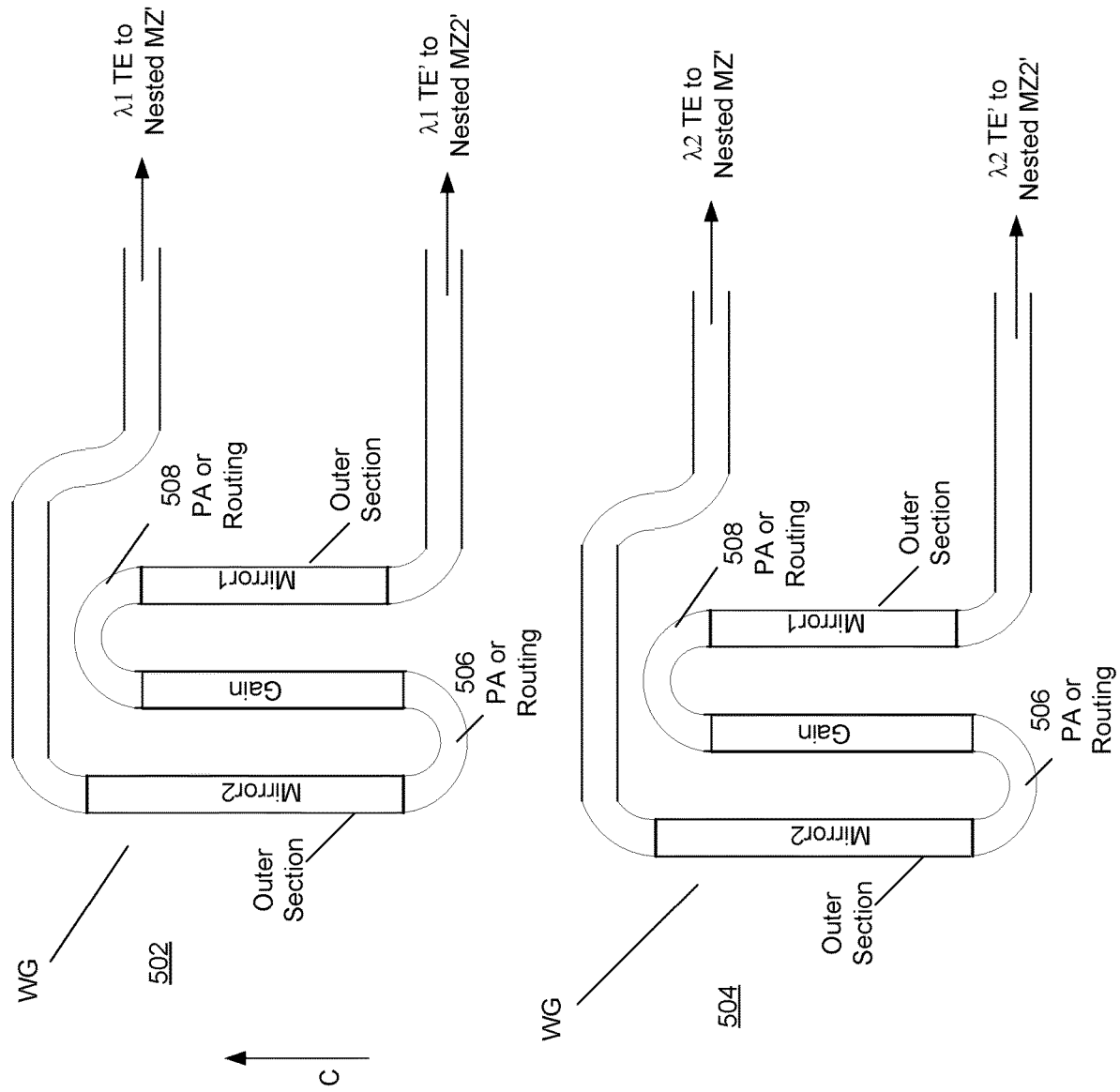
FIGS. 5a, 5b, and 6a illustrate examples of compact lasers with extended tunability (CLETs) consistent with the present disclosure.

In FIG. 5a, CLET 308 of FIG. 3a may be one of CLETs 502 and 504 for integration on the PIC discussed above in connection with FIGS. 2 and 3a. Alternatively, CLETs may be provided in as part of an array of CLET's as shown in FIG. 4b. Each of CLETs 502 and 504 supplies optical outputs having wavelengths $\lambda 1$ and $\lambda 2$, respectively, and includes a waveguide (WG) including mirror sections Mirror1 and Mirror2, and a gain section. As further shown in FIG. 5a, sections 506 and 508 may each include a phase adjusting (PA) or phase section or a routing section. Preferably one of sections 506 is a phase section and the other is a routing section in this example. Section 506 and 508 may be curved, bent, or arcuate. Here, such curved or bent sections 506 and 508 may include either a phase adjusting (PA) section or phase section, and a routing section or a combination of both. As further shown in FIG. 5a, mirror1, mirror2, and gain sections waveguide WG of CLETs 502 and 504 extend parallel to one another and curved, arcuate or bent section 506 connects the gain and mirror2 sections, and section 508 connects the gain and mirror1 sections. As a result, waveguide WG and thus CLETs 502 and 504 have compact serpentine or S-shape. As further shown in FIG. 5, mirrors (Mirror1 and Mirror2) are provided in the "outer sections" with the gain section there between, to therefore define the CLET cavities. The serpentine shape of the waveguide includes one or more elements or portions of elements that are bent or turned by 10 degrees or more than 10 degrees. The elements may include one or more of the gain, phase, routing and mirror sections.

In the configurations shown in FIG. 5a, the spacing of the output waveguides of the CLETs may be aligned with the spacing of the inputs to the nested MZs, such that drive signal traces can be easily laid out to the arms of each MZ (see FIG. 3a). In addition, in FIG. 5a, as well as in each of the other examples and embodiments disclosed herein, either a VOA or SOA may be provided on only one side of the CLET, instead of on both sides, as shown in FIG. 5a. In addition, the VOA or SOA downstream from a multiplexer or coupler may be provided to vary the power levels of combined optical signals supplied from such multiplexer or coupler, such as OUT1 and OUT2 noted above. In addition, the gain and mirror sections (mirror1 and mirror2) may be provided along the same crystallographic axis C.

Figure 5B:
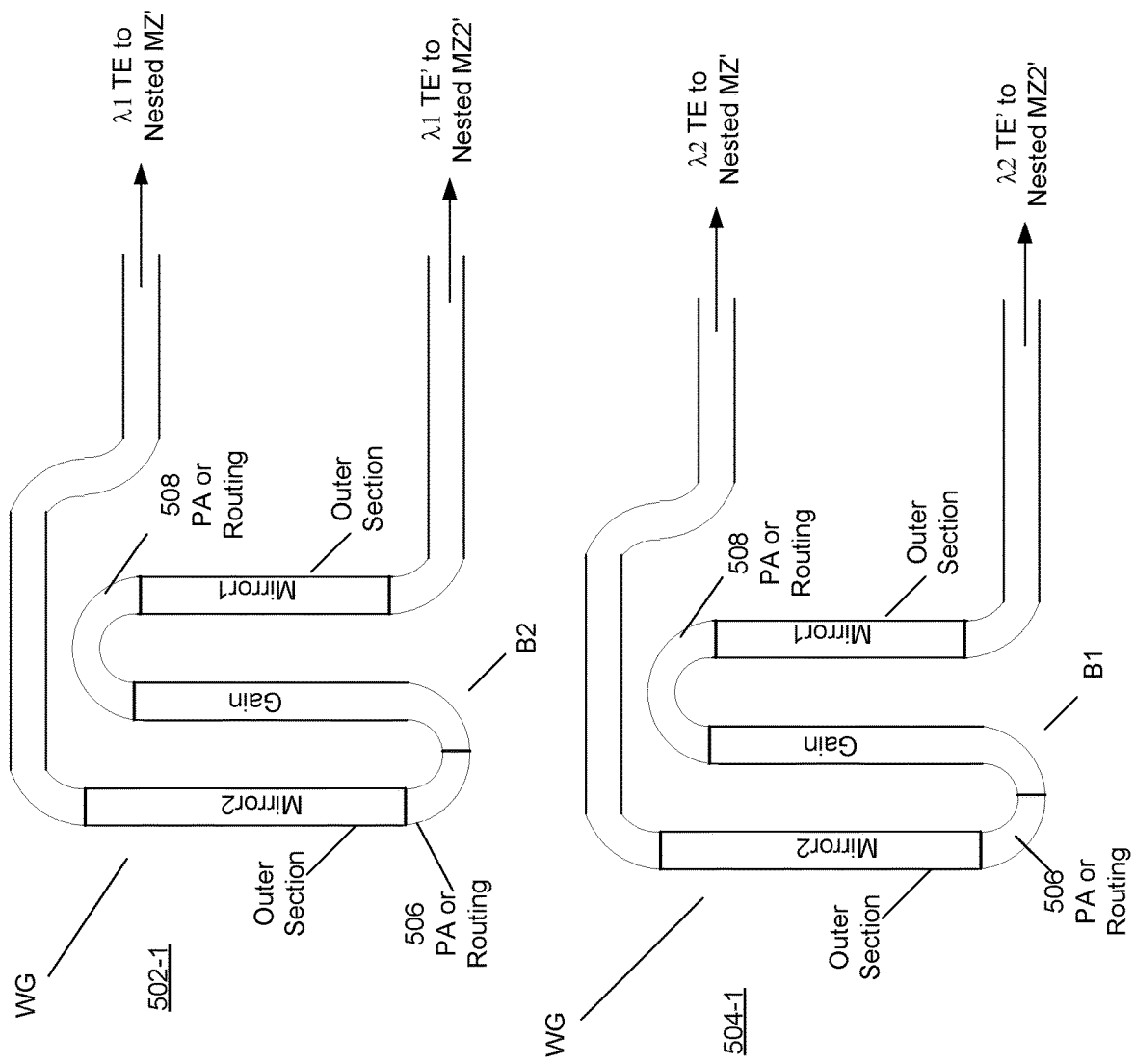

FIG. 5b shows CLETs 502-1 and 504-1 that are similar to CLETs 502 and 504 discussed above. In FIG. 5b, however, a shallow or relatively small portion of the gain sections of CLETs 502-1 and 502-4 extends into bend or arcuate waveguide portions B1 and B2, respectively, of each device. In each embodiment disclosed herein, in addition to the phase and routing sections noted above, at least a portion of the gain section may also be provided in a bent, curved, or arcuate portion of the waveguide. Consistent with a further aspect of the present disclosure, the bent or arcuate portions of waveguide WG may have a shallow construction, as shown in FIG. 3a.

Figure 6A:
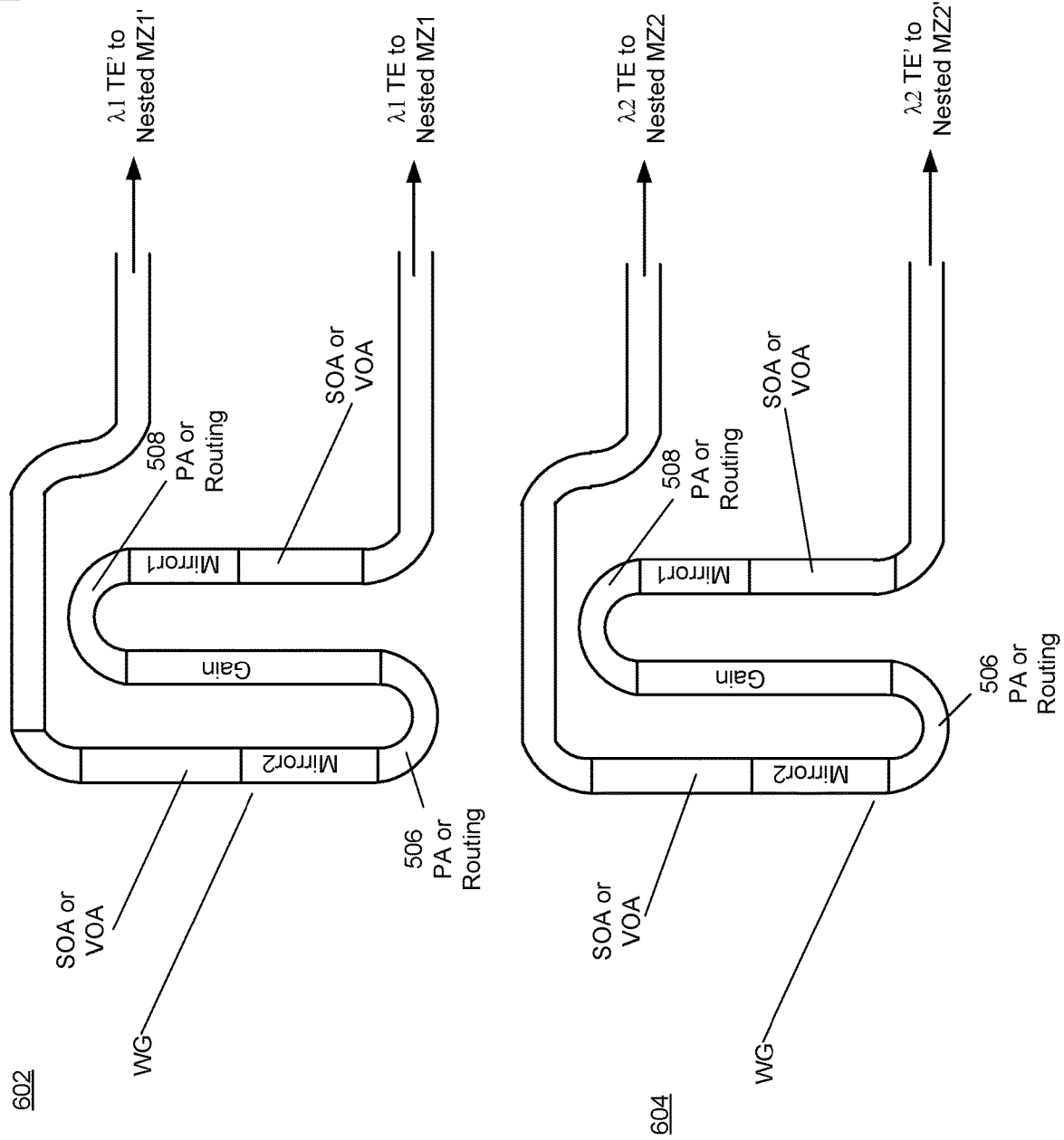

FIG. 6a also shows a serpentine CLET configurations 602 and 604, which is similar to that shown in FIG. 5a. In FIG. 6a, however, semiconductor optical amplifiers (SOAs) or variable optical attenuators (VOAs) are provided between adjacent the outermost edges or output sides of mirrors1 and 2, respectively. Such SOAs or VOAs may be included to balance or substantially equalize the optical power outputs from each of mirrors 1 and 2 or to otherwise increase such optical power that is supplied to the nested Mach-Zehnder modulators, for example.

In the example shown in FIG. 6a, as well as in each CLET disclosed herein, the phase adjusting sections may include portions of a waveguide which are provided adjacent a thermal element. The thermal element may include a resistive heater, e.g., a strip of resistive material, or semiconductor heater, such as those noted above. Upon application of an electric current to the resistive heater, the temperature of the heater increases. With less current, the temperature is reduced. Since the PA section is close to the heater and thermally coupled to it, the temperature of the PA section, and thus the refractive index of the PA section may also be controlled. The phase of light propagating through the PA section varies with changes in refractive index. Accordingly, since changes in temperature can change the refractive index, such temperature changes also result in phase changes in the light traveling through the phase adjusting (PA or ϕ) section. By adjusting the current supplied to the resistive heater, therefore, the phase of light propagating through the PA section may also be adjusted. Alternatively, the index of the phase section (PA) may also be controlled/modulated using current injection or voltage applied to a p-n junction on the phase section. The phase sections between the mirrors are preferably included to ensure continuous tuning across large wavelength ranges, such as those noted above.

For thermal tuning of phase adjustor sections, semiconductor heaters may optionally be deposited (for instance poly-Si sputtering) on a dielectric material (such as SiO2 or SiN) above the waveguide and have electrical contact similar to a metal strip heater. Semiconductor heaters may also be integrated above the waveguide core: above and/or with and/or above the upper contact, and electrical contact may be only at the ends, or throughout the structure so that the ends of the device are biased to ground and possibly at one more locations down the waveguide in order to reduce the electrical resistance and keep the operating voltage adequately low. Semiconductor heaters may also be integrated below the waveguide core using a combination of series and parallel paths through the lower cladding and possibly through the supporting legs of the undercut structure if the substrate is semi-insulating and adequate electrical isolation is achieved by etching, and electrical contact may be made at multiple locations down the structure in parallel and serpentine series paths.

In both FIGS. 5 and 6a, as well as in each other CLET disclosed herein, the phase adjusting section may be co-located with the gain section.

Figure 21:
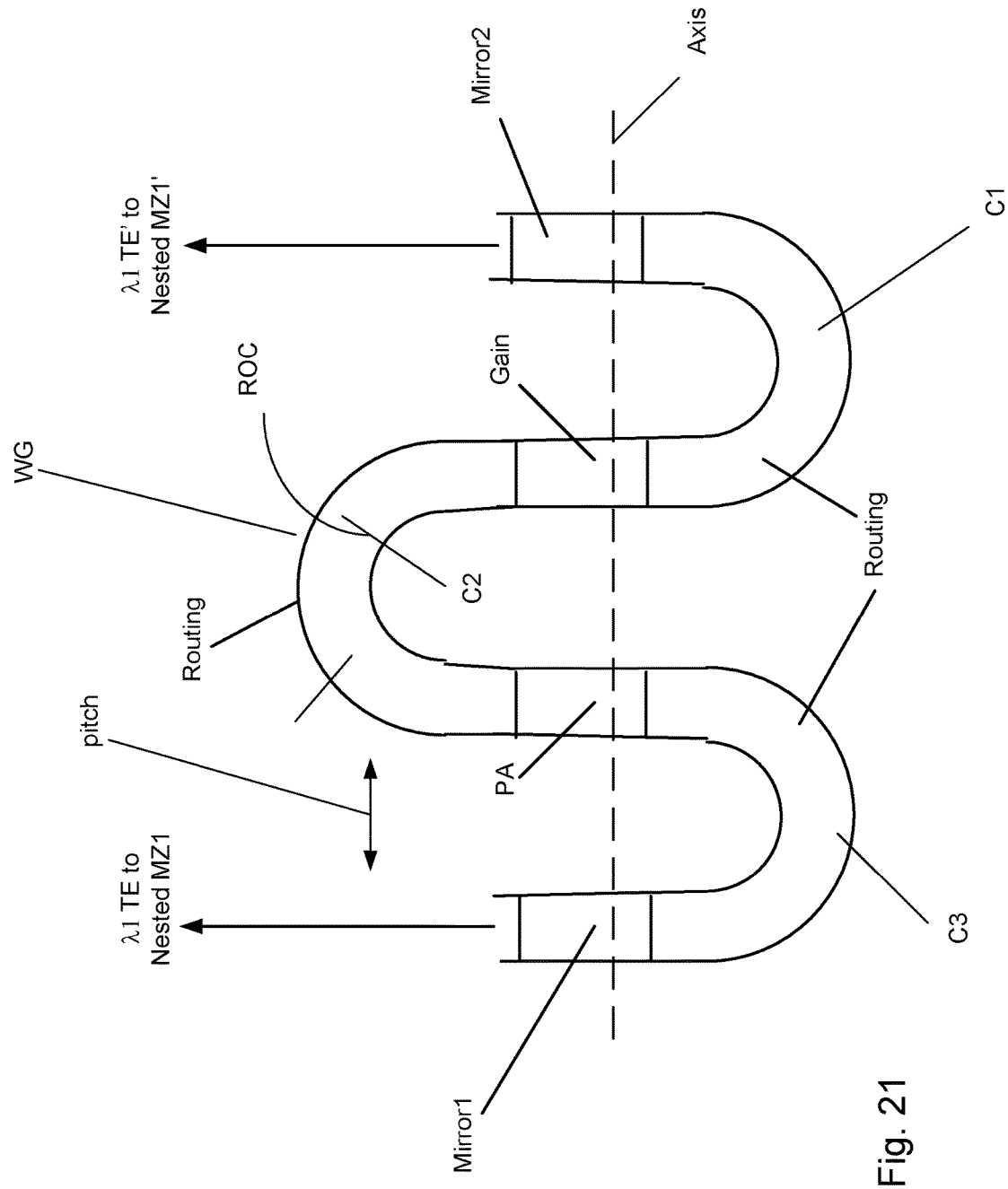

The configurations shown in FIGS. 5 and 6a may be advantageous, for example relative to the W-shaped laser shown in FIG. 21, if a layout is desired in which the gain sections are provided orthogonal or substantially orthogonal to the output sections of the laser. The configurations shown in FIGS. 5 and 6a may also be used in connection with local oscillator lasers in a receiver. Another example of a local oscillator laser is discussed below in reference to FIG. 15.

Figure 6B:
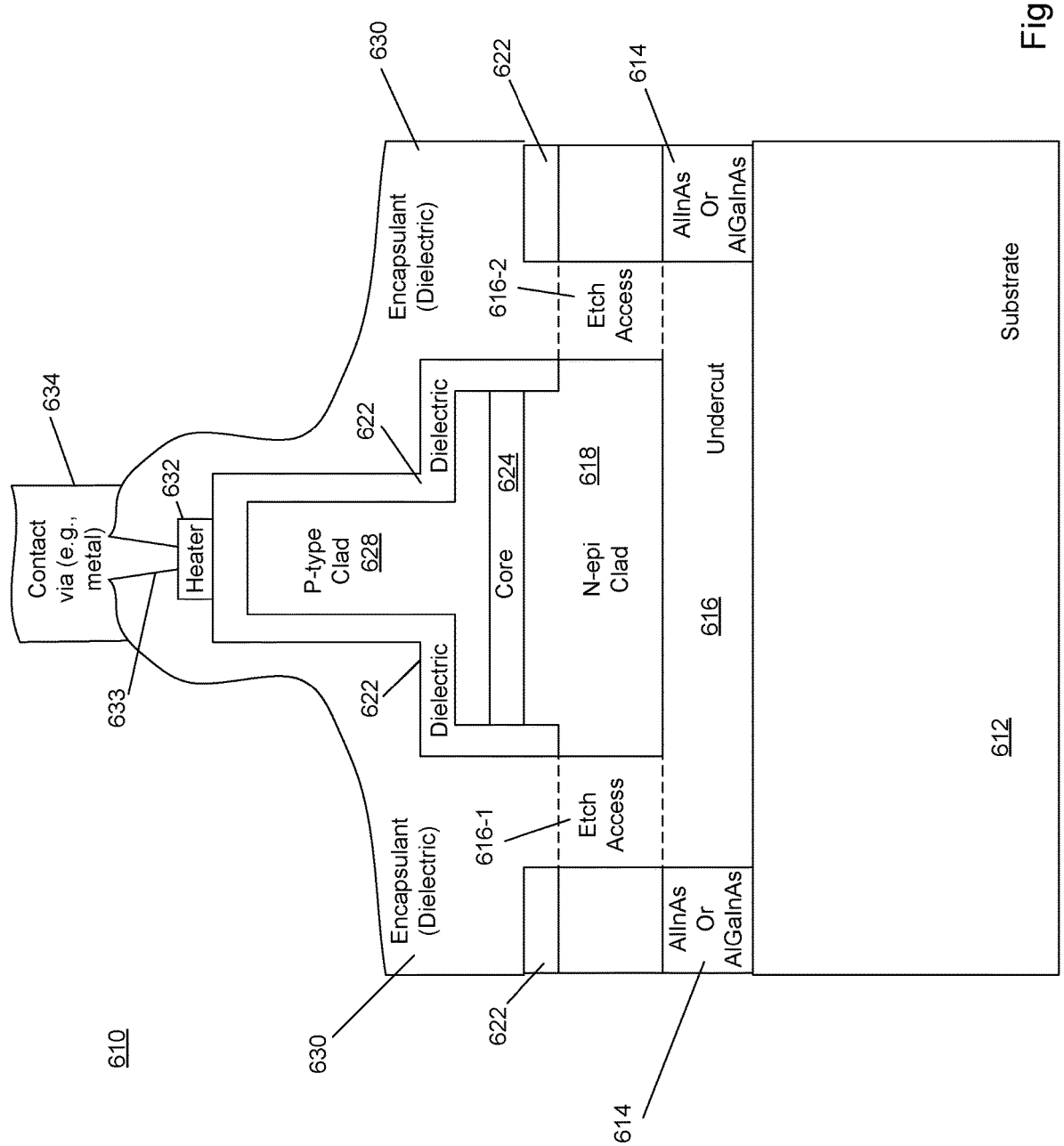
FIG. 6b illustrates an example of an undercut waveguide consistent with the present disclosure.

FIG. 6b illustrates an example of a cross-section 610 of a tunable PA or mirror section consistent with the present disclosure. The tunable (PA or mirror) section, as noted above, may include a portion of waveguide (WG). In more detail, the tunable section may include a layer of aluminum indium arsenide (AlInAs) or aluminum gallium indium arsenide (AlGaInAs) layer provided on an indium phosphide (InP) substrate 612, which is typically doped n-type. An n-type InP epitaxial layer 618, which may constitute a (lower) cladding layer of waveguide WG, may be provided on the AlInAs or AlGaInAs layer. A core layer 624, which may include intrinsic or not-intentionally doped (NID) InP may be provided on n-type epitaxial layer 618, and a p-type InP cladding layer 628 may be provided on core 624.

As further shown in FIG. 6b, an undercut 616 or cavity may be provided beneath the n-type epitaxial layer. Undercut 616 may be formed by preferentially etching the AlInAs or AlGaInAs layer beneath core 624. The etchant used to form undercut 616 may access the AlInAs or AlGaInAs layer through openings 616-1 and 616-2, for example. A series of such openings may be provided, each of which separated by a narrow portion of n-type layer 618 or "leg." The openings may be formed on opposite sides of p-type cladding 628. By using AlInAs or AlGaInAs, the undercut etch may be faster compared to etching of other materials. In addition, optical loss to undercut 616 can be reduced. By forming cavity or undercut 616, the waveguide in the tuning section may be thermally isolated from the substrate, such that thermal tuning of the mirrors and phase sections can be made more efficient.

Dielectric layer 622 is formed over the n-type epitaxial layer 618 and p-type cladding layer 628. A thin film or strip heater 632 may be provided on dielectric layer 622 over p-type cladding 628. Portions of dielectric layer 622 may be removed in order to form openings 616-1 and 616-2 noted above. In addition, an encapsulation layer 630, including a dielectric, is provided on the dielectric layer, preferably after openings 616-1 and 616-2, as well as under 616, are formed. An opening 633 is formed in the encapsulation layer 630 through which an integrated circuit (IC) contact via (e.g., a metal or other conductive material) is provided to provide an electrical connection to heater 632. By application of an appropriate voltage to heater 632, the temperature of heater 632 and thus the underlying cladding and core layers of the tunable sections (mirror or phase) can be controlled. It is noted that the thermal resistance of the gain section may be an impediment to performance and reliability, and, therefore, undercutting the gain section is typically avoided. The present disclosure, however, is not limited to the undercut geometry shown in FIG. 6b. Other suitable PA section geometries may be employed consistent with the present disclosure.

Alternatively, instead of thermal phase control as described above, the phase can be controlled electrically. For example, an electrode may be provided on the waveguide section corresponding to the PA section, to supply current directly to the waveguide. The current may also change the refractive index, such that changes in current may result in corresponding changes in phase. If current injection phase control is desired, the PA waveguide section is typically not undercut, since heating increases refractive index, while current injection reduces refractive index and therefore tuning is most efficient when one effect dominates.

Returning to FIG. 6a, as noted above, semiconductor optical amplifier (SOA) sections are provided outside the CLET cavity, for example, to amplify the optical signals output from the CLETs prior to input to the nested MZs. SOAs may also be provided at the outputs of the nested MZs (see FIGS. 3a and 4a) instead of or in addition to the SOAs at the inputs to the nested MZs. Additionally, the SOAs may be deployed after the modulators or both before and after the modulators.

Figure 6C:
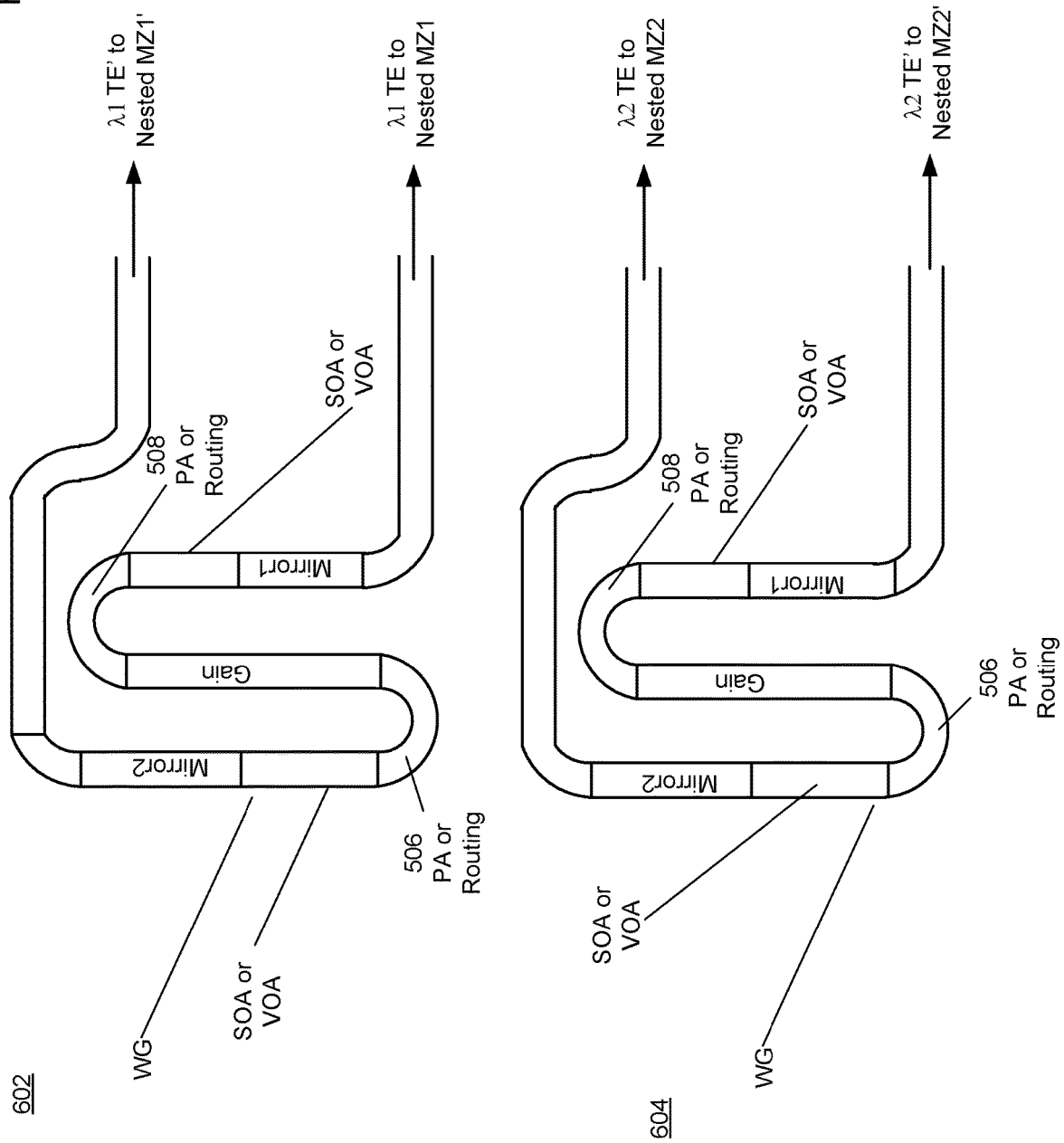
FIG. 6c illustrates a further example of a compact laser with extended tunability consistent with an additional aspect of the present disclosure.

An additional example is shown in FIG. 6c. The configurations shown in FIG. 6c are similar to those shown in FIG. 6a, except that a first SOA (and/or VOA) may be provided between mirror1 and the gain section. In addition, a second SOA (and/or VOA) may be provided between mirror2 and the gain section.

Figure 7:
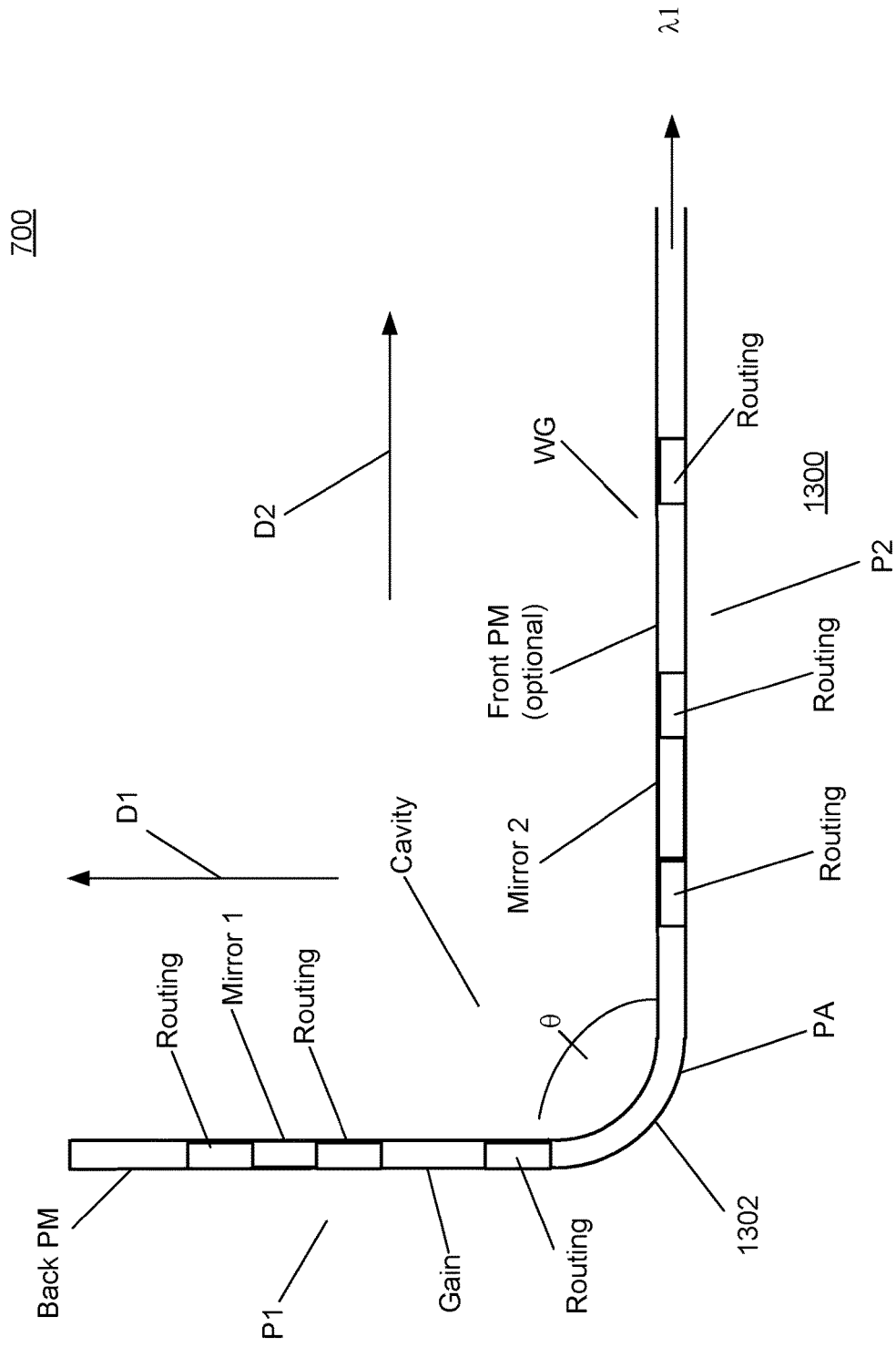
FIGS. 7-14 illustrate additional examples of CLETs consistent with the present disclosure.

FIG. 7 illustrates an example of CLET 700 in which an optical output at wavelength λ1 is provided. CLET 700 includes waveguide WG having portions P1 and P2. Portion P1 include the gain section and mirror 1, and portion P2 includes mirror 2. PA section 702 is bent or curved, such that portions or sections P1 and P2 are oriented at an angle θ of substantially equal to 90 degrees, for example. CLET 700 also includes a photodiode (Back PM) to detect and monitor light output from one side, i.e., the back, of the CLET. An optional PIN diode ("Front PM") may also be provided for monitoring the optical signal output from the other side (or the front) of the CLET. Routing sections in waveguide WG are provided between the mirror, gain, phase, and photodiode sections of the waveguide.

Moreover, as further shown in FIG. 7, waveguide WG has first and second portions or branches parts P1 and P2 that extend in first and second directions, D1 and D2, respectively. Parts P1 and P2 may be portions of a cavity, defined by a section of waveguide WG extending from mirror 1 to mirror 2. As shown in FIG. 7, angle θ is approximately 90 degrees, such that waveguide WG is L-shaped. However, consistent with the present disclosure angle θ can be any angle greater than or equal to 30 degrees in FIG. 7, as well as in FIG. 8. Moreover, the waveguide section between the mirrors may have a curved or arcuate portion 702, which as further noted above includes the PA section. It is noted, however, that arcuate section 702 may include a routing section instead of the PA, especially if the PA section is co-located with the gain section. Alternatively, arcuate portion 702 may include both PA and routing sections.

Although the phase section is shown as being bent or curved in FIG. 7, it is understood that any one of the mirror section, gain section, as well as one or more of the passive sections may be bent or curved. Generally, however, the mirror section is bent at an angle of less than 10 degrees if it contains a grating to ensure that the manufacturability (control) of the desired reflection spectrum as described in Table 1. Passive sections may be embedded in the mirror to facilitate curves or the mirror section may comprise a ring resonator in conjunction with curved sections of other elements in the CLET.

In addition, although one CLET is shown in FIG. 7, it is understood that is in this example, as well as in the other examples, a plurality of such CLETs may be provided in an array or in a PIC as further disclosed herein. In those examples, however, the optical output of each such CLET may have a corresponding one of a plurality of wavelengths.

As further shown in FIG. 7, waveguide WG is not split or divided in the cavity portion between the mirrors. As such, light propagating in the cavity is undivided and travels along a continuous waveguide optical path. Conventional tunable lasers may include a bent waveguide and an interrupted or discontinuous cavity, such as AWG based lasers and Y-branch lasers noted above. However, such interrupted cavities may introduce performance degradation (via reflection, loss, and/or polarization conversion).

In an another example, PA section may replace a routing section between mirror 2 and the front PM photodiode, such that the PA section extends in direction D2 and the gain section extends in direction D1 different than D2.

Figure 8:
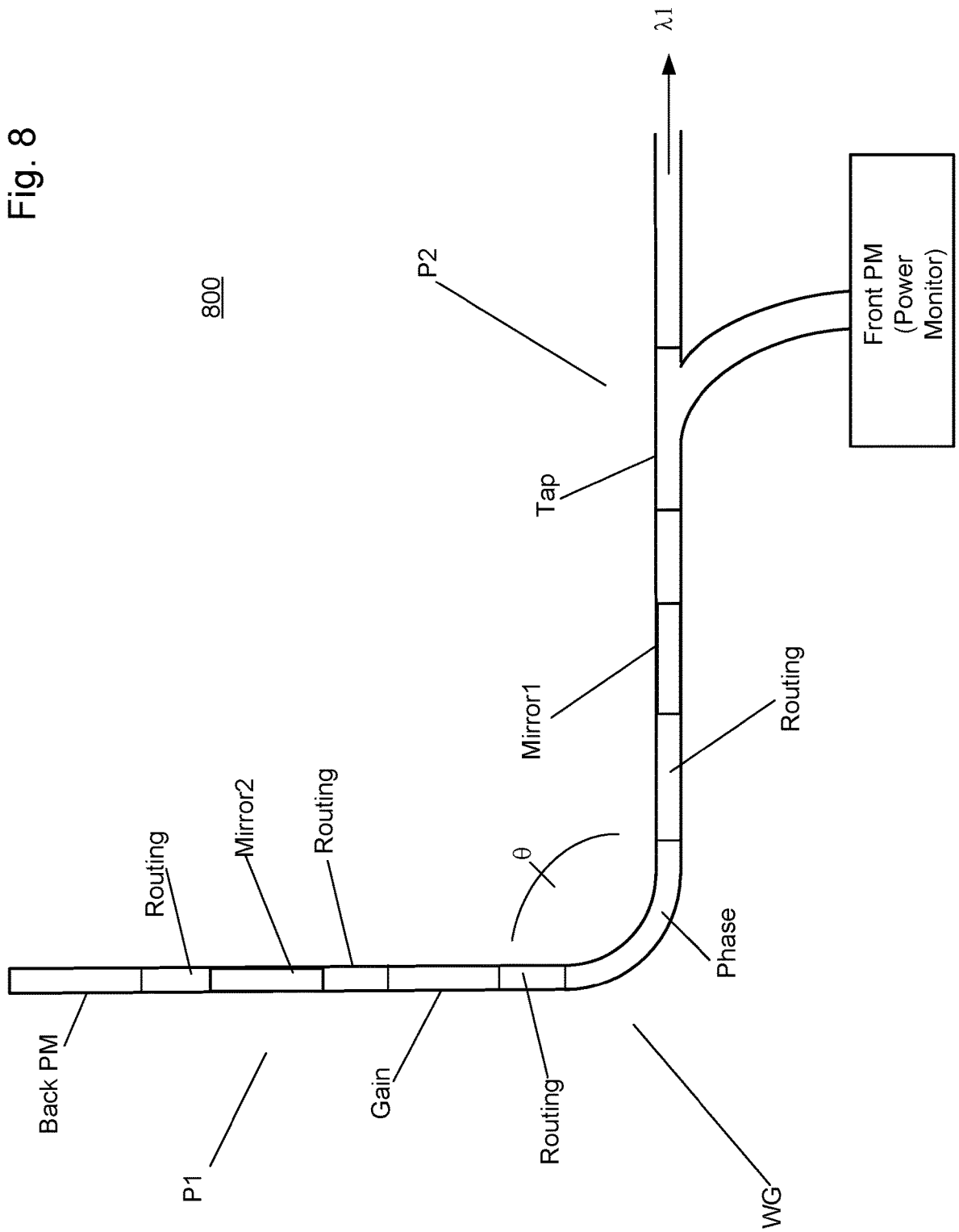

Alternatively, as shown in FIG. 8, CLET 800 including a tap is provided that supplies a small (or first) portion of the optical signal or light, e.g., 20% or preferably 10% or less of the optical signal at one output, to the PIN diode or Front PM. A second output of the tap supplies the rest of the optical signal (i.e., a second portion of the optical signal). The configuration shown in FIG. 8 is otherwise the same as that shown in FIG. 7. In both examples, the back PM photodiode and front PM photodiode (FIG. 8) are provided outside the mirror sections (Mirror 1 and 2).

Figure 9:
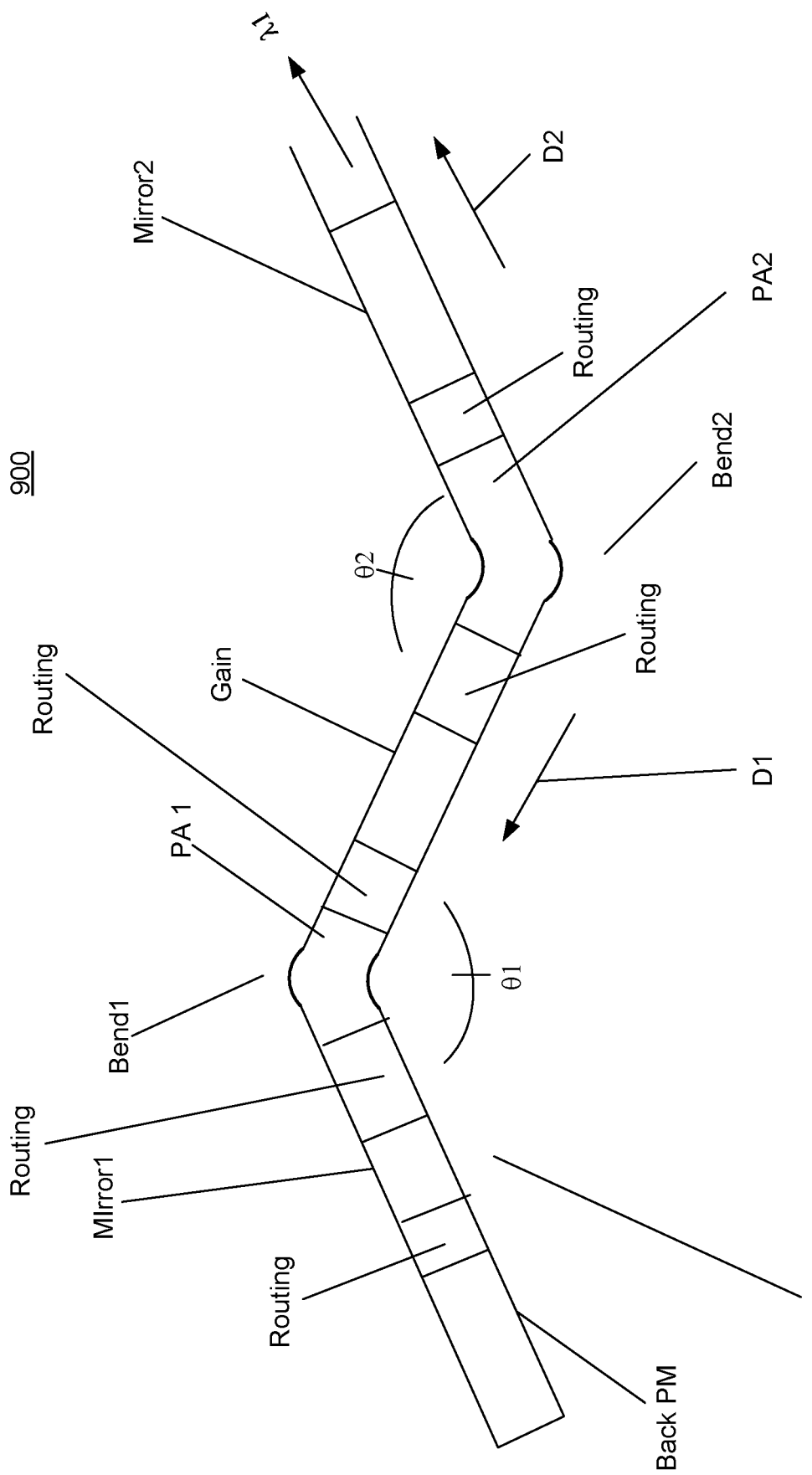

FIG. 9 shows another example (CLET 900) including the back PM, mirror, gain and phase sections shown in FIGS. 7 and 8, but arranged in a zig-zag or Z-shaped configuration. In this example, mirror 1 and the gain section are oriented at a first angle θ1 relative to one another, and the gain section and mirror 2 are oriented at a second angle θ2 relative to one another to thereby define the zig-zag shape. In addition, the gain section extends in direction D1 and mirror sections (mirror1 and mirror2) extend in a second direction D2. Also, PA sections PA1 and PA2 are provided in curved, bent or arcuate portions Bend1 and Bend2, respectively. It is understood that certain sections (routing, mirror, phase, and gain) of waveguide WG may alternatively extend in either direction D1, while others extend in direction D2. The layout shown in FIG. 9 accommodates electrical connections including bonding pads between adjacent lasers of an array. Accordingly, the overall area occupied by the array and associated electrical connections may be reduced. The lasers in the array may generate a single output that is modulated to carry data, or outputs from both sides of each laser may be modulated. Moreover, in this example, as well as in every other example disclosed herein, one or more routing and/or PA sections may be provided anywhere in the waveguide (WG) portion extending from one mirror to the other.

Figure 10:
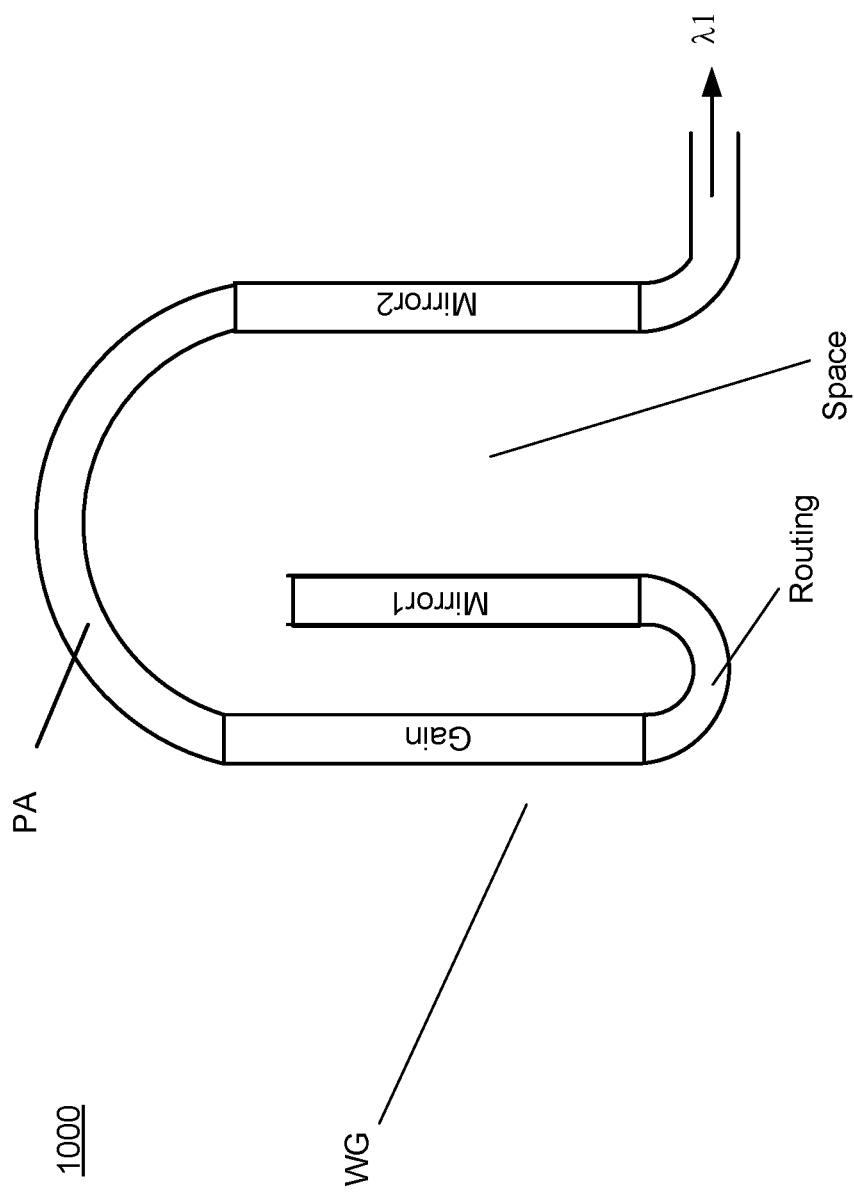

FIG. 10 shows an example of a CLET 1000 in which the tunable sections are nested or coiled to resemble the shape of a paperclip. CLET 1000, like those shown in FIGS. 7-9 supplies one optical signal that is supplied to a modulator (not shown in these figures). In particular, CLET 100 includes waveguide WG having three sections (gain, mirror1, and mirror2) that may be parallel to one another. A routing section may optically connect mirror1 with the gain section and a PA section may optically connect the gain section with mirror 2. Mirror 2 extends into the space bounded by the PA section, the gain section, and mirror 2.

Figure 11:
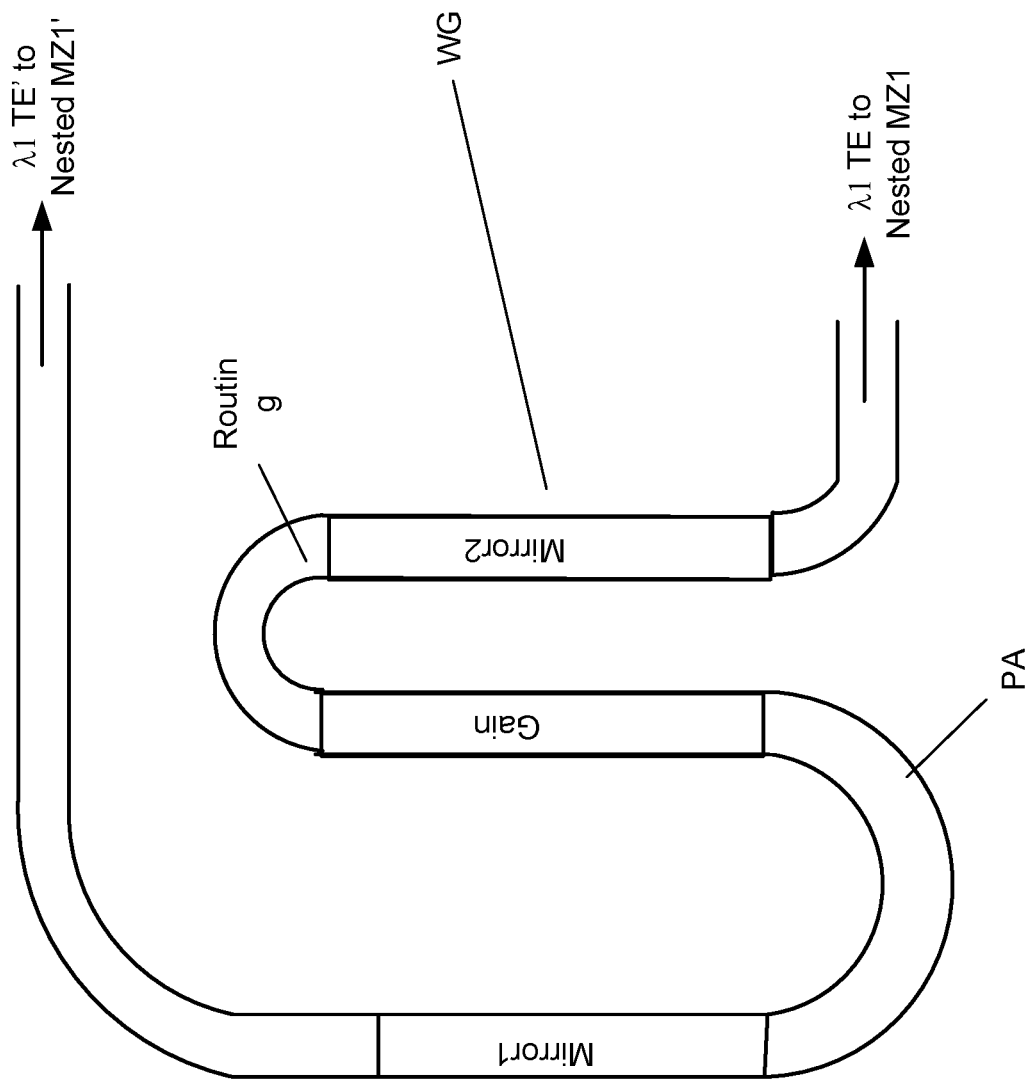

FIG. 11 shows a compact S-shaped CLET 1100 configuration that outputs pairs of optical signals (e.g., λ1TE and λ1TE'). Here, waveguide sections mirror1, mirror 2, and the gain section may extend parallel to one another. A phase section PA optically connects the gain and mirror1 sections, and a routing section optically connects the gain and mirror2 sections. Here, as in FIG. 10, the routing and PA sections may be switched, such that, for example in FIG. 11, the PA section connects the gain and mirror2 sections, and a routing section connects the gain and mirror1 sections. In addition, in these examples, as well as in every other example disclosed herein, routing sections may be provided between the mirror, gain, and PA sections so that each is electrically and/or thermally isolated from every other section in waveguide WG.

Figure 12:
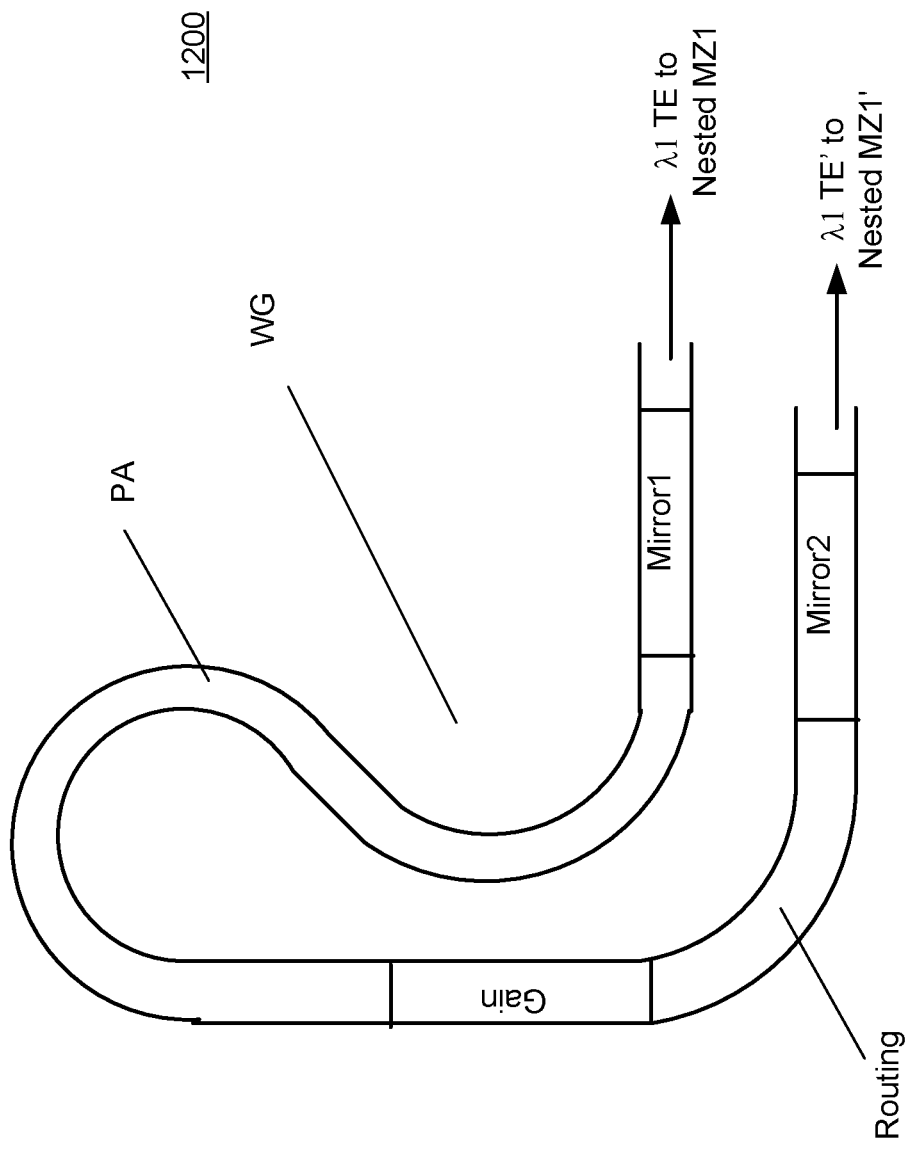

FIG. 12 illustrates a looped CLET configuration 1200 that also generates dual outputs. The looped PA section has a substantially S-shape or serpentine shape. Here, mirror1 extends from a first end of the PA section, and the gain section extends from a second end of the looped PA section. Routing sections may optionally be provided between the gain section and the looped PA section, as well as between the PA section and mirror1. Further, a routing section may be provided in the looped section instead of or in addition to the PA section. It is noted that although single CLETs are shown in FIGS. 7-14, 17-22, 25a-25c, and 27, a plurality of such CLETs may be provided, for example, as an array on a common substrate, as shown in FIG. 4b, or included as the CLETs shown in FIGS. 4p-4x.

Figure 13:
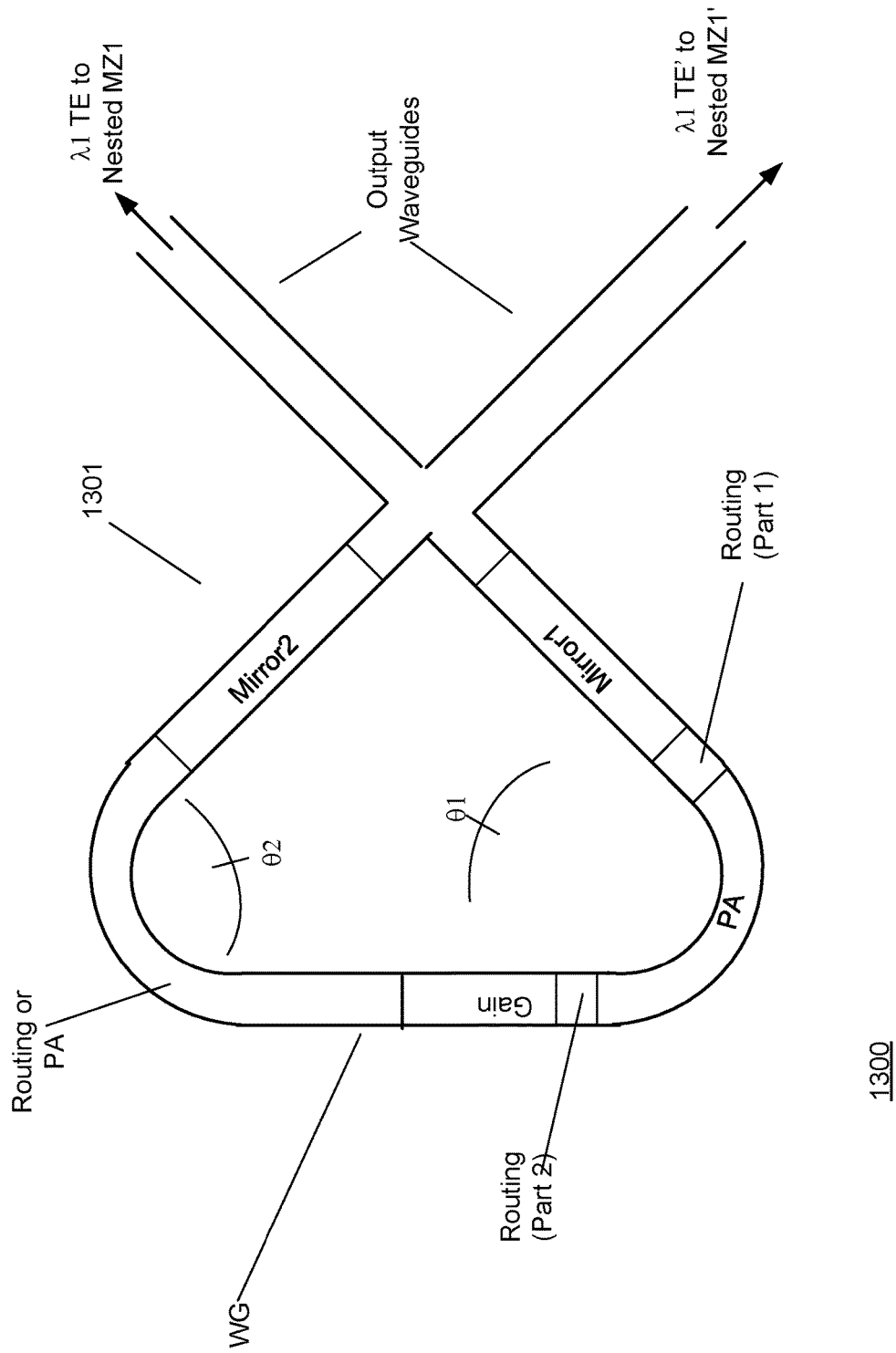
Figure 14:
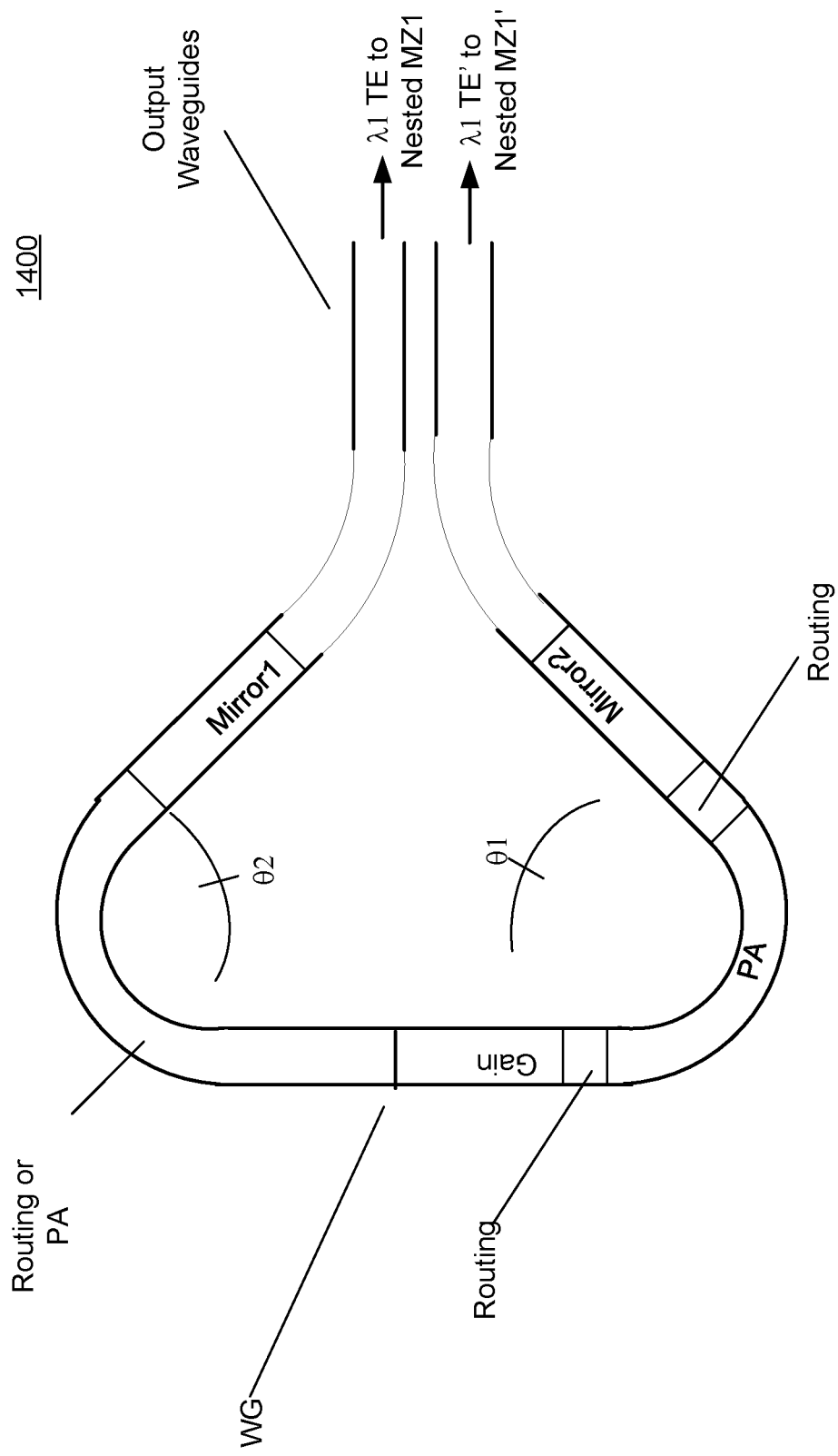

FIGS. 13 and 14 show compact dual-output CLETs 1300 and 1400, respectively having triangular configurations. In FIG. 13, the output waveguides extend from each mirror through one another or cross over to form a closed loop 1301, and, in FIG. 14, the output waveguides (waveguide extensions) extend toward one another but do not cross. As further shown in FIGS. 13 and 14 the gain and mirror2 sections are oriented at an angle θ1 relative to one another, and the gain and mirror sections are oriented at an angle θ2 relative to one another. Angles θ1 and θ2 may be the same or different. Also, the gain, mirror1 and mirror2 sections are typically straight. However, mirror1 may be provided in first (Part 1) and second (Part 2) parts of closed loop 1301.

Waveguide crossings may introduce loss and unwanted reflections. In low density PICs with few function elements, few waveguide crossings may be easily provided and the resulting loss may be acceptable. In high density applications with high functional element counts and waveguides, however, the loss and reflections associated with waveguide crossings may be significant or even prohibitive. Accordingly, a non-crossing configuration, such as that shown in FIG. 14 may be desirable in high density PICs that require closely spaced parallel inputs.

Figure 15:
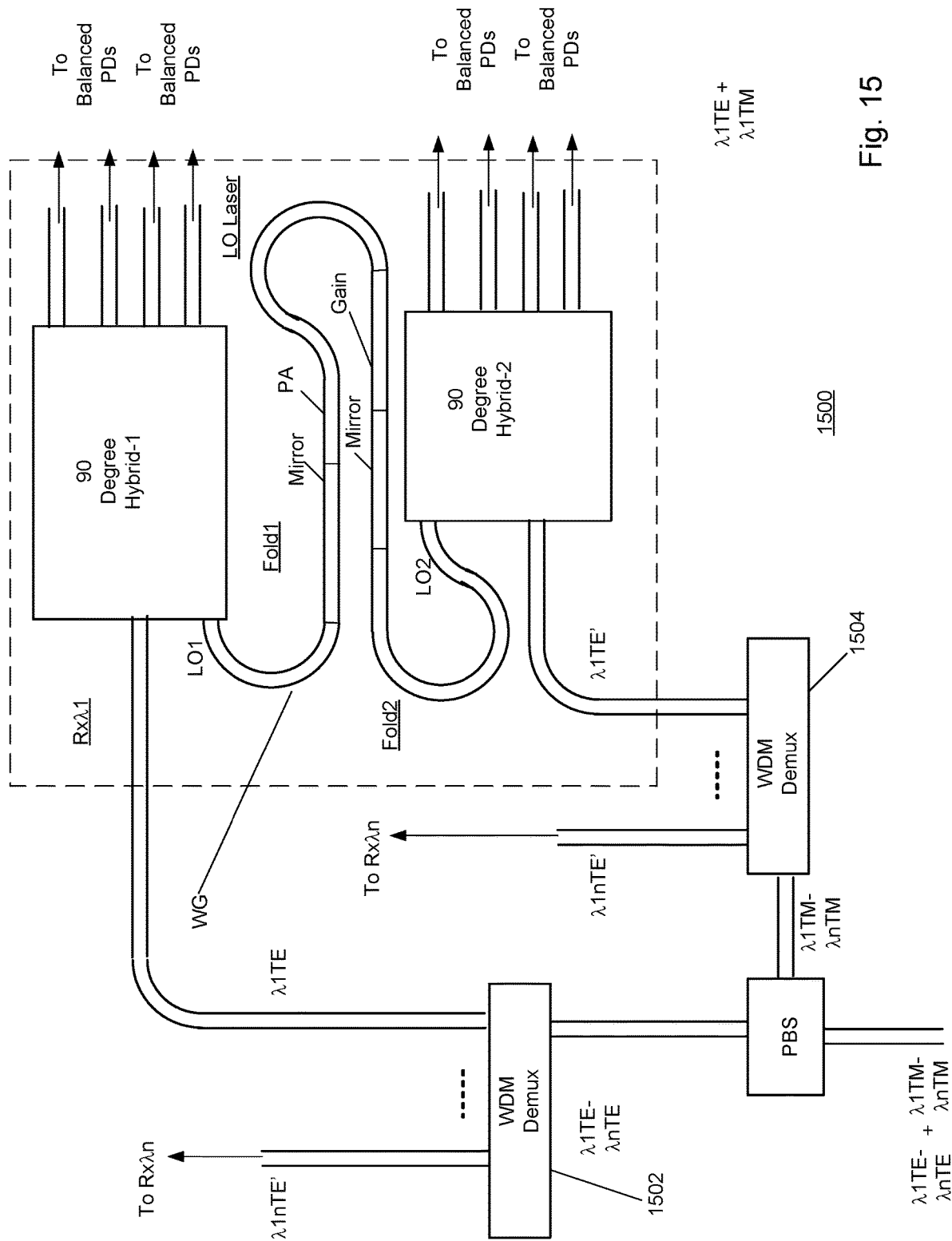
FIG. 15 illustrates an example of a photonic integrated circuit consistent with a further aspect of the present disclosure.

FIG. 15 shows an example of a receive node 1500 consistent with an aspect of the present disclosure. Receive node 1500 includes a polarization beam splitter (PBS) that receives optical signals at wavelengths λ1 to λn. Each optical signal typically includes independently modulated optical components having transverse electric (TE) and transverse magnetic (TM) polarizations. Such components are designated λ1TE and λ1TM, respectively, in FIG. 15.

The PBS outputs the TE components to first WDM demultiplexer 1502 and the TM components to a second WDM demultiplexer 1504. Each of TE components, such as λ1TE, is supplied to a corresponding receiver, e.g., Rxλ. Each of the TM components is supplied to second WDM demultiplexer 1504, which rotates the polarization of each TM component to be TE and outputs each component to a respective one of the receivers. Accordingly, for example, optical component λ1TM is separated from the remaining TM optical components by WDM demultiplexer 1504 and output to Rxλ1 as component λ1TE'.

Component λ1TE is supplied to 90 Degree Hybrid-1 and λ1TE' may be provided to 90 Degree Hybrid-2. 90 Degree Hybrids 1 and 2 may be known optical hybrid circuits that mix first local oscillator light LO1 (or second local oscillator light LO2 as the case may be) from a CLET local oscillator laser (LO Laser—described in greater detail below) and generate optical outputs to balanced photodetectors for conversion to electrical signals and further processing that recovers data carried by λ1TE and λ1TE'.

Consistent with the present disclosure, the CLET LO Laser may have a folded configuration including first and second folded portions, Fold1 and Fold2. Mirrors define the CLET cavity, and a PA section may be provided between the gain section and one of the mirror sections or may be co-located with the gain section. Semiconductor optical amplifiers may optionally be provided at the inputs to 90 Degree Hybrid-1 and 90. Degree Hybrid-2, respectively. Alternatively, SOAs may be provided at the outputs of 90 Degree Hybrid-1 and 2. It is understood that the CLET LO may have any one of the other configurations disclosed herein.

The pitch of the photodiode connections is such that the hairpin shaped lasers discussed above may occupy the space between adjacent channels. In addition, the laser are folded and do not extend into the optical hybrid circuit.

It is understood that optical receivers provided for each of the remaining optical components λ2TE to λnTE and λ2TE' to λnTE' may have the same or similar structure and operation as receiver Rxλ1, such as Rxλn, which is referenced in FIG. 15, but, for convenience, are not shown in detail.

Although various CLET sections are described above as being non-collinear, e.g., being bent, curved or folded, it is understood, that one or more of such bends, curves or folds may be replaced with so-called turning mirrors. Such turning mirrors may include two waveguides joined together in such a way as to create a side surface that provides total internal reflection of incoming light propagating in a first direction and directs the light in a second direction. An exemplary turning mirror 1600 is shown in FIG. 16a.

Alternatively, a grating based reflector may be provided or metal and/or dielectric coated cladding layer(s) may be used to reflect light.

Figure 16B:
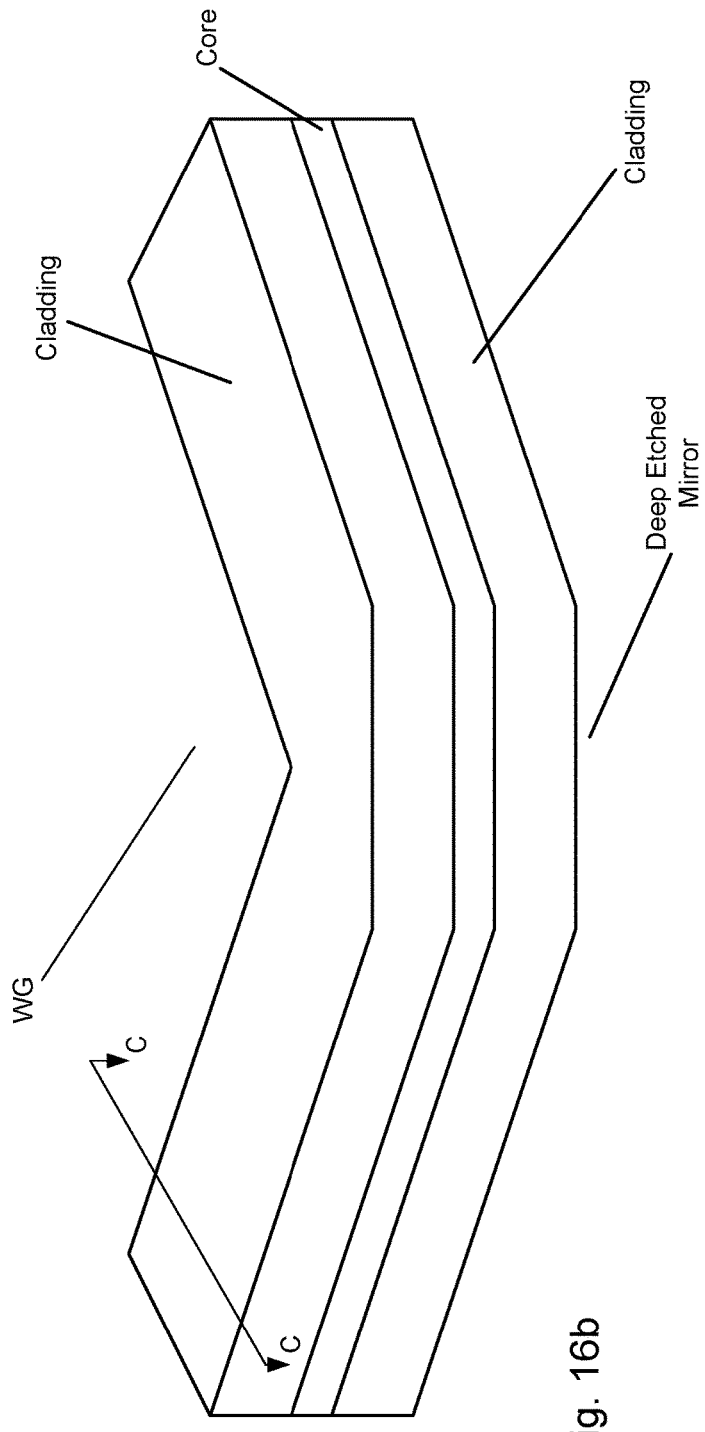
Figure 16C:
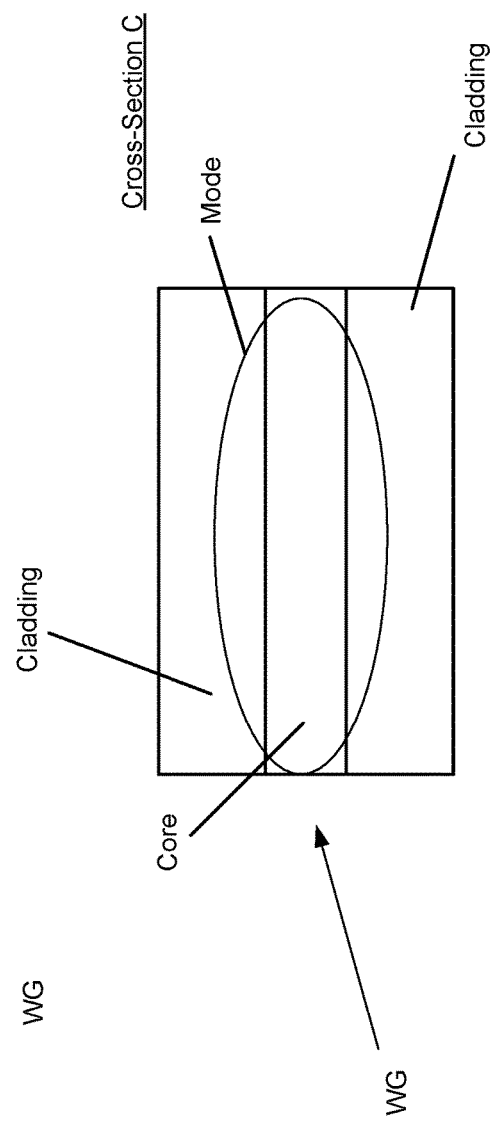

FIG. 16b shows a perspective view of a turning mirror including a deep etched waveguide and a deep etched turning mirror, wherein the deep etch extends through one of the cladding layers and the core, as well as at least a portion of the other cladding layer. FIG. 16c shows a cross sectional view of a portion of the waveguide taken along line C-C in FIG. 16b and illustrates the location of an optical guided mode relative to the core and cladding edges of such a deep etched waveguide.

Figure 16D:
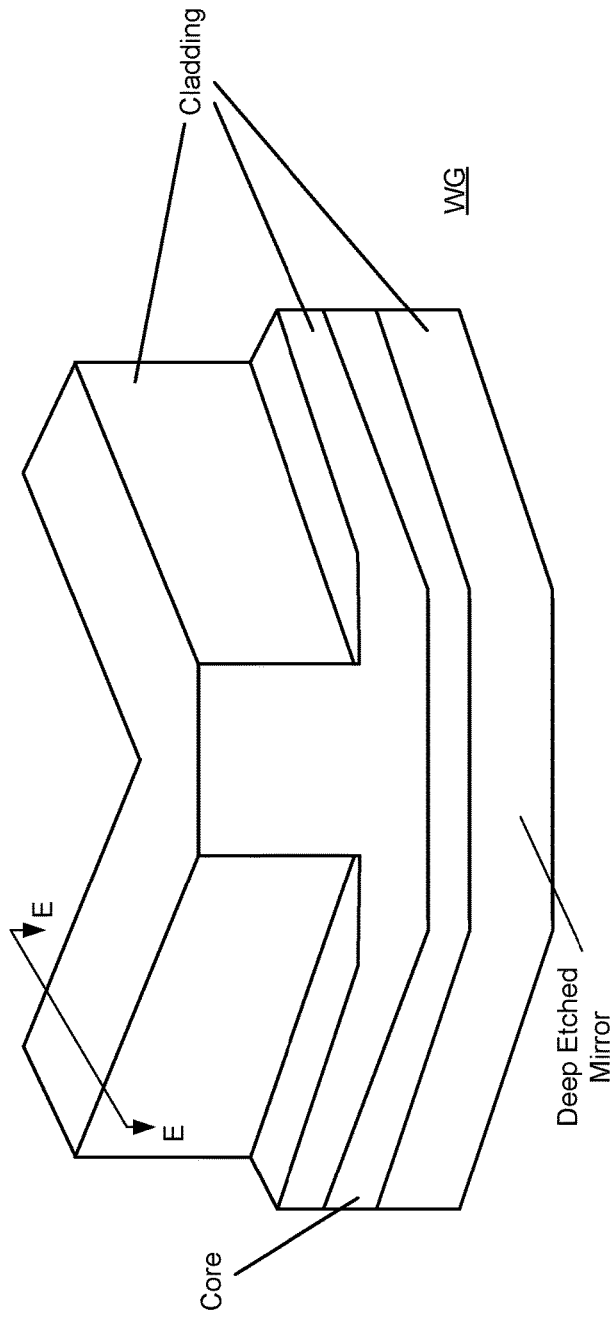
Figure 16E:
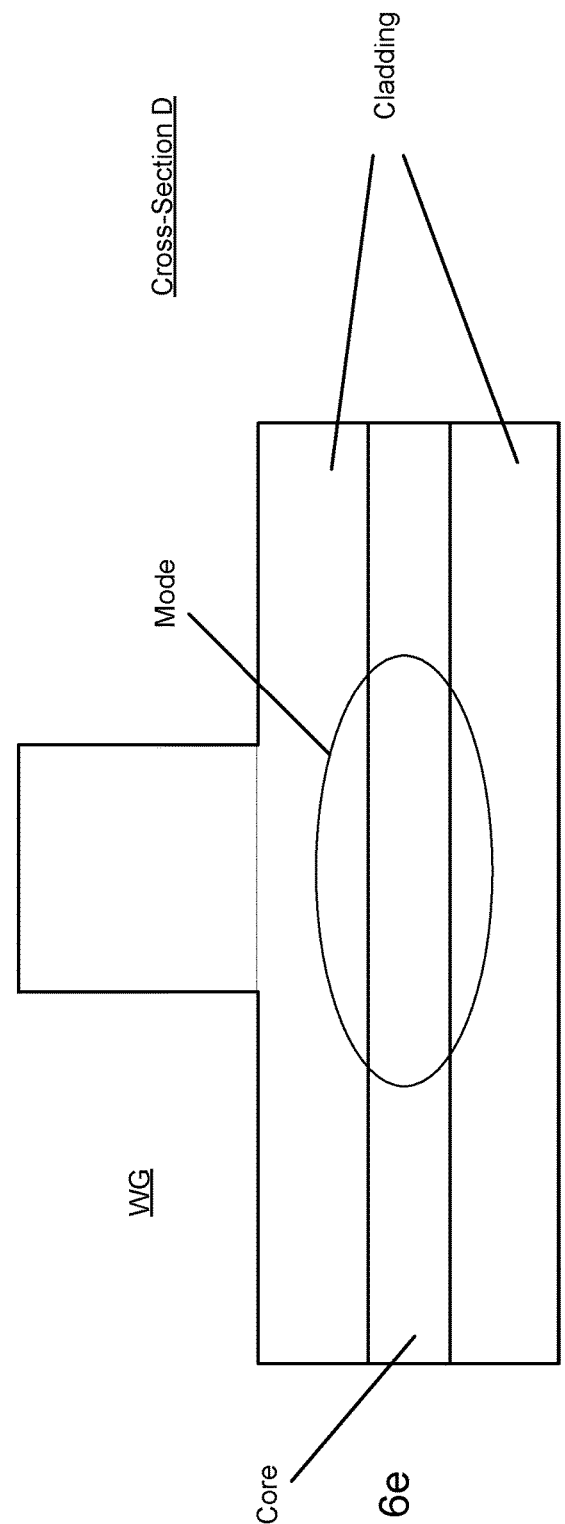

FIG. 16d shows a perspective view of a turning mirror including a shallow etched waveguide employing a deeply etched turning mirror. In the shallow waveguide, only portions of one of the cladding layers are removed, but the etch depth does not extend through the core layer but may just extend to it. FIG. 16e shows a cross-sectional view of an optical guided mode taken along line E-E in FIG. 16d relative to the core and cladding edges of the shallow waveguide.

In the above examples, as well as those discussed below, deep etched waveguides allow for tighter curves or radii of curvature (ROCs). Shallow etched waveguide that may stop at the core or before it may be used when larger ROCs can be accommodated. The ROCs will scale with the type of material used. Accordingly, for example, InP materials may have certain ROCs while waveguides provided in silicon may have different ROCs. As such, the present disclosure contemplates integration of both III-V materials, such as InP, and silicon waveguides as well as other devices on a silicon photonics substrate. Deeply-etched waveguides in InP (see FIG. 3c, for example) are typically employed for ROCs less than about 500 um, or preferably 250 um, or more preferably 150 um, (but may be larger), while shallow-etched waveguides are often used for ROCs greater than that to minimize loss. In silicon the ROCs may range from 1-200 um, for example.

As noted above, CLETs consistent with the present disclosure may include thermal and/or electrical isolation sections (routing sections) between one or more of such tunable sections (mirror, gain, PA), and/or sections that are optically passive waveguides (e.g., do not provide gain, phase, or reflection) and such passive routing sections may be bent, curved or non-collinear relative the tunable sections. These routings may be typically 10-150 um long, and may include conductive connections from the waveguides to the surrounding field of the PIC. Passive or routing optical sections may be up to 2 mm long or more and provide a section in the cavity to elongate the cavity (for improved performance) and/or navigate bends without inducing manufacturing and/or performance variations. In addition, the tunable sections may be provided in straight portions of the laser.

Figure 17:
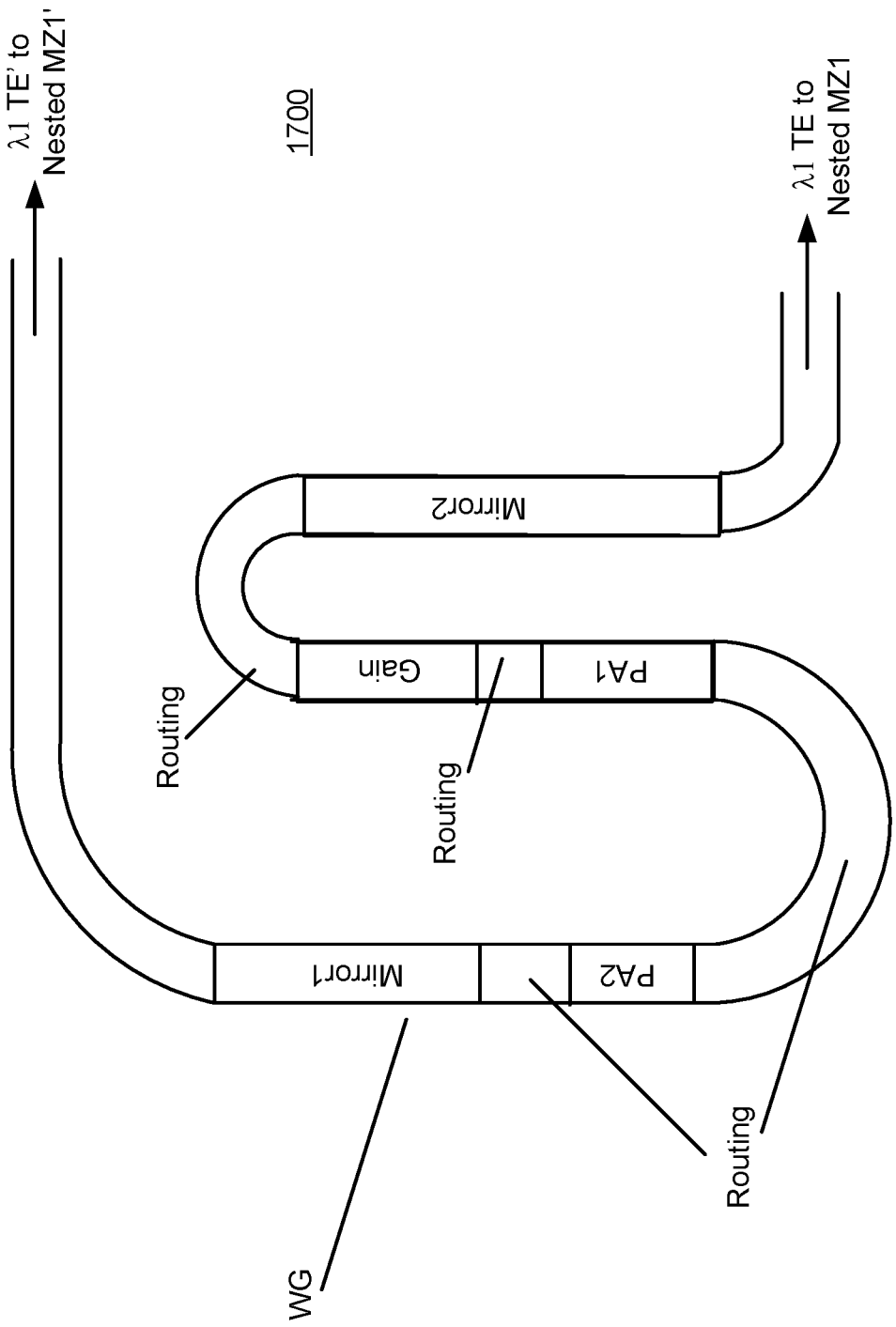
Figure 18:
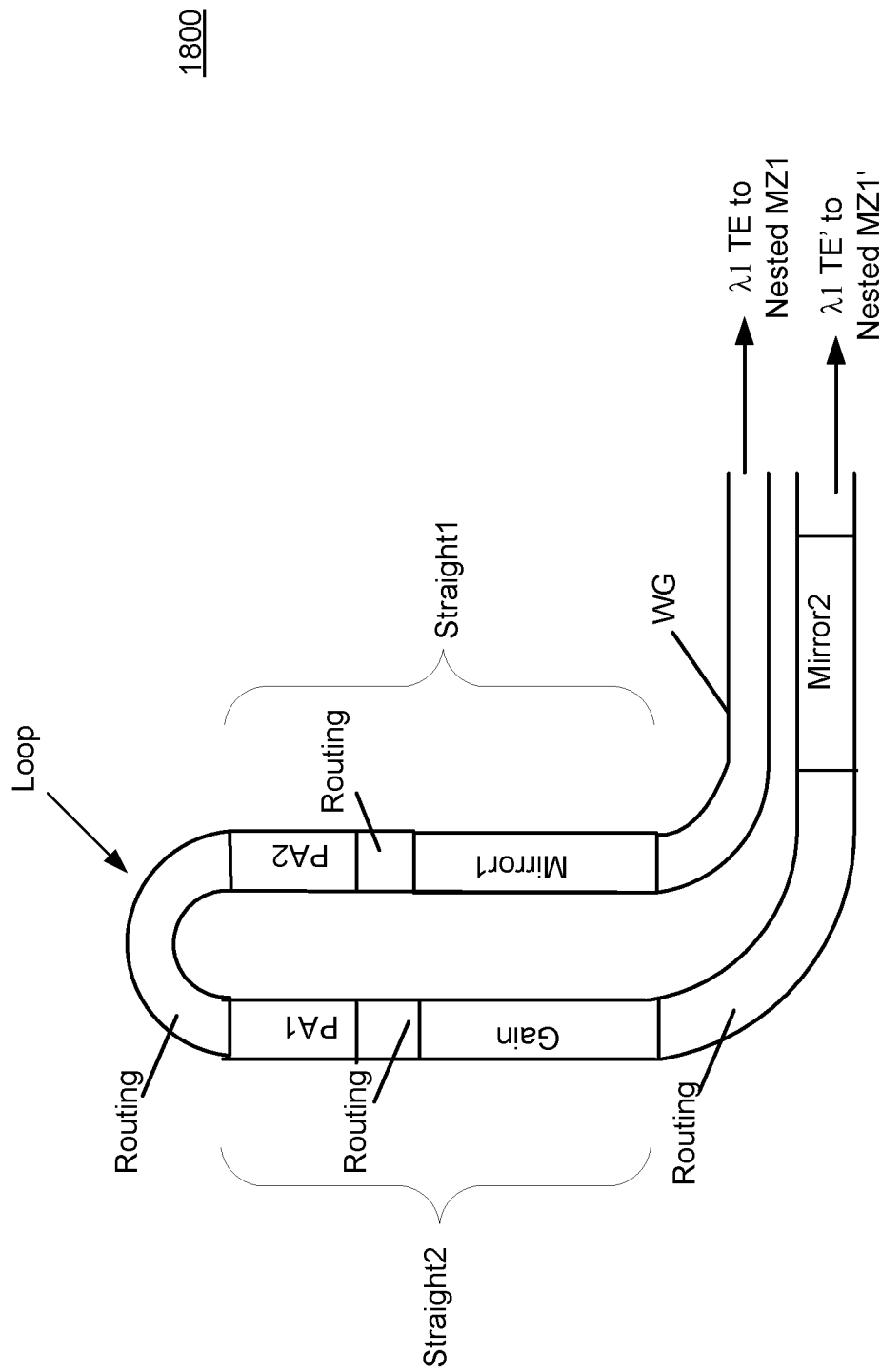

FIGS. 17 and 18 show CLETs 1700 and 1800, respectively, that output pairs of optical signals (e.g., λ1TE and λ1TE') form mirror1 and mirror2, respectively. FIG. 17 shows a compact S-shaped CLET configuration 1700, and FIG. 18 shows a CLET having a looped configuration. In both configurations, curved passive/isolation regions are provided between PA sections, as well as between the gain section and one of the mirror sections. Each of the PA, gain, and mirror sections in both FIGS. 17 and 18 are provided in straight portions of the CLET.

In particular, CLET 1700 is similar to CLET 1100 discussed above in that both include waveguides having parallel sections including mirrors 1 and 2 and the gain section. In CLET 1700, however, a PA section (PA2) and routing section are provided along with mirror1 in one straight section, and PA section (PA1) and routing section are provided in an another parallel section along with the gain section.

Waveguide WG of CLET 1800 in FIG. 18 includes a loop with straight sections Straight1 and Straight2. Section Straight1 includes the gain section and a first PA section (PA1) with a routing section provided therebetween. Section Straight2 includes mirror1 and a second PA section (PA2) with another routing section provided therebetween. Additional routing sections optically connect PA1 with PA2 and the gain section with mirror 2 to complete the cavity.

Figure 19:
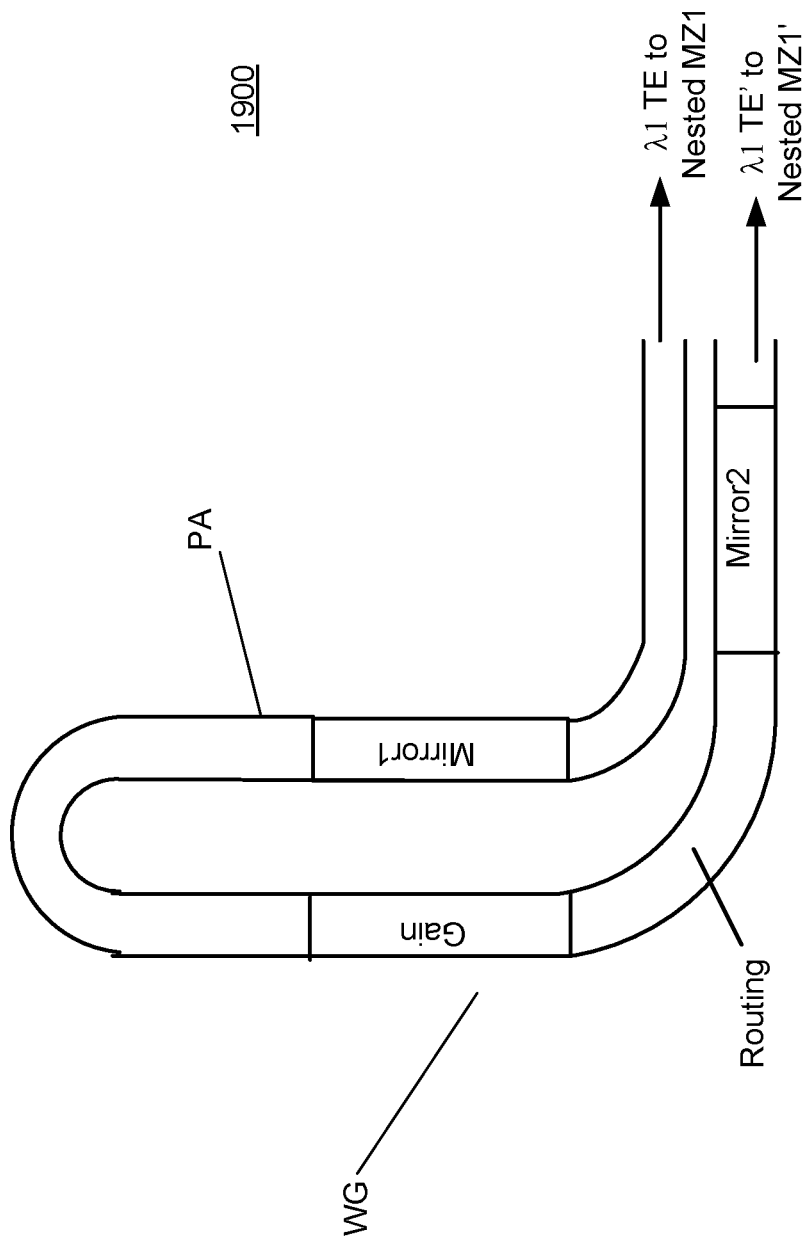

The CLET shown in FIG. 19 has a looped configuration similar to that shown in FIG. 18. In FIG. 25, however, sections PA1 and PA2 have been omitted, and a single continuous PA section extends from the gain section to mirror 1. Routing sections may optionally be provided between one end of the PA section and mirror 1 and the other end of the PA section and the gain section.

Figure 20:
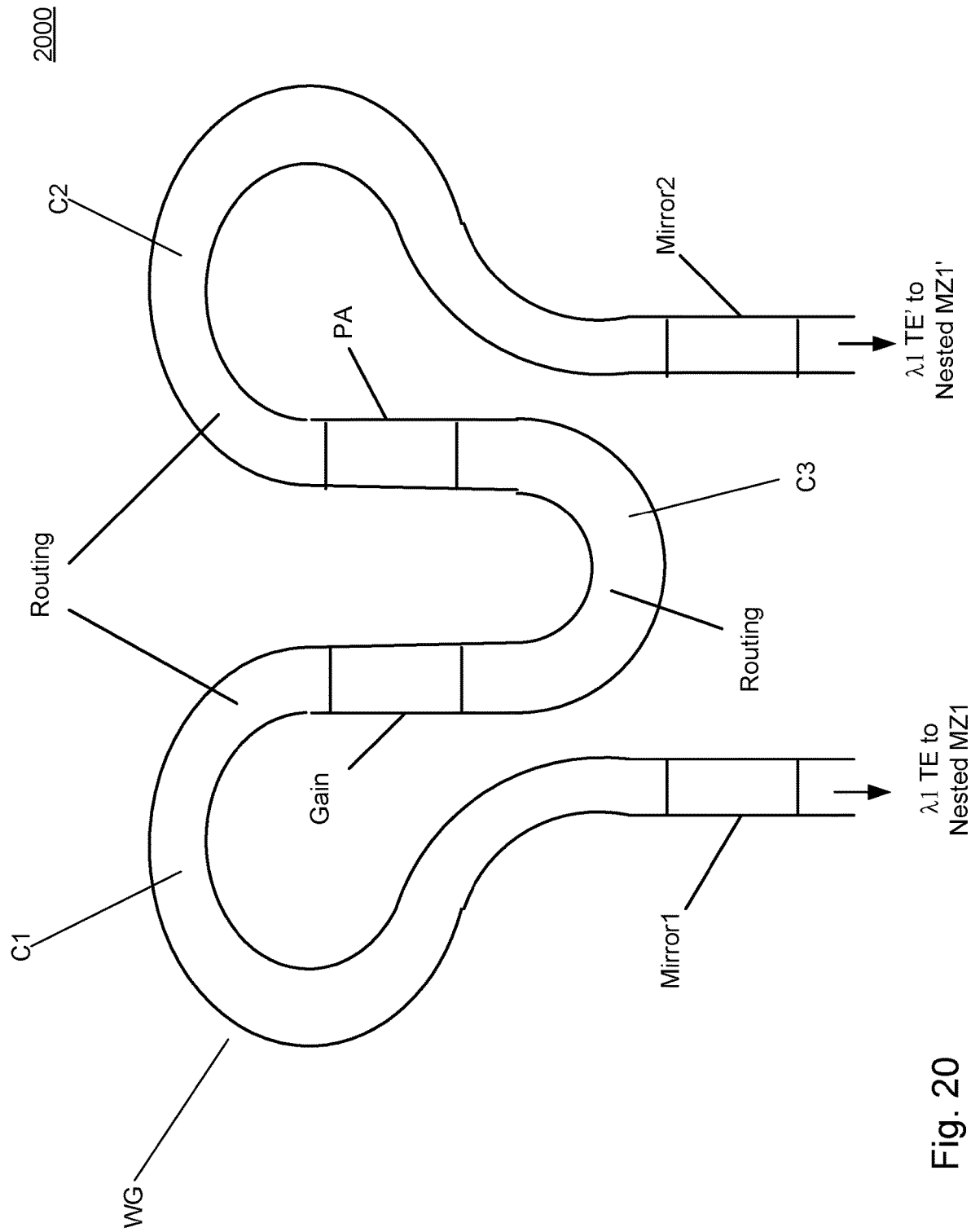

FIGS. 20 and 21 show examples of M-shaped or W-shaped CLET configurations 2000 and 2100, respectively, which are also compact. In these configurations the waveguide has at least three curved portions (C1, C2, and C3). These designs may be advantageous for local oscillator CLETs provided in a coherent receiver, for example, such as that described above with reference to FIG. 21. In both FIGS. 20 and 21, curved passive/isolation regions are provided between each tunable section (e.g., between mirror1 and the gain section, between the gain section and the PA section, and between the PA section and mirror2) of the laser.

In FIG. 21, CLET 2100 is a W-shaped (inverted M-shape relative to CLET 2000 FIG. 20) in which the gain sections (including SOAs) are located on the same axis. As a result, outputs may extend in the same direction but are spaced from one another on a pitch, as shown in FIG. 21, which may be adjusted (by varying bend radius of curvature (ROC) and or straight extensions) to match the pitch of the rest of the circuit, while remaining compact. Electrical connections to the sections of the laser may be conveniently located between sections of the laser without taking up additional chip real estate.

Figure 22:
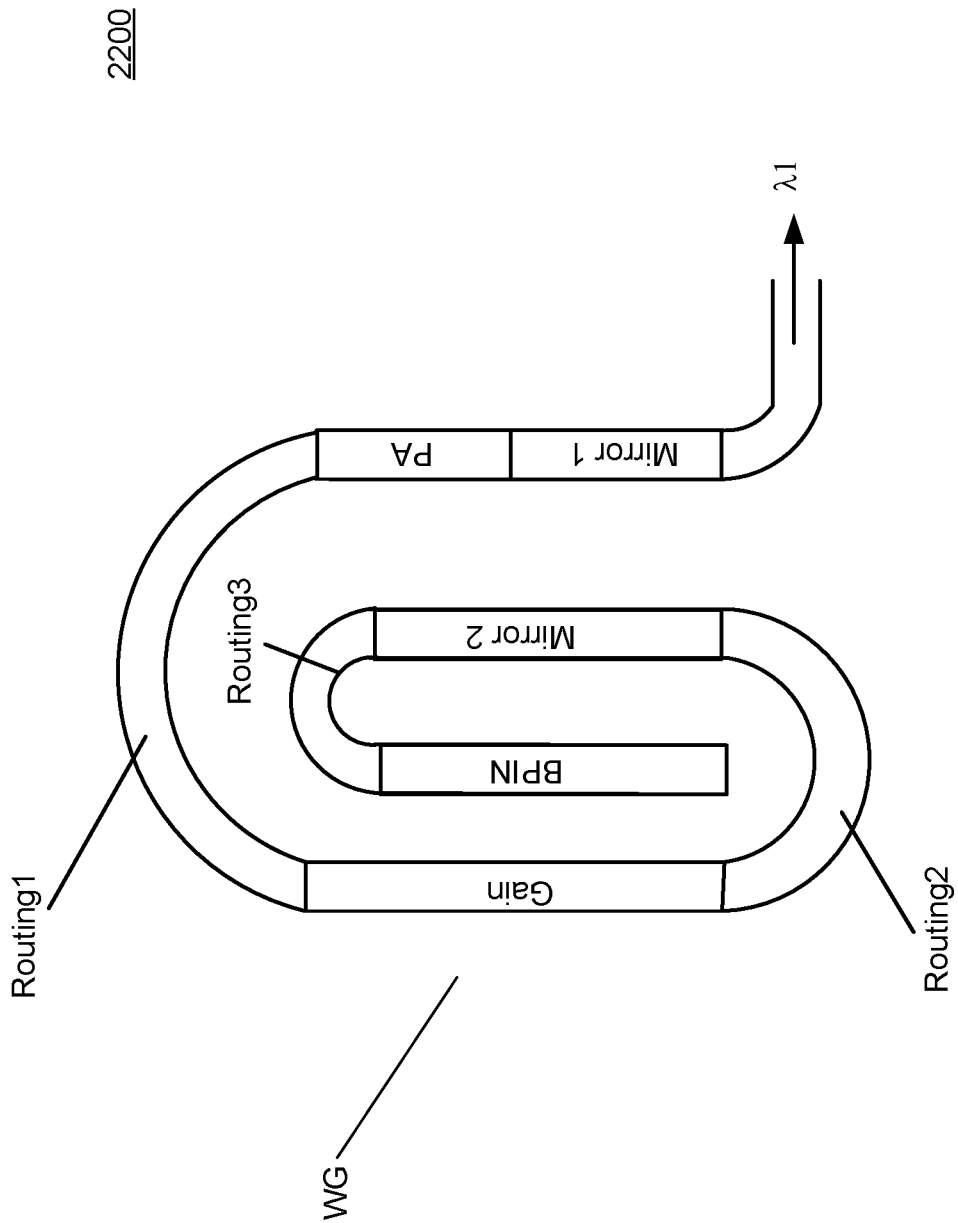

FIG. 22 shows CLET 2200 in which the laser sections resemble the shape of a coil or paperclip. The configuration shown in FIG. 22 is particularly compact because the laser sections are wrapped around one another. A power monitor BPIN may be provided to receive light transmitted through Mirror 2 (the back laser), which, as shown in FIG. 22, is in the innermost portion of the laser. The gain and phase sections, as well as Mirror 1 (the front laser) are provided in outermost portions of the laser. An additional power monitor, as well as an SOA and splitter, etc. may also be wrapped around the laser for further compactness. A disadvantage with this layout, however, is that only one end of the laser is accessible for output because the inner most portion of the laser is terminated by the BPIN. It is understood that a plurality of CLETs 2200 may be provided, for example, on a common substrate, each of which having a corresponding one of a plurality of photodiodes, which are also provided on the substrate, Each of the plurality of photodiodes, being the same as or similar to the BPIN shown in FIG. 22, may be coupled to a respective routing section 3 of each such CLET.

More specifically, CLET 2200 shown in FIG. 22 includes gain (first), BPIN (second), Mirror2 (third), and Mirror1 (fourth) sections or portions, each of which extend parallel to one another. Curved or arcuate routing section (Routing1) connects the gain and PA portions, and curved routing section (Routing2) connections the gain and Mirror2 sections to thereby define a cavity. An additional routing section (Routing3) connects the BPIN with mirror2.

Figure 23:
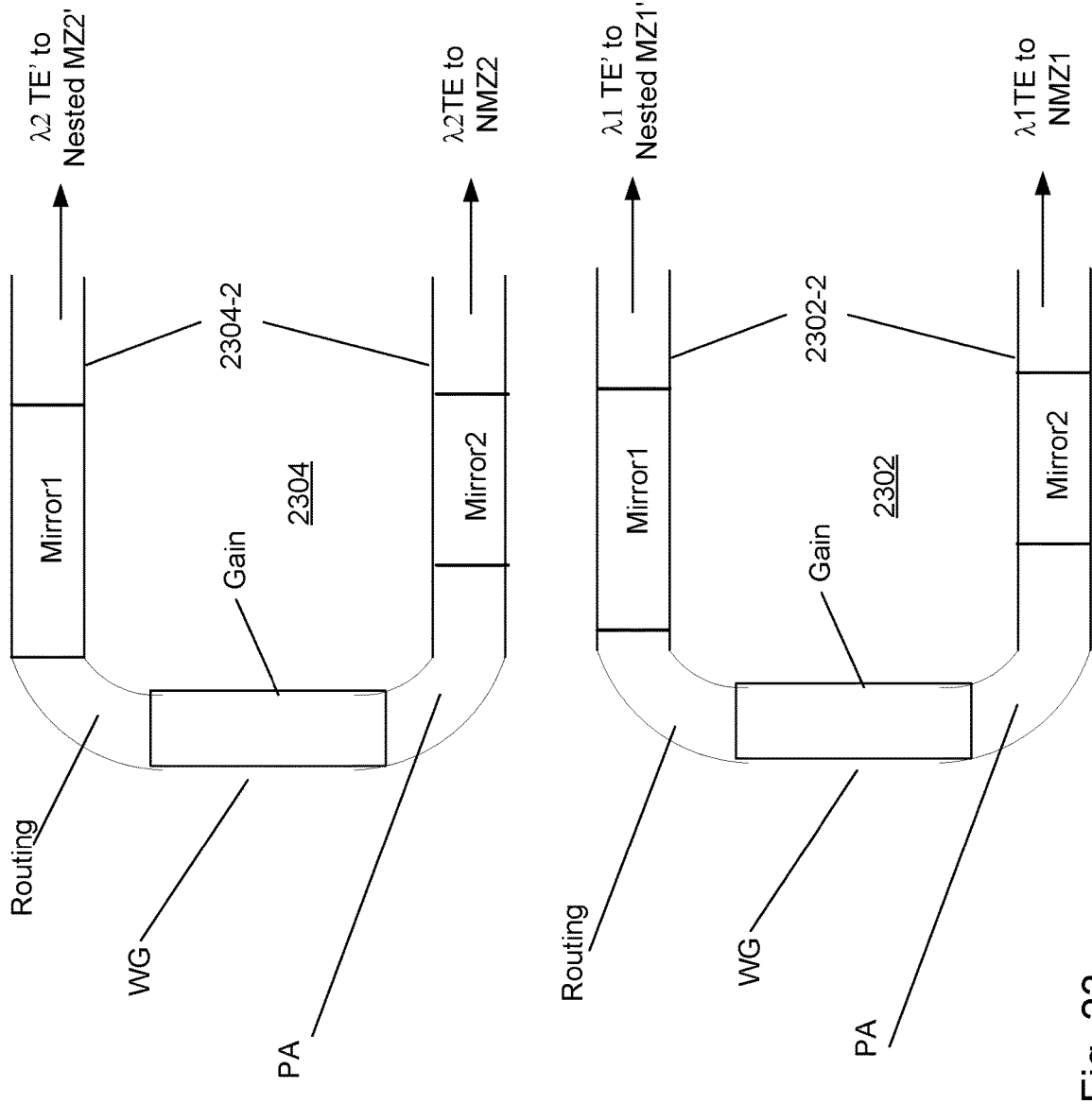

FIG. 23 illustrates first (2302) and second (2304) CLETs that may be provided in an array or PIC disclosed above. Both have waveguides WG with similar staple-shaped configurations, but CLET 3402 provides two optical outputs having wavelength λ2 and CLET provides two optical outputs having wavelength λ1. CLETs 2302 and 2304 have gain sections provided in a straight section of waveguide WG and curved, arcuate, or bent routing sections that optically connect the gain section with mirror1. A curved, arcuate, or bent PA section also optically connects the gain section with mirror2 in each CLET. Light is output on output waveguides 2304-2 and 2302-2 to the nested MZ modulators.

Figure 24:
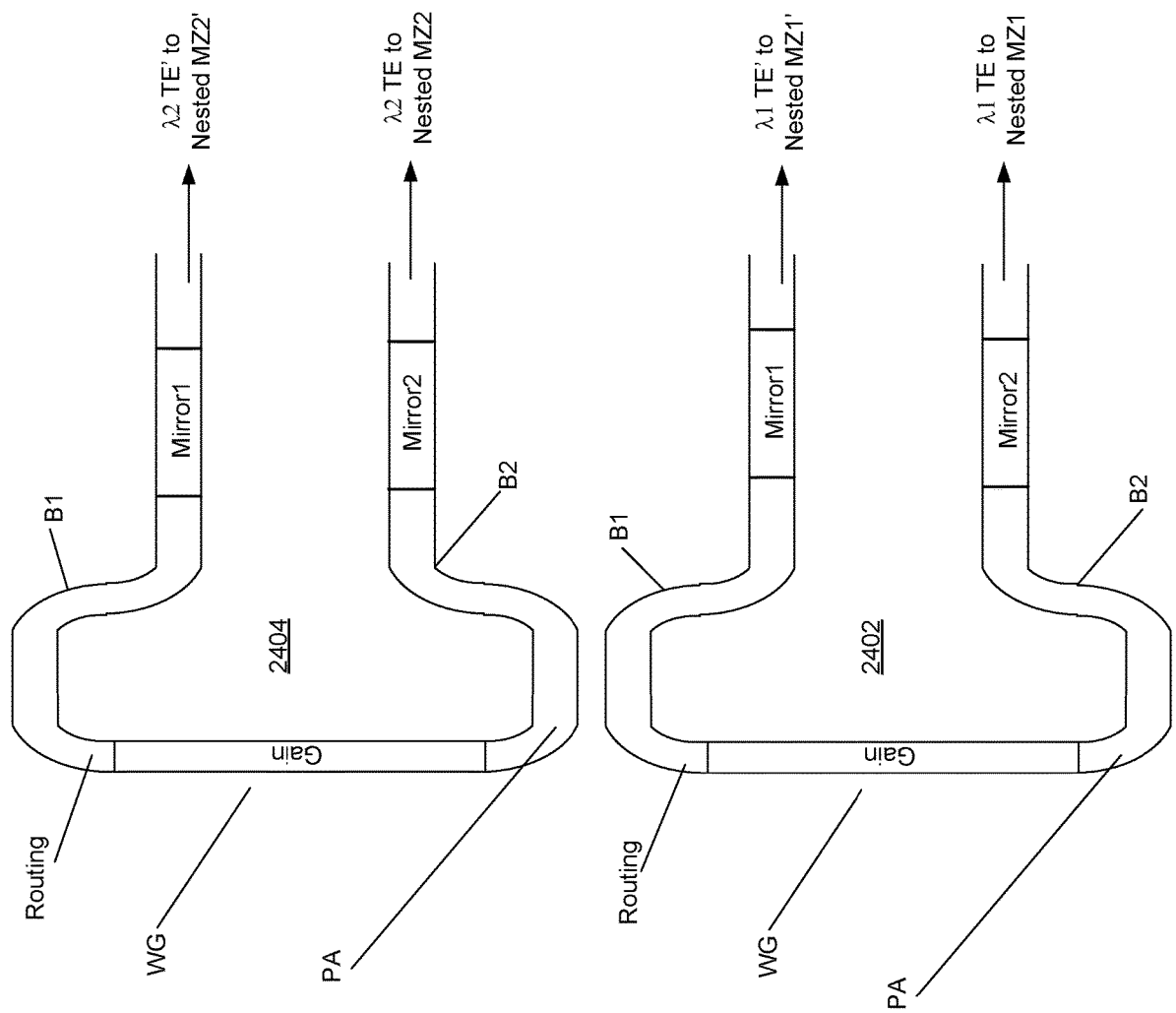
Figure 26:
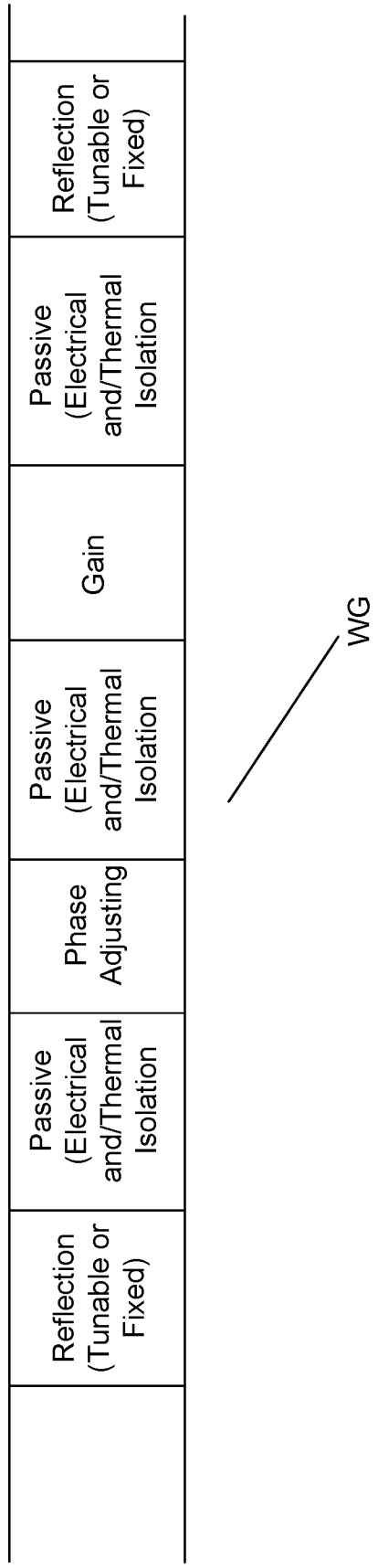

FIG. 24 shows CLETs 2402 and 2404 that have a similar construction as that shown in FIG. 23. However, each of CLETs 2402 and 2404 has additional arcuate portions B1 and B2 that connect to mirror1 and mirror2, respectively. As noted above, the present disclosure further contemplates bent or folded two-section DBR laser configurations. Examples of such configurations will next be described with reference to FIGS. 25a-25c. FIG. 25a shows a two-section DBR laser 2500-1 waveguide WG has a staple shape Including a DBR mirror section provided in one arm (Arm 1) of the folded waveguide and combined gain and DBR mirror sections in the second arm (Arm 2). A PA section provided between two routing sections separates the two arms. In addition, a second output may be either monitored with a PIN photodiode or supplied to a modulator.

In FIG. 25b, the DBR mirror and gain/DBR mirror sections of laser 2500-2 are bent relative to one another or extend in different directions, and in laser 2500-3 shown in FIG. 25c, a facet serves as the second mirror and the gain/DRB section is replaced with a section that combines gain and phase adjustment. In addition a PA section and curved routing portion connects the DRB mirror with gain sections in both FIGS. 25b and 25c. The configurations shown in FIGS. 25a-25c also have a compact design.

Figure 27:
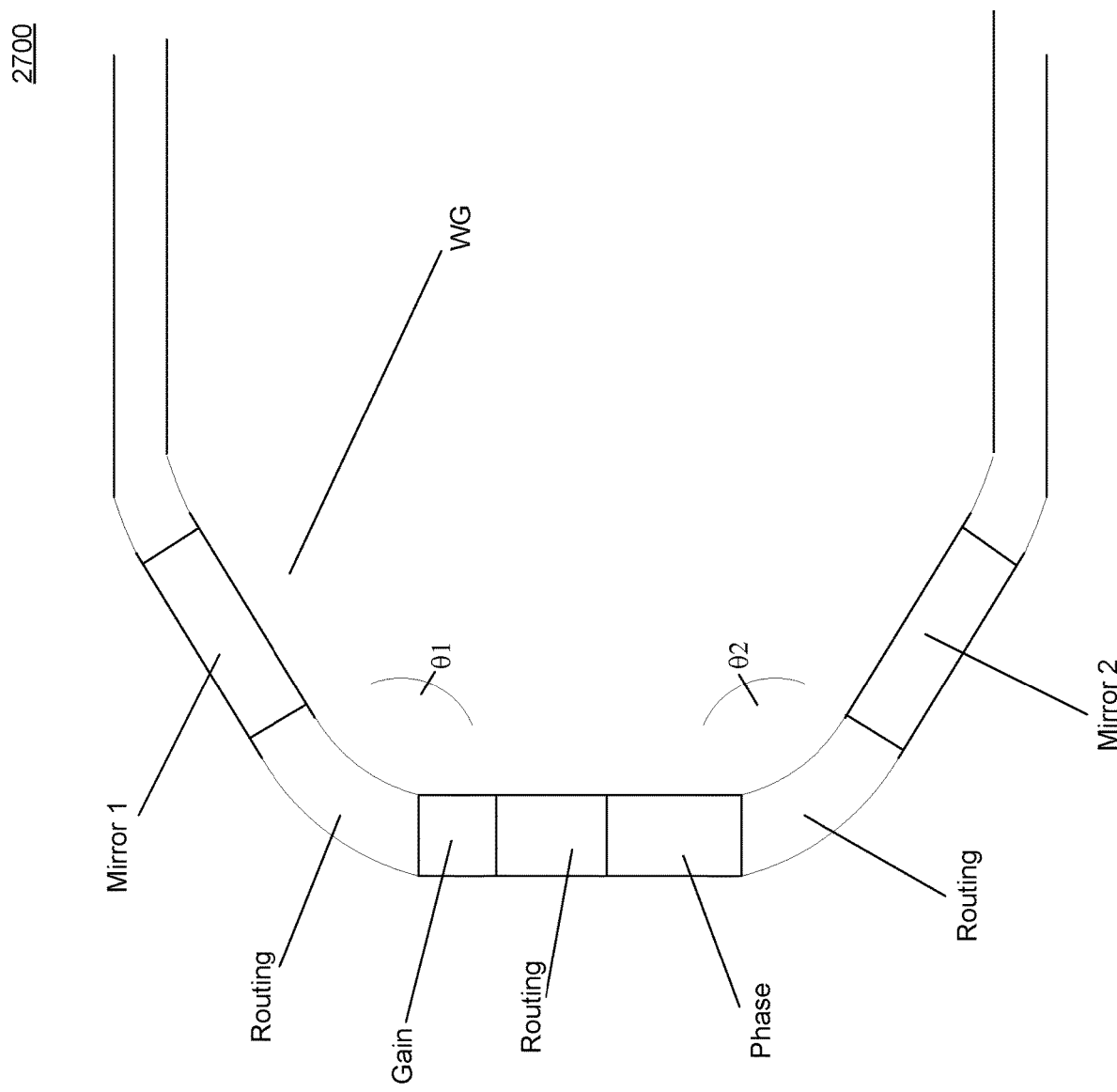

FIG. 25a, as well as FIG. 27, illustrates examples of CLET having a waveguide "staple" configuration including a straight gain section and phase adjusting section, straight mirror sections (Mirror 1 and Mirror 2) that form angles θ1 and θ2, respectively, with the gain section, and passive sections separating each of the mirror sections, phase, and gain sections. As in the other embodiments, it is understood that the mirror, gain and phase sections may optionally be provided in the curved portions of the waveguide instead of the passive sections. Various optical properties associated a CLET having a staple configuration similar to that shown in FIG. 25a will next be described with reference to FIG. 28-31.

Figure 28:
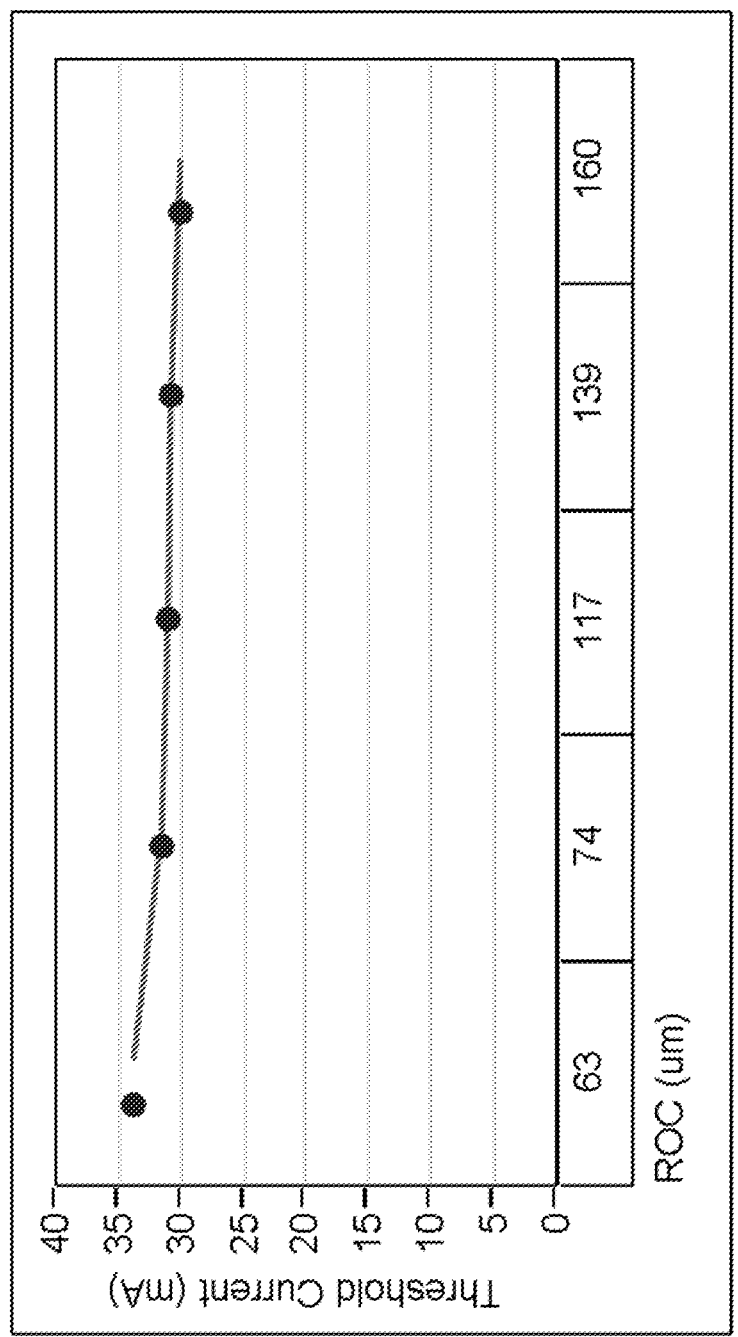
FIGS. 28-31 show plots of various optical parameters associated with CLETs consistent with the present disclosure.

FIG. 28 illustrates a plot of laser threshold current of another example of "Staple-shaped" CLET plotted vs. bend radius of curvature (ROC) of the passive sections separating the gain section from the mirrors of the CLET waveguide. As shown in the plot, laser threshold current does not substantially change over a relatively wide range of ROCs. For example, an ROC of 63 um results in a minor increase in threshold current, which indicates that the bend loss (i.e., the loss associated with the passive section bends) does not significantly degrade laser performance.

Figure 29:
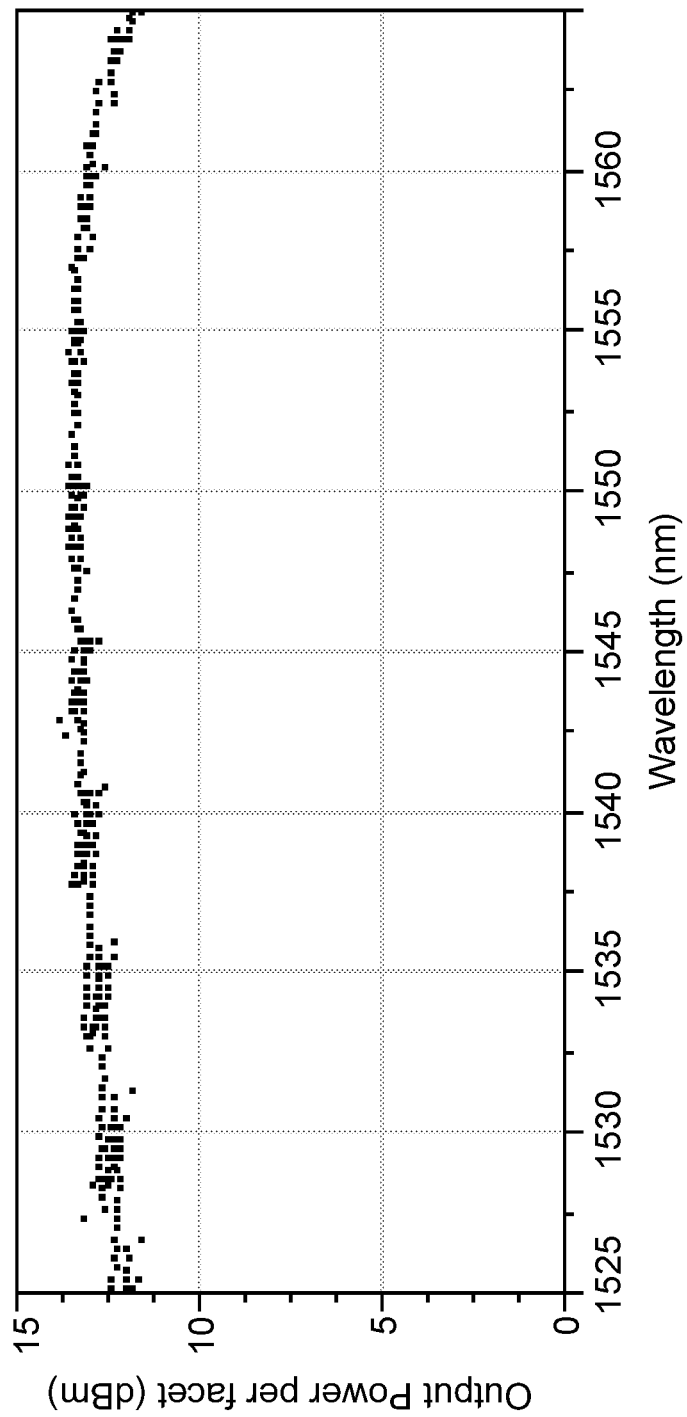

FIG. 29 illustrates a plot of output power (per facet) vs. C-band wavelength of the staple CLET after tuning the mirrors and phase section within cavity appropriately. The power is substantially uniform and at least 11 dBm over a range 1525-1570 um wavelengths (45 nm range). SMSR (Side Mode Suppression Ratio not shown) was measured as being greater than 50 dB for tuned wavelengths.

Figure 30:
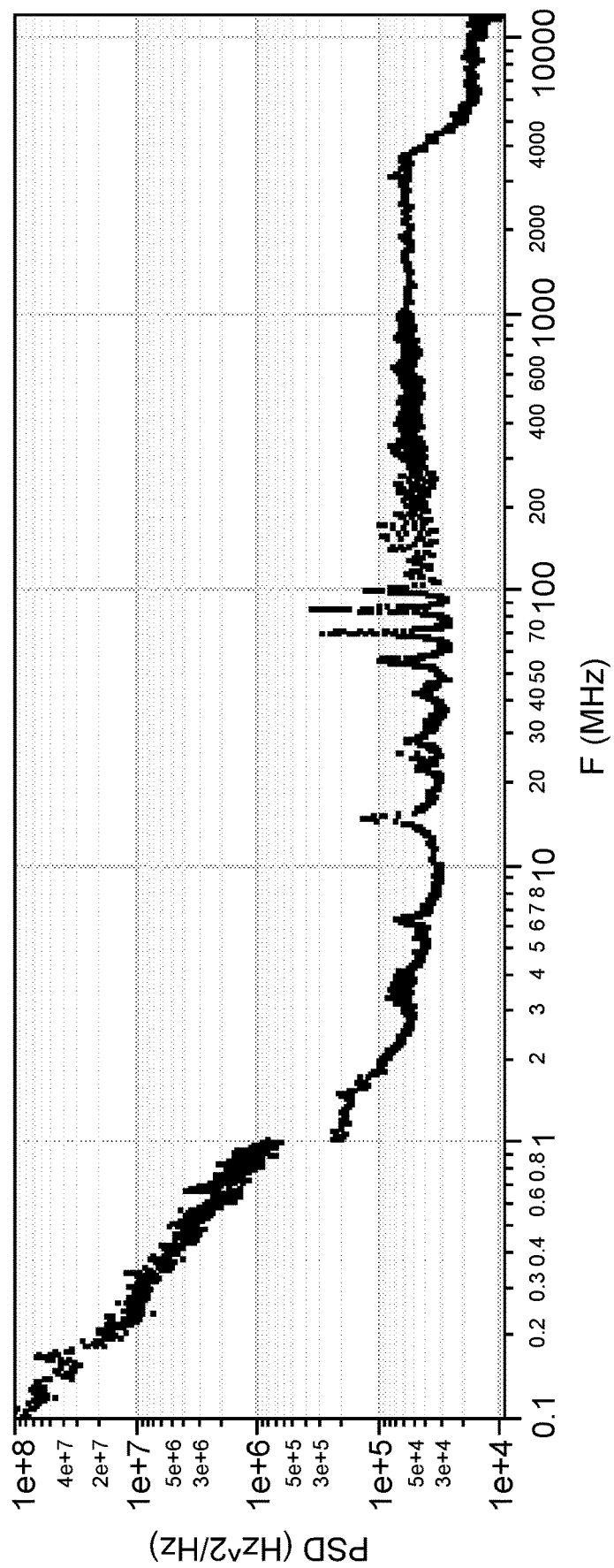

Noise in systems in general is often characterized by its Power Spectral Density (PSD), which is the Fourier transform of the noise signal power. Laser linewidth can be associated with its phase noise characteristics. Measuring the PSD of the phase noise of the laser is a common way to quantify and characterize the linewidth of a laser. FIG. 30 illustrates a plot of Power Spectral Density (PSD) vs. Frequency is measured for the staple CLET. As shown in FIG. 30, PSD is relatively flat and low for frequencies greater than 10 MHz, except for a few spikes that are measurement artifacts. PSD near 1-2 GHz corresponds to a linewidth of about 180 kHz, which is acceptable for many present-day telecommunication modulation formats such as QPSK (quadrature phase shift keying) and 16QAM (quadrature amplitude modulation) and for coherent detection.

Figure 31:
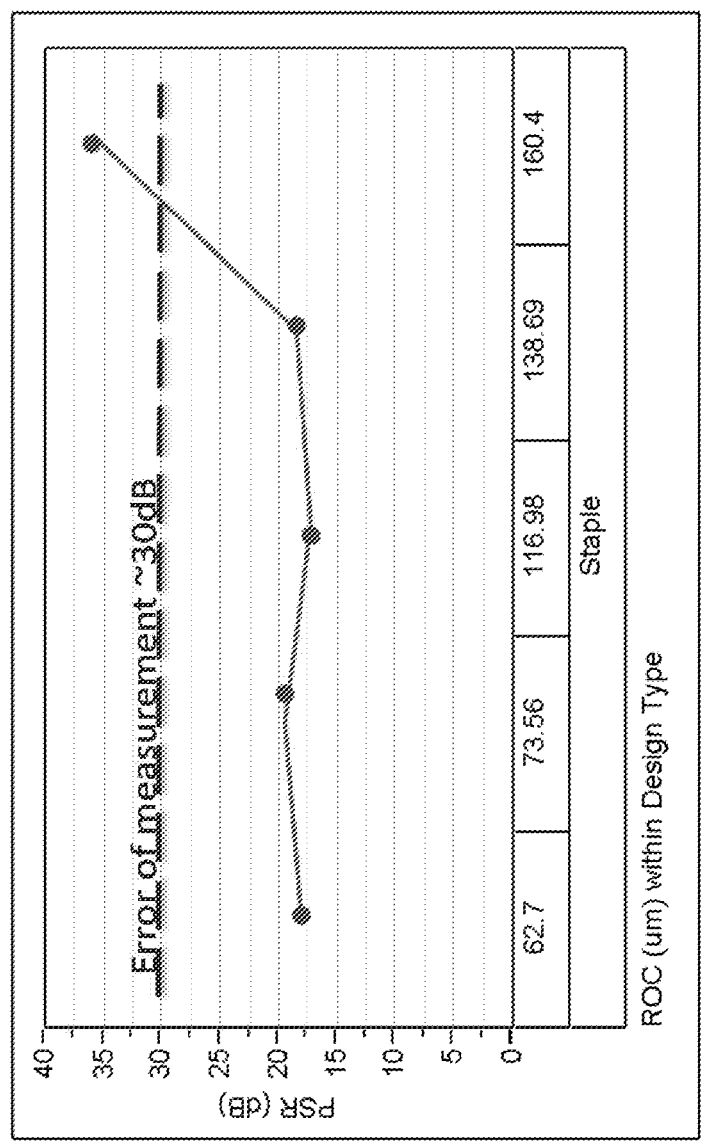

FIG. 31 shows a plot of Polarization Scattering Ratio (PSR) vs. ROC for the staple CLET of FIG. 35a. The Polarization Scattering Ratio (PSR) is defined as the ratio of optical power in the TE mode over the optical power in the TM mode of an optical waveguide on a PIC. PSR may be used as a way to characterize the degree to which TE light has been converted or scattered to TM light on the PIC and may be expressed in dB. For the particular process and bend type used, relatively little TM was observed for a 160.4 um radius of curvature (ROC). Slightly more compact CLETs produced less polarized output light.

The measured parameters plotted in FIGS. 28-31 demonstrate that a CLET comprising a continuous waveguide with appropriate design considerations for the bent portions of the cavity as described herein has sufficient performance to be used in high-performance optical communications applications.

As discussed above, various CLET laser configurations are provided that may have relatively long cavity lengths, while reducing die size, improving chip aspect ratio for handling, and improving PIC yield. Likewise, thermal and/or electrical isolation may be provided between sections and make use of appropriate deep or shallow etched waveguides as needed for different sections and compact overall circuit layouts.

Other embodiments will be apparent to those skilled in the art from consideration of the specification. It is intended that the specification and examples be considered as exemplary only, with a true scope and spirit of the invention being indicated by the following claims.

What is claimed is:

1. A photonic integrated circuit, comprising:
a substrate;
a 90 degree optical hybrid provided on the substrate;
a plurality of optical elements provided on the substrate, the optical elements being selected from the group consisting of one or more: optical modulators, optical combiners, optical splitters, optical demultiplexers, semiconductor optical amplifiers, and photodetectors; and
at least one tunable laser provided on the substrate, said at least one tunable laser being optical coupled to at least one of the optical elements, the tunable laser including:
a waveguide having first and second mirror sections, the first and second mirror sections being provided in first and second regions, respectively, of the waveguide, a cavity portion of the waveguide extending continuously from the first mirror section to the second mirror section, the cavity portion including a phase section, a first gain section, and a second gain section, part of the cavity portion, outside the first and second gain sections, includes a Group III-V material, a first part of the cavity portion extending in a first direction and a second part of the cavity portion extending in a second direction different than the first direction, wherein light propagating in the cavity portion is undivided along an entire length of the cavity portion, the cavity portion outside the gain section including a Group III-V material, at least part of the cavity portion having an arcuate shape.

2. The photonic integrated circuit in accordance with claim 1, wherein the gain section of at least one of the plurality of tunable lasers extends in the first direction and one of the phase section and a routing section of said at least one of the plurality of tunable lasers extends in the second direction.

3. A photonic integrated circuit, including:
a substrate;
an 90 degree optical hybrid; and
a plurality of lasers provided on the substrate, one of the plurality of lasers being optically coupled to the 90 degree optical hybrid, each of the plurality of lasers including:
a waveguide, the waveguide having first, second and third sections that extend parallel to one another, the first section includes a first mirror portion, the second section includes a first gain portion, a second gain portion, and a phase portion, and the third section includes a second mirror portion, wherein first light is output from the first section and second light is output from the third section and the first and second mirror portions being provided in first and second regions, respectively, of the waveguide, the first and second mirror portions defining a cavity, part of the cavity, outside the gain portion, including a Group III-V material.

4. The photonic integrated circuit in accordance with claim 1 wherein the waveguide includes a bend, at least a portion of the phase section including the bend.

5. The photonic integrated circuit in accordance with claim 1, wherein at least a portion of the waveguide of each tunable laser is bent.

6. The photonic integrated circuit in accordance with claim 1, wherein at least the gain section and the first and second mirror sections of the waveguide are provided substantially along the same crystallographic axis.

7. The photonic integrated circuit in accordance with claim 1, wherein the photonic integrated circuit includes one tunable laser, and the optical elements include a Mach-Zehnder modulator, the Mach-Zehnder modulator receiving light output from the tunable laser, and outputting a modulated optical signal.

8. The photonic integrated circuit in accordance with claim 1, wherein the photonic integrated circuit includes one tunable laser, and the optical elements include a first Mach-Zehnder modulator and a second Mach-Zehnder modulator, tunable laser having first and second outputs, the first output of the tunable laser supplying first light to the first Mach-Zehnder modulator, and the second output supplying second light to the second Mach-Zehnder modulator.

9. The photonic integrated circuit in accordance with claim 1, wherein the photonic integrated circuit includes a plurality of tunable lasers, and the optical elements include a plurality of Mach-Zehnder modulators, each of the plurality of tunable lasers supplying a respective one of a plurality of lights to a respective one of the plurality of Mach-Zehnder modulators, each of the plurality of Mach-Zehnder modulators supplying a respective one of a plurality of modulated optical signals.

10. The photonic integrated circuit in accordance with claim 1, wherein the optical elements include first Mach-Zehnder modulators and second Mach-Zehnder modulators, and a plurality of tunable lasers, each of which having first and second optical outputs, the first optical output of each of the plurality of tunable lasers supplies first light to a corresponding one of the first Mach-Zehnder modulators, and the second optical output supplies second light to a corresponding one of the second Mach-Zehnder modulators.

11. The photonic integrated circuit in accordance with claim 1, wherein the photonic integrated circuit includes one tunable laser, and the 90 degree optical hybrid receiving local oscillator light output from the tunable laser and mixing the local oscillator light with a modulated optical signal.

12. The photonic integrated circuit in accordance with claim 1, wherein the optical hybrid is a first 90 degree optical hybrid, the photonic integrated circuit further including:
a second 90 degree optical hybrid; and
the tunable laser having first and second outputs, the first output of the tunable laser supplying first local oscillator light to the first 90 degree optical hybrid, and the second output supplying second local oscillator light to the second 90 degree optical hybrid, the first and second 90 degree optical hybrids mixing the first and second local oscillator lights with first and second modulated optical signals, respectively.

13. The photonic integrated circuit in accordance with claim 1, wherein the photonic integrated circuit includes a plurality of tunable lasers, and the 90 degree optical hybrid is one of a plurality of 90 degree optical hybrids included in the photonic integrated circuit, each of the plurality of tunable lasers supplying a respective one of a plurality of local oscillator lights to a respective one of the plurality of 90 degree optical hybrids, each of the plurality of 90 degree optical hybrids also receiving a respective one of a plurality of modulated optical signals.

14. The photonic integrated circuit in accordance with claim 1, wherein the 90 degree optical hybrid is one of first 90 degree optical hybrids included in the photonic integrated circuit, the photonic integrated circuit further including second 90 degree optical hybrids, and a plurality of tunable lasers, each of which having first and second optical outputs, the first optical output of each of the plurality of tunable lasers supplies first local oscillator light to a corresponding one of the first 90 degeree optical hybrids, and the second optical output supplies second local oscillator light to a corresponding one of the second 90 degree optical hybrids.

15. A transceiver photonic integrated circuit, comprising:
a substrate;
a first laser provided on the substrate, the first laser including a first waveguide having first and second mirror sections and a first cavity portion extending continuously between the first and second mirror sections, the first cavity portion including a first gain section and a second gain section, the first and second mirror sections being provided in first and second regions, respectively, of the first waveguide, first light being output from the first mirror section and second light being output from second mirror section, the cavity portion having a first part that extends in a first direction and a second part that extends in a second direction different than the first direction, a second part of the cavity portion outside the gain section including a Group III-V material;

a Mach-Zehnder modulator circuit that receives the first and lights;

a second laser provided on the substrate, the second laser including a second waveguide having third and fourth mirror sections and a second cavity portion extending continuously between the third and fourth mirror sections, the third and fourth mirror sections being provided in first and second regions, respectively, of the second waveguide third light being output from the third mirror section and fourth light being output from fourth mirror section, the second cavity portion having a first part that extends in the first direction and a second part that extends in the second direction different than the first direction; and a 90 degree optical hybrid circuit that receives the third and fourth lights.

16. The photonic integrated circuit in accordance with claim 1, wherein the at least one tunable laser includes first and second tunable lasers, and the plurality of optical elements includes a Mach-Zehnder modulator, the first tunable laser supplying first light to the Mach-Zehnder modulator and the Mach-Zehnder modulator supplying a first modulated optical signal, the second tunable laser supplying second light, as local oscillator light, to the 90 degree optical hybrid, the 90 degree optical hybrid also receiving a second modulated optical signal, the 90 degree optical hybrid mixing the second light and the second modulated optical signal.

17. The photonic integrated circuit in accordance with claim 1, wherein the at least one tunable laser includes a plurality of first tunable lasers and a plurality of second tunable lasers, and the plurality of optical elements includes a plurality of Mach-Zehnder modulators, and the 90 degree optical hybrid is one of a plurality of 90 degree optical hybrids, each of the first tunable lasers supplying each of first lights to a corresponding one of the plurality of Mach-Zehnder modulators, and each of the plurality of Mach-Zehnder modulators supplying a corresponding one of a plurality of first modulated optical signals, each of the plurality of second tunable lasers supplying a corresponding one of a plurality of second lights to a respective one of the plurality of 90 degree optical hybrids, each of the plurality of 90 degree optical hybrids also receiving a corresponding one of a plurality of second modulated optical signals, each of the plurality of 90 degree optical hybrids mixing said corresponding one of the plurality of second lights and said corresponding one of the plurality of second modulated optical signals.

18. The transceiver photonic integrated circuit in accordance with claim 15 wherein the transceiver photonic integrated circuit includes one tunable laser, a first side of the tunable laser supplying first light to the Mach-Zehnder modulator and a second side of the tunable laser supplying second light to the 90 degree optical hybrid, the Mach-Zehnder modulator supplying a first modulated optical signal and the 90 degree optical hybrid receiving the second light, as local oscillator light, and a second modulated optical signal.

19. The transceiver photonic integrated circuit in accordance with claim 15, wherein the photonic integrated circuit includes a plurality of tunable lasers, and the a plurality of Mach-Zehnder modulators and a plurality of 90 degree optical hybrids, each of the plurality of tunable lasers supplying a corresponding one of first lights to a corresponding one of the plurality of Mach-Zehnder modulators, each of the plurality of Mach-Zehnder modulators supplying a corresponding one of a plurality of first modulated optical signals, each of the plurality of tunable lasers further supplying a corresponding one of second lights to a corresponding one of the plurality of 90 degree optical hybrids, each of the plurality of 90 degree optical hybrids receiving a corresponding one of a plurality of second modulated optical signals.

20. The photonic integrated circuit in accordance with claim 1, wherein the laser is a distributed feedback laser.

21. The photonic integrated circuit in accordance with claim 3, wherein the laser is a distributed feedback laser.

22. The photonic integrated circuit in accordance with claim 1, wherein the laser is a distributed Bragg reflector laser.

23. The photonic integrated circuit in accordance with claim 3, wherein each of the plurality of lasers is a distributed Bragg reflector laser.

24. The photonic integrated circuit in accordance with claim 1, wherein the substrate includes indium phosphide.

25. The photonic integrated circuit in accordance with claim 3, wherein the substrate includes indium phosphide.

26. The photonic integrated circuit in accordance with claim 15, wherein the substrate includes indium phosphide.

* * * * *